(12) United States Patent
Kodama et al.

(10) Patent No.: US 8,311,375 B2
(45) Date of Patent: *Nov. 13, 2012

(54) OPTOELECTRONIC WIRING BOARD, OPTICAL COMMUNICATION DEVICE, AND METHOD OF MANUFACTURING THE OPTICAL COMMUNICATION DEVICE

(75) Inventors: Hiroaki Kodama, Ibi-gun (JP); Liyi Chen, Ibi-gun (JP); Kensaku Nakashima, Ibi-gun (JP)

(73) Assignee: Ibiden Co., Ltd., Ogaki-Shi (JP)

( * ) Notice: Subject to any disclaimer, the term of this patent is extended or adjusted under 35 U.S.C. 154(b) by 258 days.

This patent is subject to a terminal disclaimer.

(21) Appl. No.: 12/765,842

(22) Filed: Apr. 22, 2010

(65) Prior Publication Data

US 2010/0202729 A1    Aug. 12, 2010

Related U.S. Application Data

(63) Continuation of application No. 12/235,374, filed on Sep. 22, 2008, now Pat. No. 7,734,125, which is a continuation of application No. PCT/JP2007/055967, filed on Mar. 23, 2007.

(30) Foreign Application Priority Data

Mar. 24, 2006   (JP) .................................. 2006-084278

(51) Int. Cl.
  *G02B 6/12*   (2006.01)
  *G02B 6/10*   (2006.01)
(52) U.S. Cl. ............................. 385/14; 385/49; 385/131

(58) Field of Classification Search .................... 385/14, 385/49, 88–94, 129–132
See application file for complete search history.

(56) References Cited

U.S. PATENT DOCUMENTS

| | | | |
|---|---|---|---|
| 6,910,812 B2 | 6/2005 | Pommer et al. | |
| 7,130,511 B2 | 10/2006 | Riester et al. | |
| 7,197,221 B2 | 3/2007 | Ohtsu et al. | |
| 7,343,060 B2 | 3/2008 | Ohtsu et al. | |
| 7,539,366 B1 | 5/2009 | Baks et al. | |
| 7,734,125 B2 * | 6/2010 | Kodama et al. | 385/14 |
| 8,078,017 B2 * | 12/2011 | Kodama et al. | 385/14 |
| 2003/0113073 A1 | 6/2003 | Cheng | |
| 2005/0201693 A1 | 9/2005 | Korenaga et al. | |
| 2008/0285910 A1 | 11/2008 | Yamada et al. | |
| 2009/0028497 A1 | 1/2009 | Kodama et al. | |

FOREIGN PATENT DOCUMENTS

EP    1499167    1/2005
(Continued)

*Primary Examiner* — Daniel Petkovsek
(74) *Attorney, Agent, or Firm* — Ditthavong Mori & Steiner, P.C.

(57) ABSTRACT

An optoelectronic wiring board includes a flex-rigid substrate and an optical communication unit. The flex-rigid substrate includes a flexible substrate provided with an electric wiring, and a pair of rigid sections provided on both sides of the flexible substrate. The pair of rigid sections each include a lamination formed of a conductive circuit and an insulating layer. The optical communication unit is made of a flexible material and has both end faces substantially perpendicular to its optical path of transmitting light. Both end portions of the optical communication unit are disposed and fixed on the rigid sections so that both end faces of the optical communication unit face an optical element mounting region provided on the rigid sections of the flex-rigid substrate.

6 Claims, 29 Drawing Sheets

FOREIGN PATENT DOCUMENTS

| | | |
|---|---|---|
| JP | 6-268339 | 9/1994 |
| JP | 9-96746 | 4/1997 |
| JP | 2000-39531 | 2/2000 |
| JP | 2002-331532 | 1/2002 |
| JP | 2002-158445 | 5/2002 |
| JP | 2003-14972 | 1/2003 |
| JP | 2004-206015 | 7/2004 |
| JP | 2006-42307 | 2/2006 |
| WO | WO 2005-052666 | 6/2005 |
| WO | WO 2005/064381 | 7/2005 |
| WO | WO 2005/096682 | 10/2005 |

\* cited by examiner

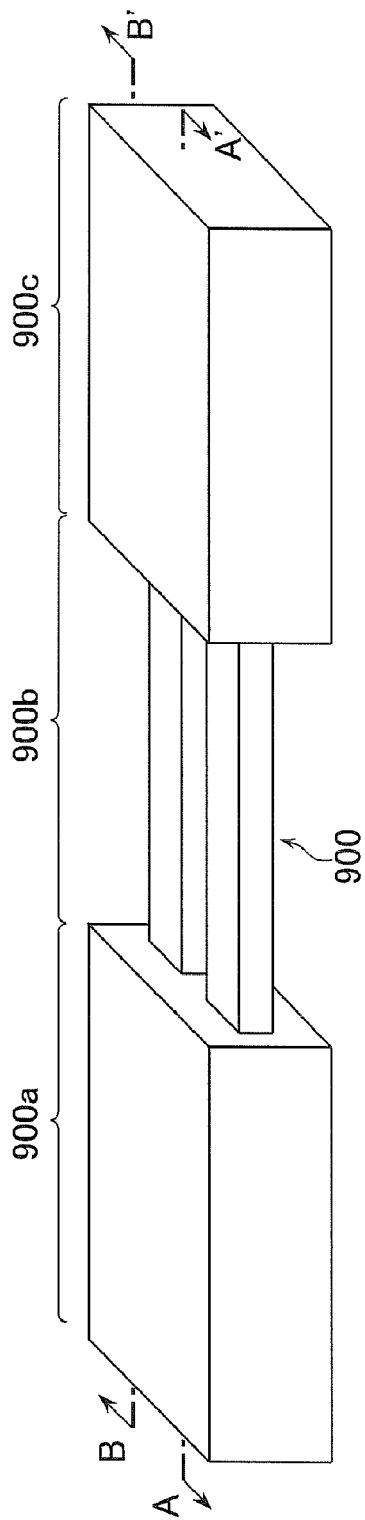
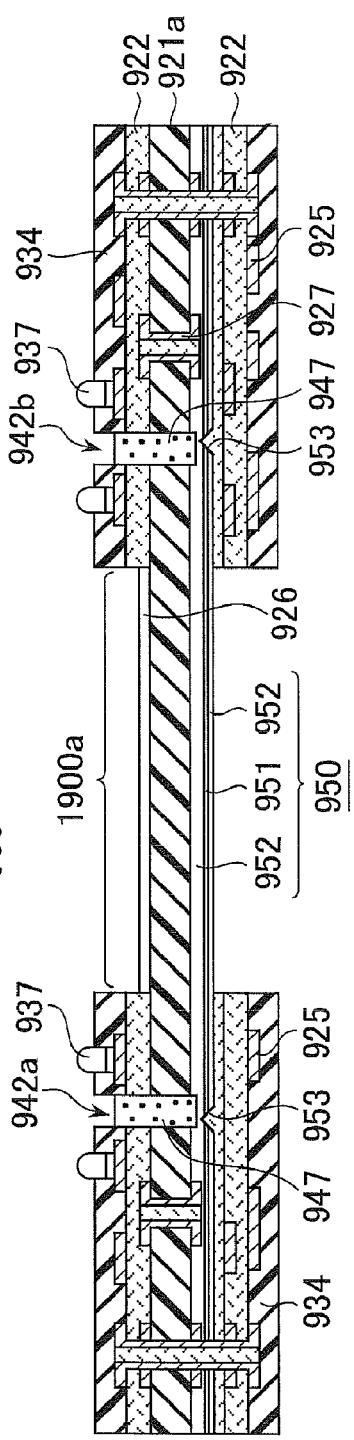
Fig. 4B
Fig. 4C
Fig. 4D

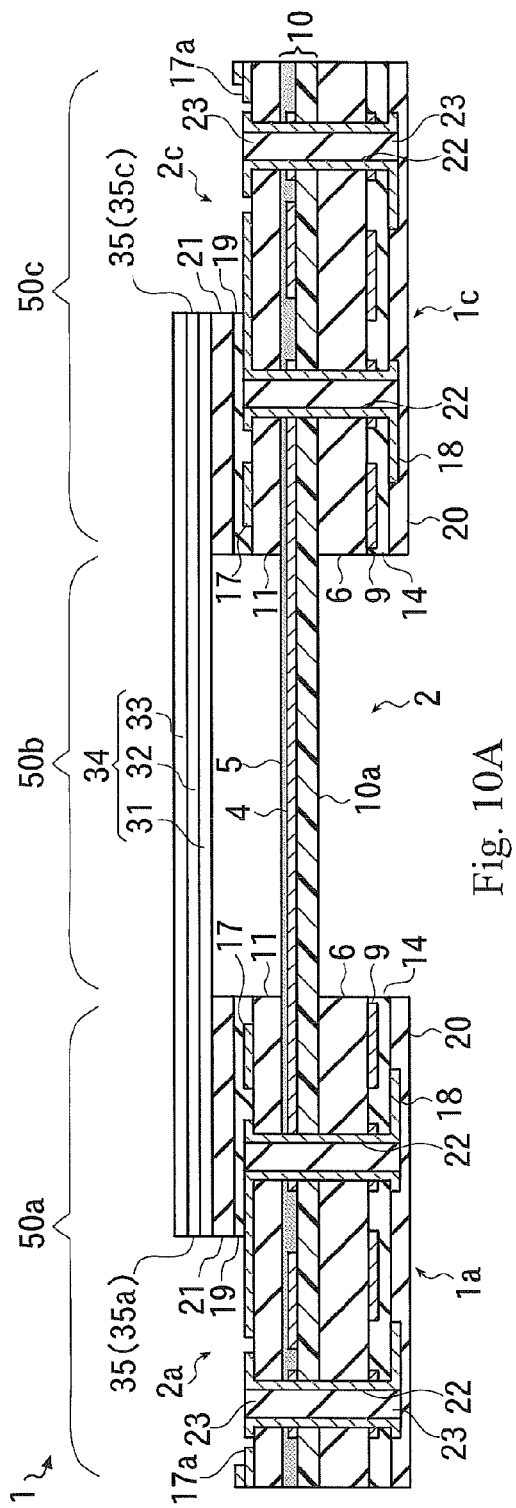
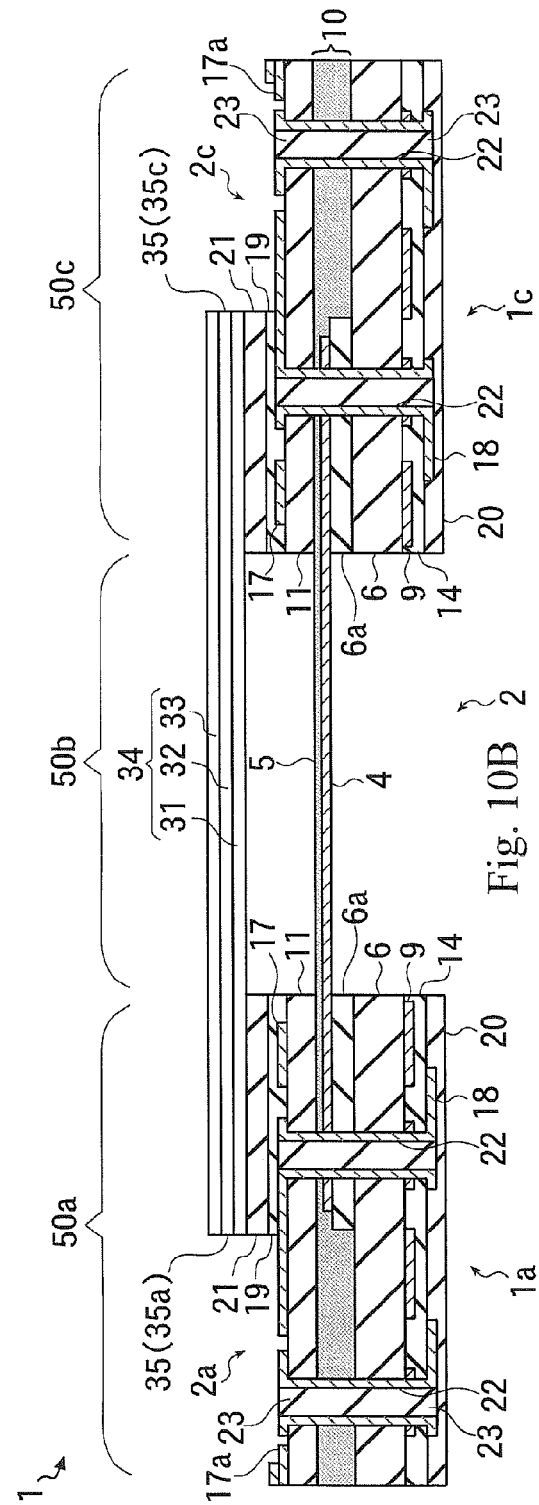
Fig. 10A
Fig. 10B

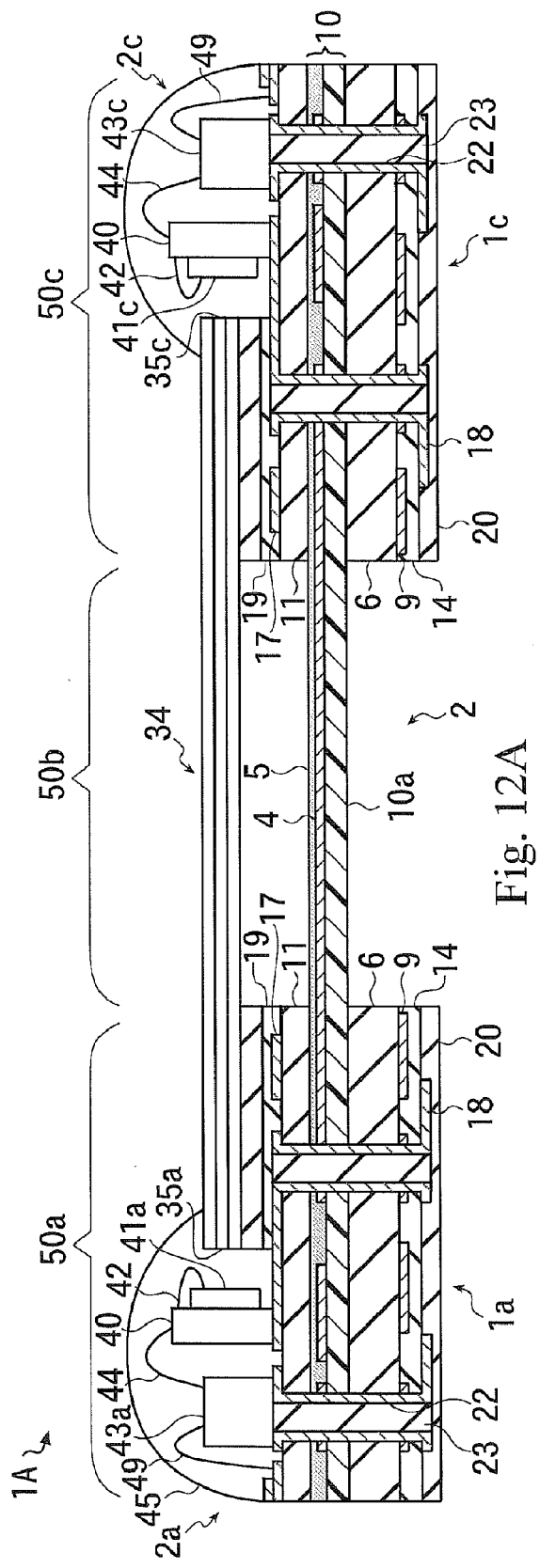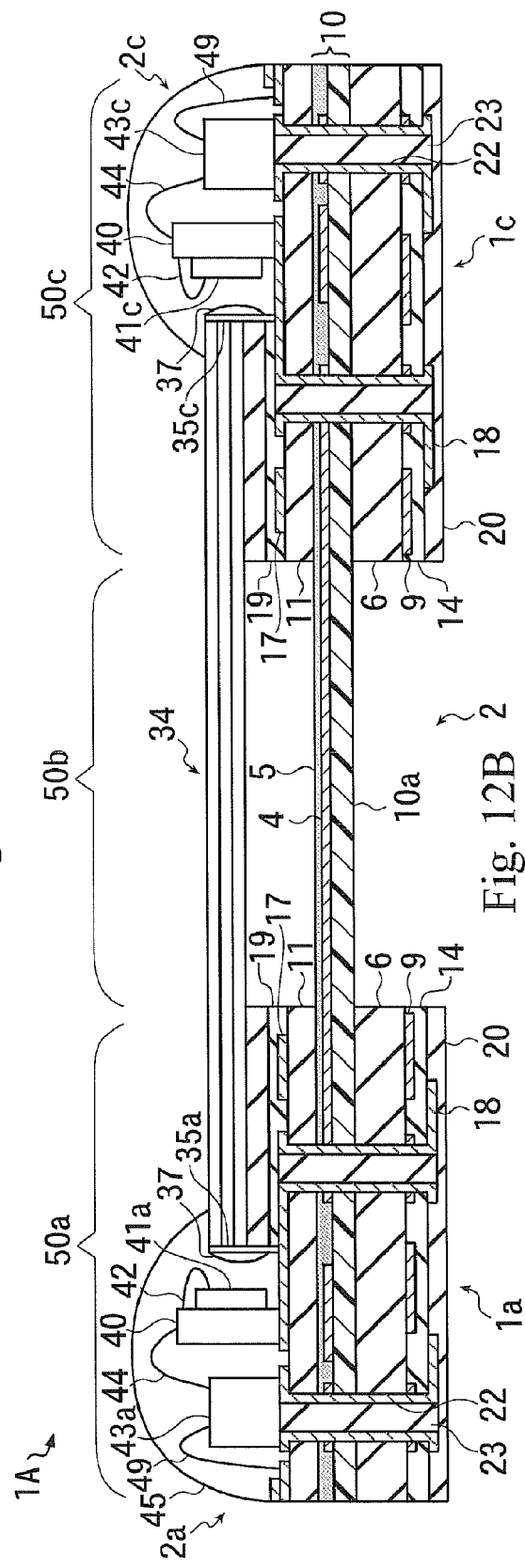
Fig. 12A
Fig. 12B

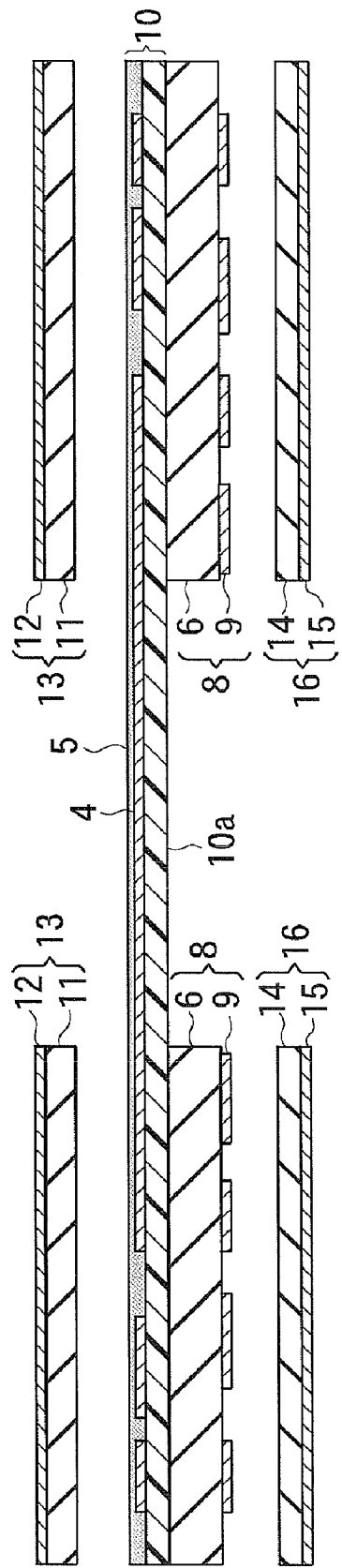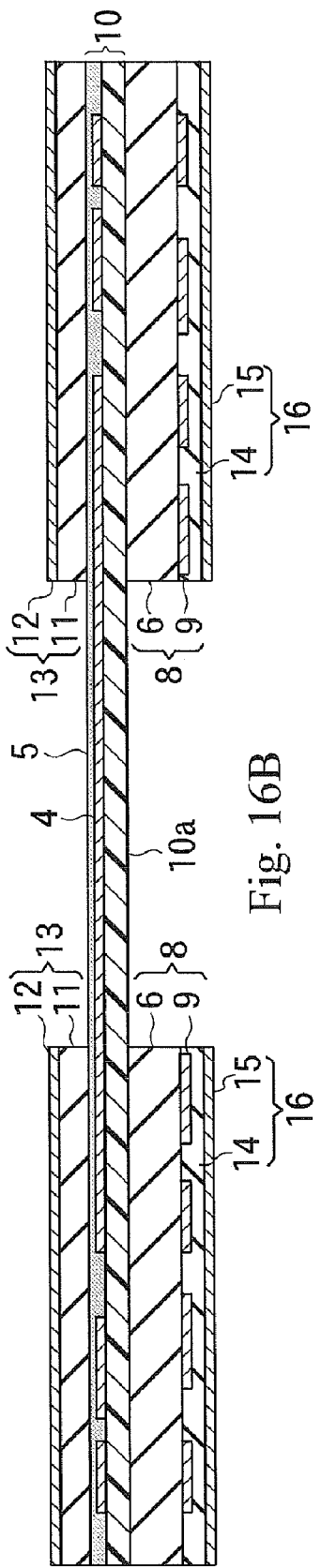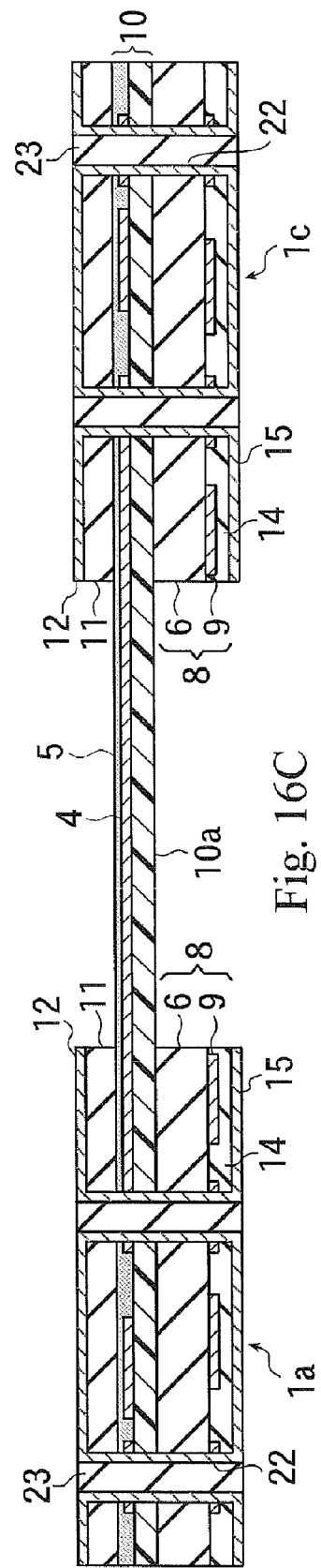

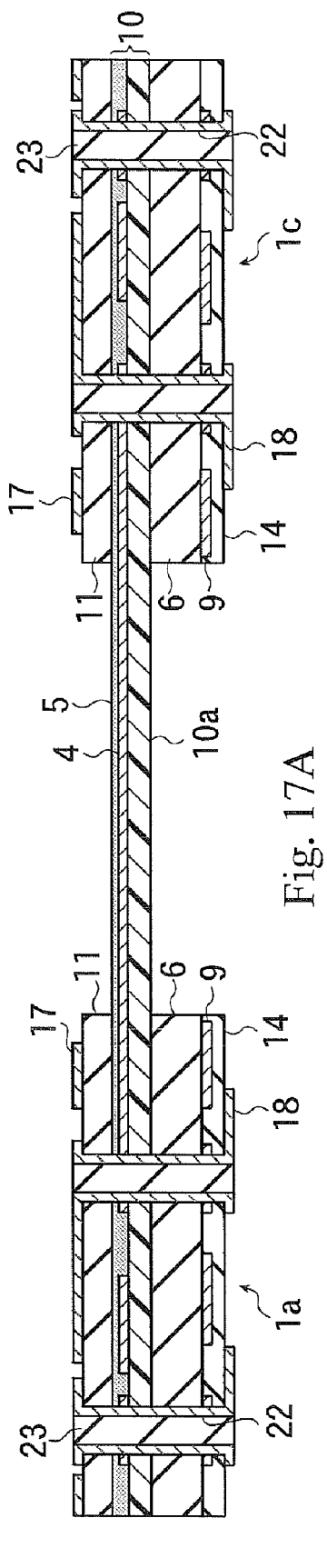
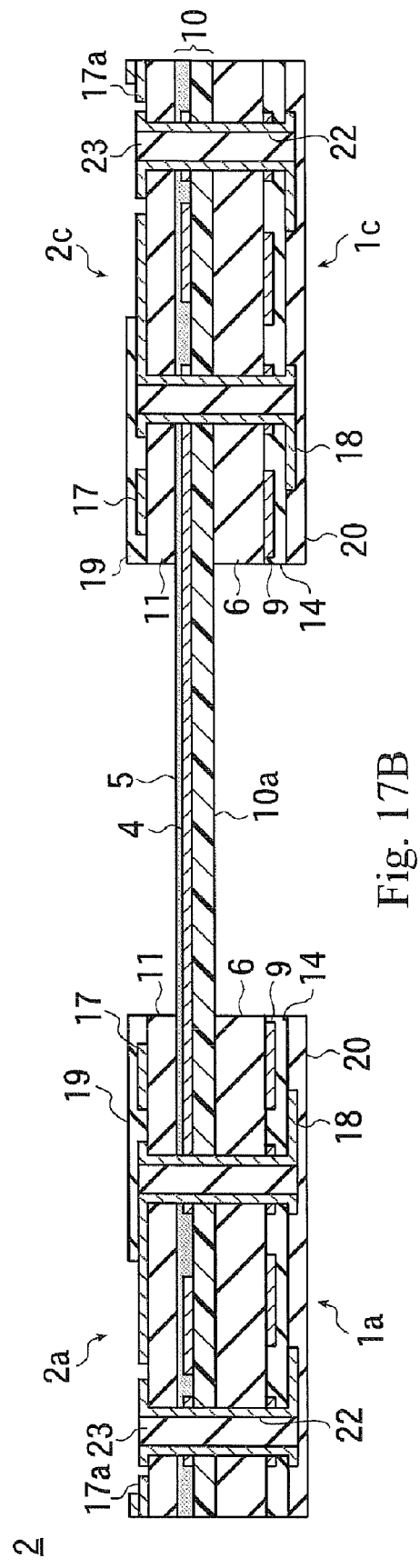

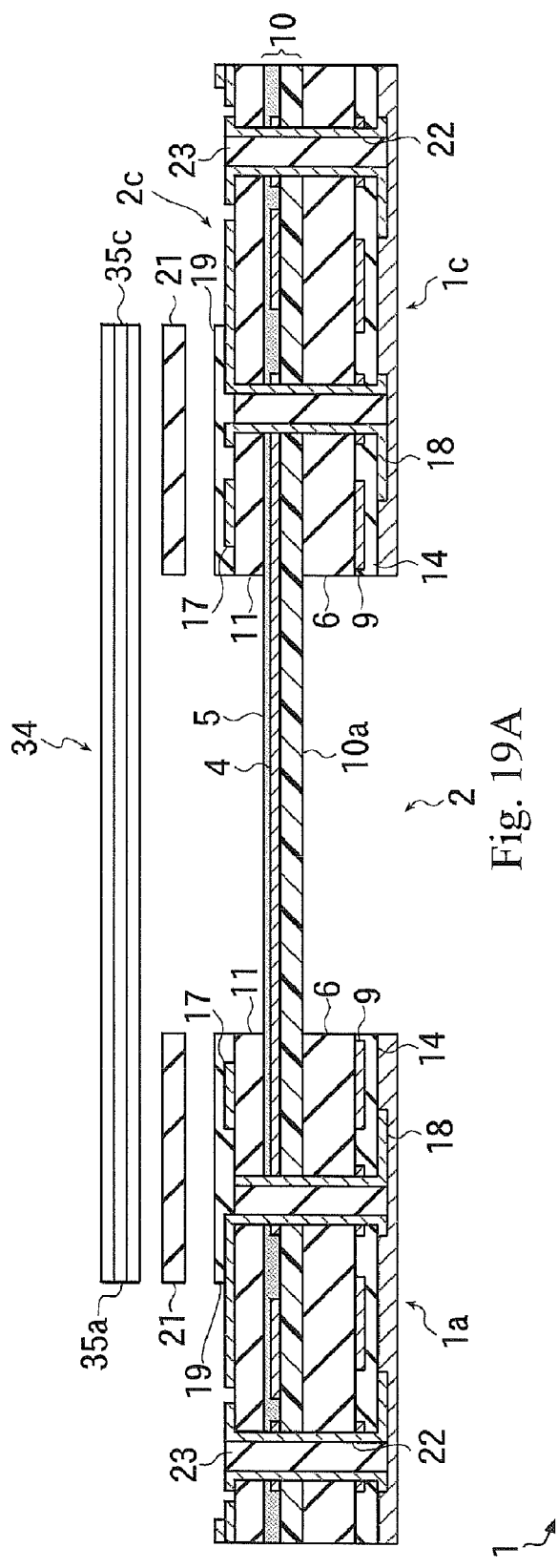
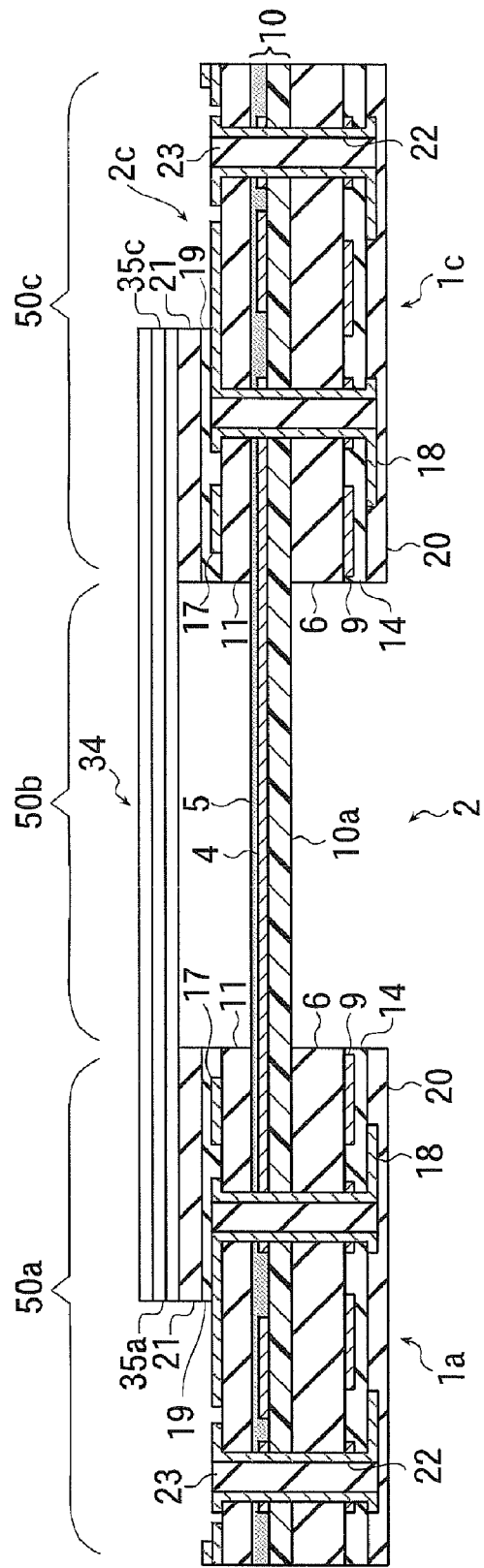
Fig. 19A
Fig. 19B

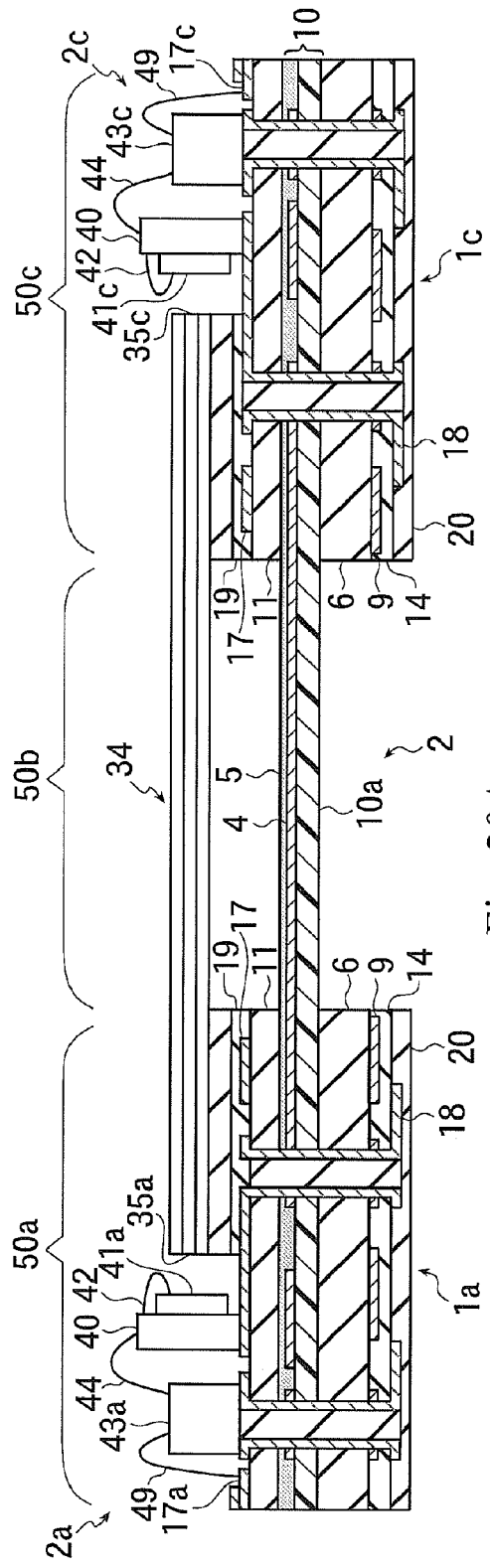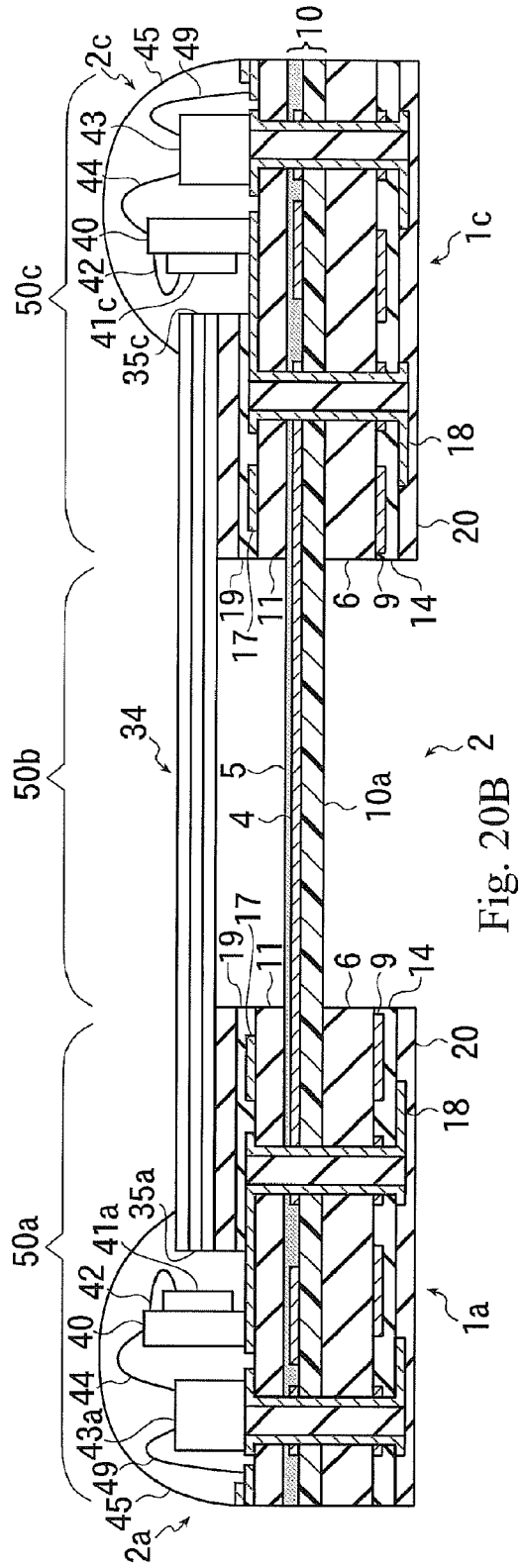

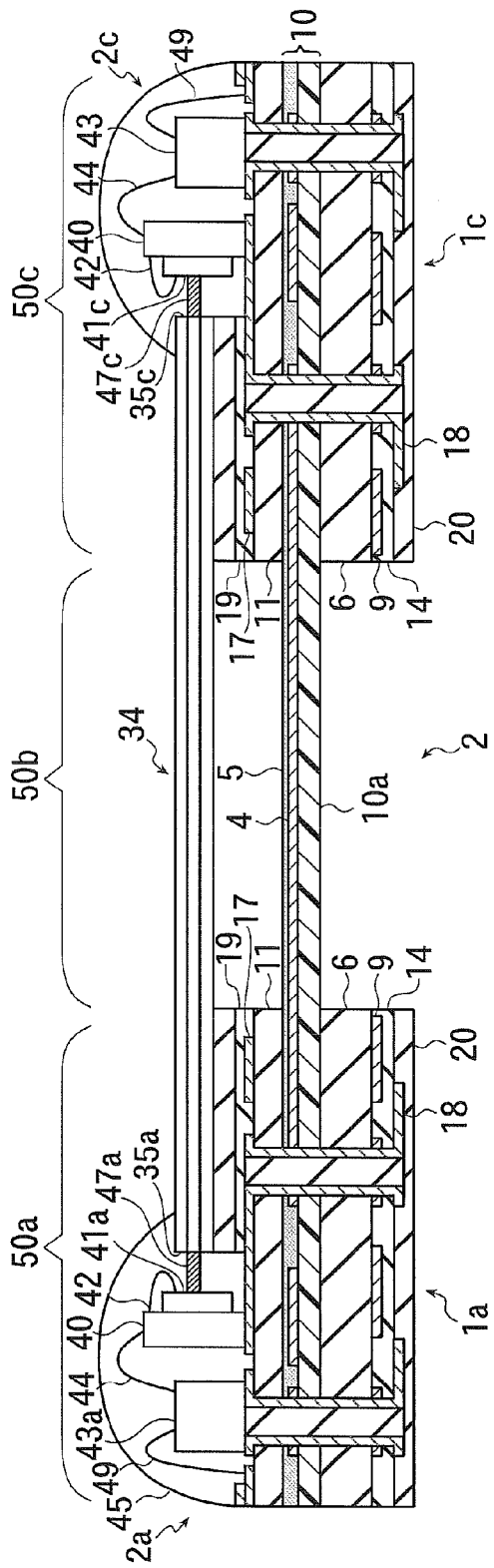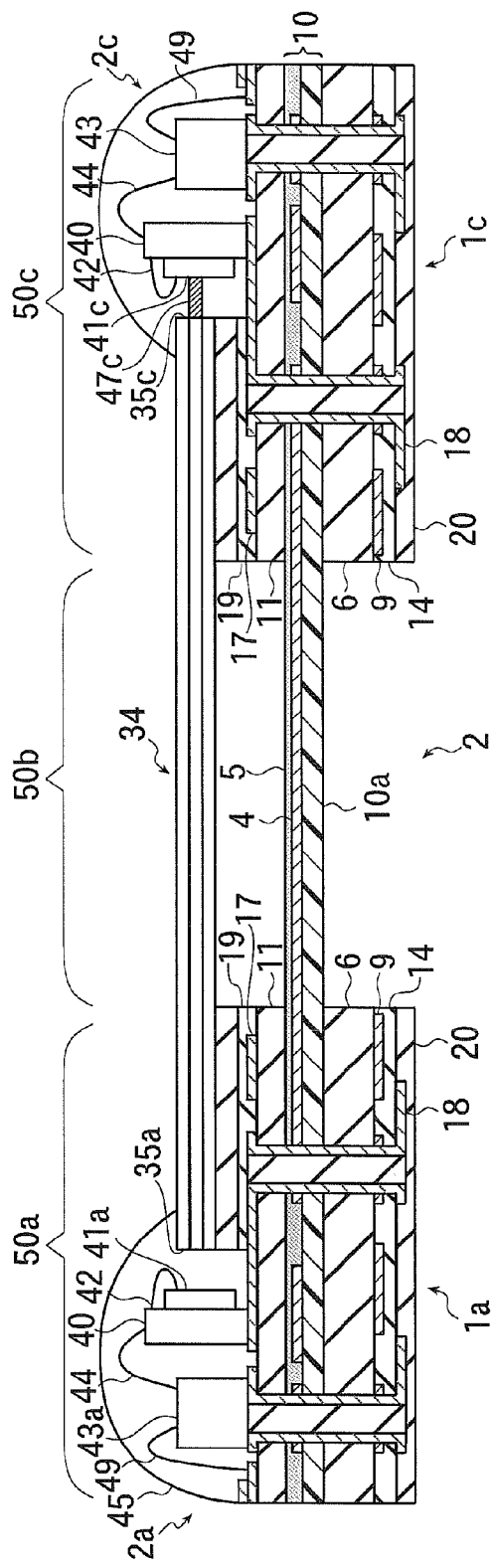
Fig. 22A
Fig. 22B

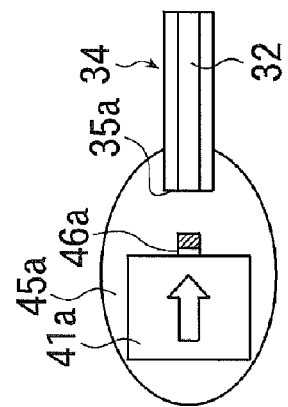
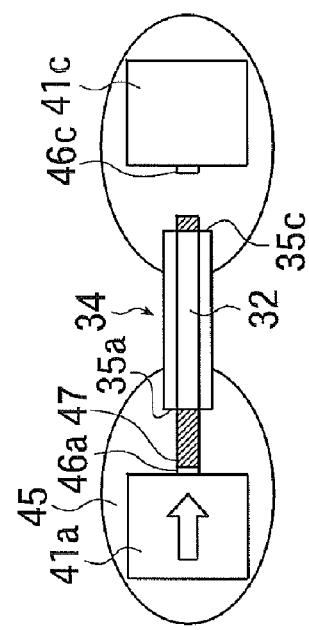
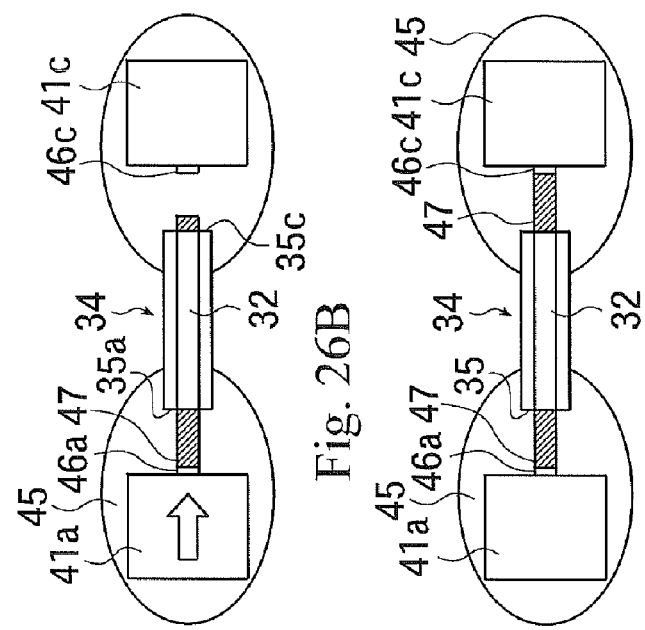
Fig. 26A  Fig. 26B  Fig. 26C
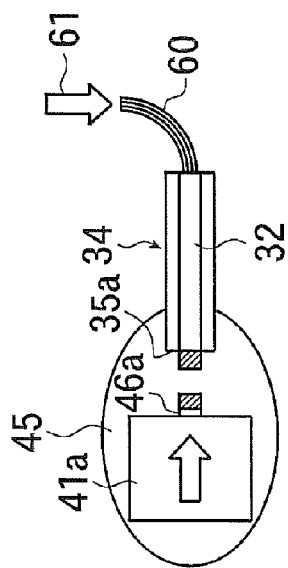
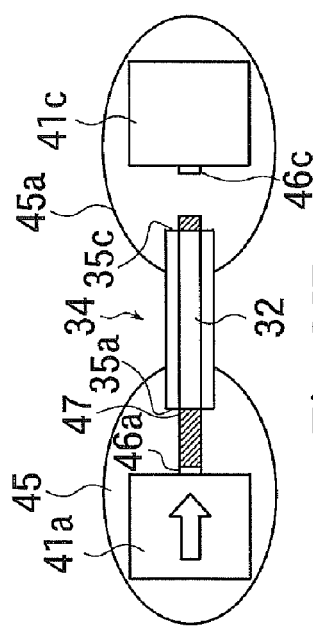
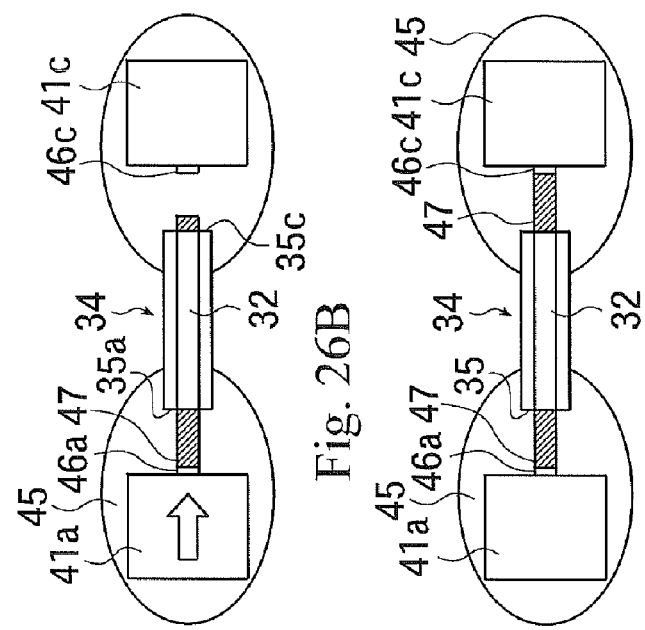
Fig. 25A  Fig. 25B  Fig. 25C

US 8,311,375 B2

OPTOELECTRONIC WIRING BOARD, OPTICAL COMMUNICATION DEVICE, AND METHOD OF MANUFACTURING THE OPTICAL COMMUNICATION DEVICE

The present application is a continuation application of Ser. No. 12/235,374 filed Sep. 22, 2008, which is now U.S. Pat. No. 7,734,125, patented Jun. 8, 2010, which is a continuation application claiming priority under 35 U.S.C. §120 to International Application No. PCT/JP2007/055967 filed Mar. 23, 2007, which claims priority to Japanese Patent Application No. 2006-084278 filed Mar. 24, 2006. The contents of these applications are incorporated herein by reference in their entirety.

BACKGROUND

The present invention relates to an optoelectronic wiring board, an optical communication device, and a method of manufacturing the optical communication device, and in particular to a substrate technology for performing information processing by using a flex rigid substrate.

Conventionally, in electronic equipment such as personal computers, digital video cameras, digital still cameras, CCD modules, liquid crystal panels, and light-transforming modules, flex rigid substrates have been used for miniaturization of the equipment.

As flex rigid substrates used in such electronic equipment, various ones have been proposed (see Japanese laid open publication No. 06-268339, for example).

Furthermore, in electronic equipment as described above, considerable increase in amount of information to be processed and increase in speed of information processing have been requested with increase in performance and expansion in functionality.

However, there is a problem that it is difficult for such flex rigid substrates to be sufficiently applicable to high-speed processing of a large amount of information in recent years because elements mounted on the substrates are operated by electric signals.

SUMMARY OF THE INVENTION

According to one aspect of the present invention, an optoelectronic wiring board includes a flex-rigid substrate and an optical communication unit. The flex-rigid substrate includes a flexible substrate provided with an electric wiring, and a pair of rigid sections provided on both sides of the flexible substrate. The pair of rigid sections each include a lamination formed of a conductive circuit and an insulating layer. The optical communication unit is made of a flexible material and has both end faces substantially perpendicular to its optical path of transmitting light. Both end portions of the optical communication unit are disposed and fixed on the rigid sections so that both end faces of the optical communication unit face an optical element mounting region provided on the rigid sections of the flex-rigid substrate.

According to another aspect of the present invention, an optical communication device includes a flex-rigid substrate, an optical communication unit, and a pair of optical elements. The flex-rigid substrate includes a flexible substrate provided with an electric wiring, and a pair of rigid sections provided on both sides of the flexible substrate. The pair of rigid sections each include a lamination formed of a conductive circuit and an insulating layer. The optical communication unit is made of a flexible material and has both end faces substantially perpendicular to its optical path of transmitting light. The pair of optical elements have their respective optical functional portions that are mounted on the rigid sections of the flex-rigid substrate. Both end portions of the optical communication unit are disposed and fixed on the rigid sections so as to face the optical elements. A condenser lens is provided on at least one of the end faces of the optical communication unit.

According to still another aspect of the present invention, a method for manufacturing an optical communication device includes preparing a flex-rigid substrate. The flex-rigid substrate includes a flexible substrate provided with an electric wiring, and a pair of rigid sections provided on both sides of the flexible substrate. The pair of rigid sections each include a lamination formed of a conductive circuit and an insulating layer. A part of an optical communication unit is fixed to the rigid sections of the flex-rigid substrate with adhesive. The optical communication unit is made of a flexible material and has both end faces substantially perpendicular to its optical path of transmitting light. A condenser lens is provided on at least one of the end faces of the optical communication unit. The optical elements or submount substrates on which the optical element are mounted are mounted on the rigid section of the flex-rigid substrate so that respective optical functional portions of the optical elements are arranged facing the both end faces of the optical communication unit.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 4B is a perspective view schematically showing the outline of another embodiment of the optoelectronic wiring board of the fundamental invention;

FIG. 4C is a cross-sectional view taken along the line A-A' of FIG. 4B;

FIG. 4D is a cross-sectional view taken along the line B-B' of FIG. 4B;

FIG. 10A is a cross-sectional view schematically showing an embodiment of an optoelectronic wiring board of the present invention, and FIG. 10B is a cross-sectional view schematically showing another embodiment of the optoelectronic wiring board of the present invention;

FIGS. 12A and 12B are cross-sectional views schematically showing one embodiment of an optical communication device of the present invention;

FIGS. 16A to 16C are process diagrams (3) showing an example of a method for manufacturing the optoelectronic wiring board according to an embodiment of the present invention;

FIGS. 17A to 17B are process diagrams (4) showing an example of a method for manufacturing the optoelectronic wiring board according to an embodiment of the present invention;

FIGS. 19A and 19B are process diagrams (6) showing an example of a method for manufacturing the optoelectronic wiring board according to an embodiment of the present invention;

FIGS. 20A and 20B are process diagrams showing an example of a method for manufacturing the optical communication device according to an embodiment of the present invention;

FIGS. 22A and 22B are cross-sectional views showing examples of places where coupling optical waveguides are formed according to an embodiment of the present invention;

FIGS. 25A to 25C schematically illustrate another example of a method for forming a coupling optical waveguide according to an embodiment of the present invention;

FIGS. 26A to 26C schematically illustrate another example of a method for forming a coupling optical waveguide according to an embodiment of the present invention;

DETAILED DESCRIPTION OF THE EMBODIMENTS

Figure 1:
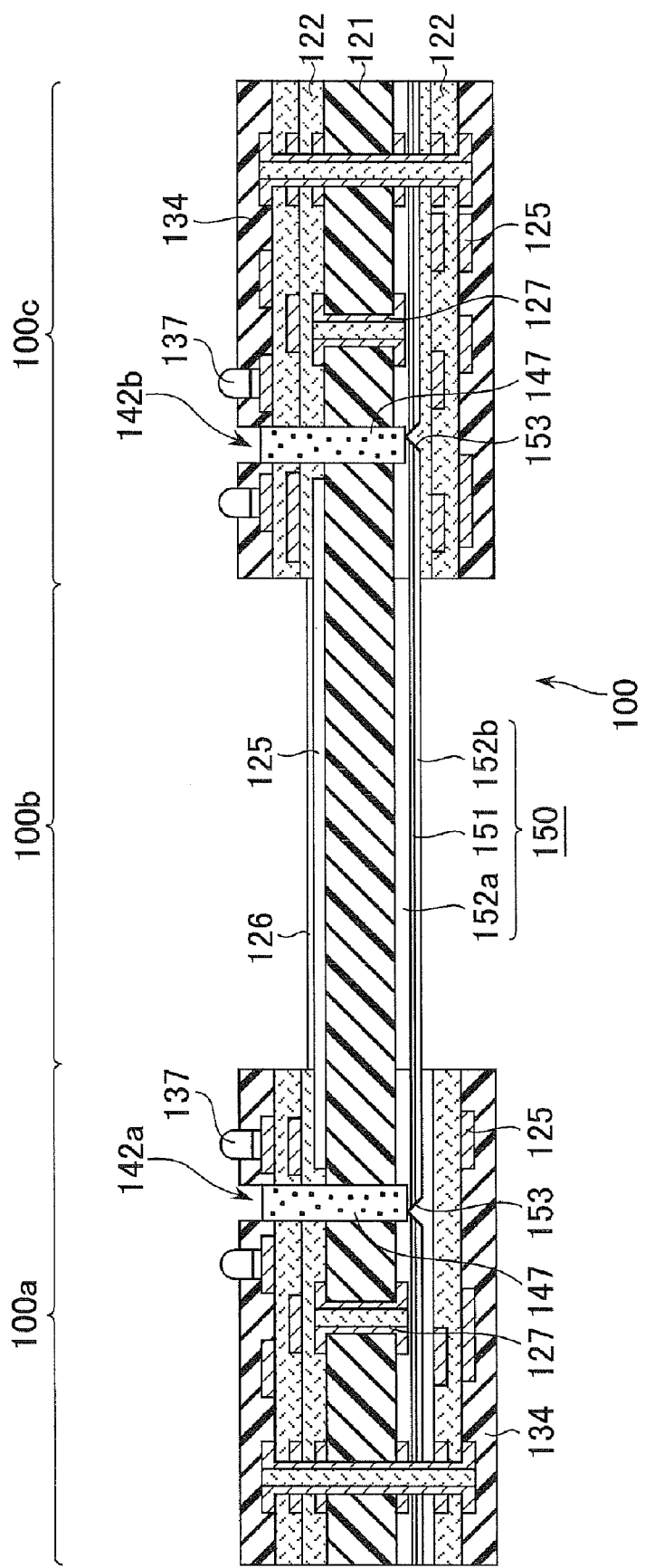
FIG. 1 is a cross-sectional view schematically showing an embodiment of the optoelectronic wiring board of the fundamental invention.

Embodiments of the present invention will be described below.

Prior to a detailed description of an embodiments of the present invention, an embodiment of an invention (referred to as "the fundamental invention" appropriately hereinafter) which becomes a premise of the present invention will be described. In the following description, common terms in the embodiment of the present invention and the embodiment of the fundamental invention shall have the same meanings unless otherwise specified, and common parts are referred to as "the present invention and the like".

An optoelectronic wiring board which becomes a premise of the present invention is configured in such a manner that rigid sections in which a laminate of conductive circuits and insulating layers has been formed on both sides of a substrate, and one or more flexible flex sections are integrated. The optoelectronic wiring board is characterized in that external connection terminals for mounting optical elements and/or package substrates on which optical elements are mounted are formed in the rigid sections and an optical wiring is formed in at least one of the flex sections.

The optoelectronic wiring board according to an embodiment of the fundamental invention is configured in such a manner that rigid sections and flex sections are integrated. In the rigid sections, external connection terminals for mounting optical elements and/or package substrates on which optical elements (also referred to as "optical elements and the like" simply hereinafter) are mounted are formed, and in at least one of the flex sections, an optical wiring is formed.

In the optoelectronic wiring board according to an embodiment of the fundamental invention having such a configuration, optical wirings are formed in the flex sections and conductive circuits are formed in the rigid sections, so that conductive circuits can be formed in portions where so highspeed transmission is not required and electric wirings are sufficient, while only lines which need high-speed transmission can be optical wirings. As a result, considerable increase in amount of information to be processed and increase in speed of information processing can be achieved without increasing the size of the wiring board.

In this connection, solder resist layers may be formed in the outermost layers of the rigid sections as necessary as described later.

Furthermore, the rigid sections and the flex sections are integrated in the optoelectronic wiring board according to an embodiment of the present (fundamental) invention, which means that they are configured so as to be able to transmit optical signals between both of them, and concrete embodiments of this configuration is not limited in particular.

The optoelectronic wiring board according to an embodiment of the fundamental invention will be described with reference to the figures.

In the following description, when terms are described as superordinate concepts, the terms are described without a reference numeral even if the same words are used.

FIG. 1 is a cross-sectional view schematically showing an embodiment of the optoelectronic wiring board of the fundamental invention.

As shown in FIG. 1, this optoelectronic wiring board 100 is composed of rigid sections 100a and 100c in which conductive circuits 125 and insulating layers 122 are laminated in order on both sides of a substrate 121, and non-penetrating via holes 127 for connecting the conductive circuits 125 to each other are formed, and a flex section 100b in which a conductive circuit 125 and an optical waveguide 150 are formed on the different sides of the substrate 121, respectively.

The rigid sections 100a and 100c and the flex section 100b are configured with one common substrate 121, thereby being integrated.

Furthermore, the optical waveguide 150 is formed on the substrate 121 constituting the flex section 100b and on the substrate 121 constituting the rigid sections 100a and 100c. The optical waveguide 150 is composed of a lower clad 152a, a core 151, and an upper clad 152b. On the optical waveguide 150, optical path changing mirror 153 described later is formed with the inclination of 45 degrees to the surface being in contact with the optical waveguide of the substrate 121.

Furthermore, a conductive circuit 125 is formed on a side of the substrate 121 of the flex section 100b opposite to a side of the substrate 121 on which the optical waveguide 150 is formed, and a cover lay 126 is formed on the conductive circuit 125 so as to protect the conductive circuit 125.

In addition, in the rigid sections 100a and 100c, optical signal passing regions 142a and 142b are provided which penetrate the substrate 121 and the insulating layer 122 on one side of the substrate and solder resist layer 134 on one side of the substrate 121 and are partially filled with resin composition 147. Respective one ends of the optical signal passing regions 142a and 142b are optically coupled with the optical waveguide 150.

Specifically, as shown in FIG. 1, the optical waveguide 150 having the optical path changing mirrors 153 formed directly below the lower ends of the optical signal passing regions 142a and 142b is disposed.

Furthermore, external connection terminals 137 for mounting optical elements and the like are formed on the outermost layer of one side of each of the rigid sections 100a and 100c.

Figure 2A:
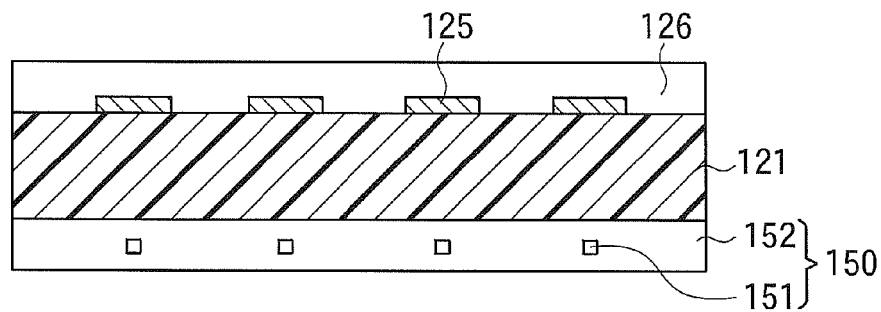
FIG. 2A is a cross-sectional view of a flex section of the optoelectronic wiring board shown in FIG. 1, and FIGS. 2B to 2D are cross-sectional views of a flex section of another embodiment of the fundamental invention.
Figure 2B:
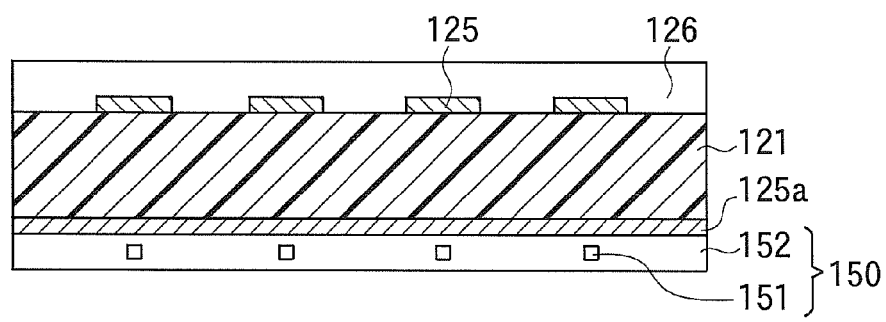
Figure 2C:
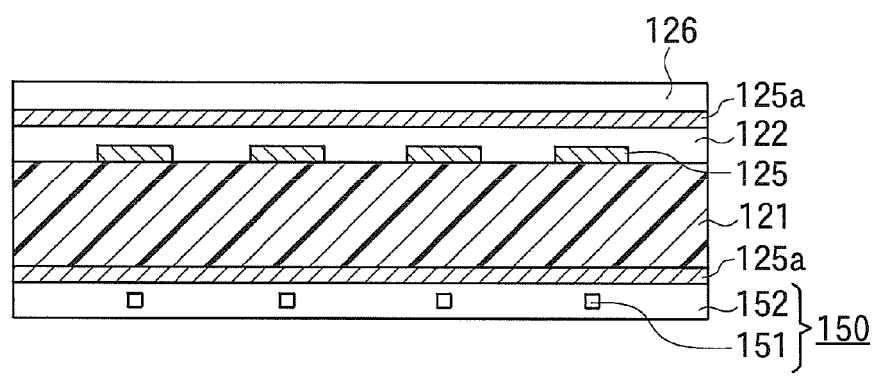
Figure 2D:
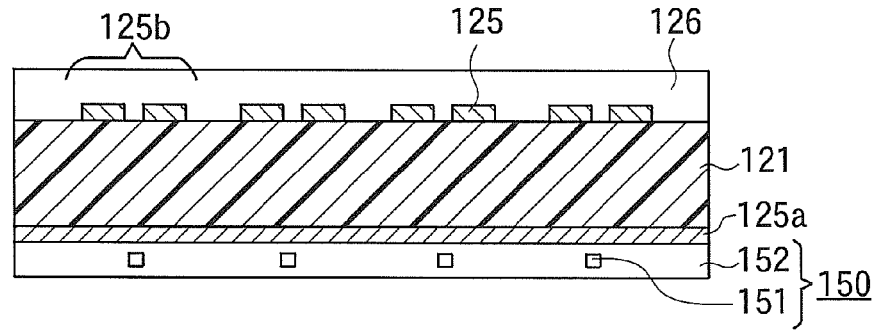

Furthermore, in the flex section 100b, the optical waveguide 150 and the conductive circuit 125a are formed on the different sides of the substrate 121 (see FIGS. 2B to 2D).

In the optoelectronic wiring board 100 configured as mentioned above, one flex section 100b is formed, and in the flex section 100b, conductive circuits are formed together with optical wirings.

Thus, in such an optoelectronic wiring board 100, signal transmission between the rigid sections 100a and 100c constituting the optoelectronic wiring board 100 can be performed with optical signals, and electric signals can also be transmitted.

Furthermore, in the optoelectronic wiring board 100, optical signal passing regions are formed so as to penetrate the substrate and only part of the insulating layers constituting the rigid section 100a and 100c, that is, the substrate 121 and insulating layers 122 laminated on one side of it.

When the optical signal passing regions are formed so as to penetrate the substrate and part of the insulating layers constituting the rigid sections as described above, conductive circuits, non-penetrating via holes, and the like can be formed freely without making a detour of the optical signal passing regions in layers where the optical signal passing regions do not penetrate of the substrate and the insulating layers constituting the rigid sections, so that such a configuration is suitable for achieving high density wiring with regard to electric wiring.

Furthermore, when ends of the optical signal passing regions are directly coupled optically with optical wirings (here, direct optical coupling means a state in which optical signals can be transmitted without passing through the insulating layers) as shown in, for example, FIG. 1, the insulating layers need not to be transparent with respect to transmission light, so that the insulating layers can be formed using commercial items or the like as used for conventional printed-wiring boards, and optoelectronic wiring substrates can be thus manufactured at low cost.

FIGS. 2A to 2D are cross-sectional views of the flex section of the optoelectronic wiring board according to the embodiment of the fundamental invention.

FIG. 2A is a cross-sectional view of the optoelectronic wiring board shown in FIG. 1. As shown in FIG. 2A, conductive circuits 125 protected by a cover lay 126 are formed on one side (upper side in the figure) of the substrate 121, and an optical waveguide 150 composed of a core 151 and a clad 152 is formed on the other side (lower side in the figure) thereof.

The structure of the flex section constituting the optoelectronic wiring board according to the embodiment of the fundamental invention is not limited to the one shown in FIG. 2A, and may be the one as shown in FIG. 2B, 2C, or 2D, for example.

FIG. 2B, 2C, or 2D is a cross-sectional view schematically showing another embodiment of the flex section constituting the optoelectronic wiring board according to the embodiment of the fundamental invention.

As shown in FIG. 2B, the flex section according to the embodiment of the fundamental invention may have a structure in which conductive circuits 125 functioning as a signal pattern are formed on one side (upper side in the figure) of the substrate 121, a conductive circuit 125a functioning as a ground pattern is formed on the other side (lower side in the figure), and an optical waveguide 150 composed of a core 151 and a clad 152 is formed on the conductive circuit 125a. In such a flex section, the conductive circuits have stripline structures.

On the conductive circuits 125, a cover lay 126 is formed similar to the flex section shown in FIG. 2A.

An example shown in FIG. 2C has a structure in which conductive circuits 125 functioning as a signal pattern are formed, and a conductive circuit 125a functioning as a ground pattern is formed via an insulating layer 122 on one side (upper side in the figure) of the substrate 121, and a conductive circuit 125a functioning as a ground pattern is formed on the other side (lower side in the figure) thereof, and further an optical waveguide 150 composed of a core 151 and a clad 152 is formed on the conductive circuit 125a.

In such a flex section, the conductive circuits have microstrip structures.

On the conductive circuits 125, a cover lay 126 is formed similar to the flex section shown in FIG. 2A.

An example shown in FIG. 2D has a structure in which conductive circuits 125 of differential lines 125b functioning as a signal pattern are formed on one side (upper side in the figure) of the substrate 121, a conductive circuit 125a functioning as a ground pattern is formed on the other side (lower side in the figure) thereof, and further an optical waveguide 150 composed of a core 151 and a clad 152 is formed on the conductive circuit 125a. In such a flex section, differential transmission of electric signals can be performed.

On the conductive circuits 125, a cover lay 126 is formed similar the flex section shown in FIG. 2A.

Furthermore, the flex section constituting the optoelectronic wiring board according to the embodiment of the fundamental invention may have a structure in which a power supply pattern is formed instead of a ground pattern in a flex section shown in FIGS. 2B to 2D.

Figure 3:
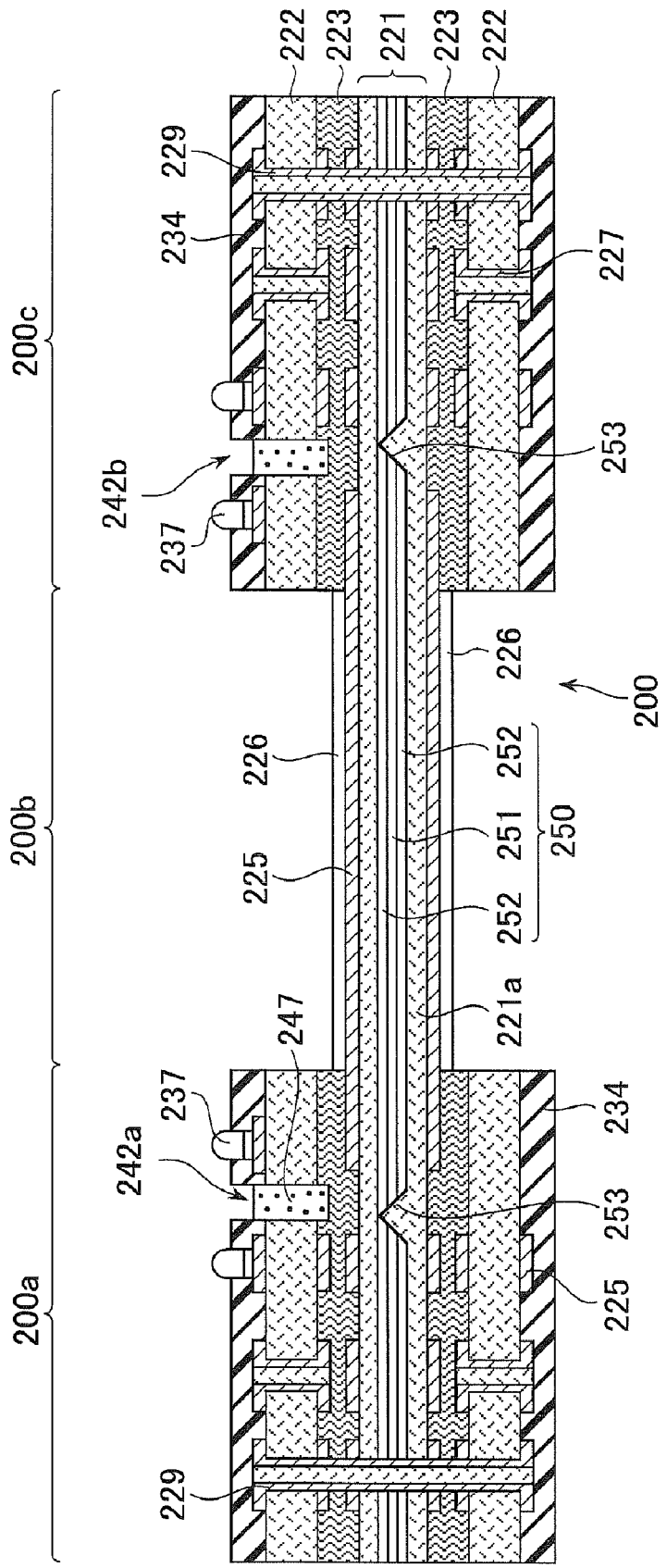
FIG. 3 is a cross-sectional view schematically showing another embodiment of the optoelectronic wiring board of the fundamental invention.

Furthermore, the optoelectronic wiring board according to the embodiment of the fundamental invention may have a structure as shown in FIG. 3. FIG. 3 is a cross-sectional view schematically showing another embodiment of the optoelectronic wiring board of the fundamental invention.

As shown in FIG. 3, this optoelectronic wiring board 200 is constituted by rigid sections 200a and 200c in which conductive circuits 225 and insulating layers 223 and 222 are laminated in this order on both sides of a substrate 221, and non-penetrating via holes 227 for connecting the conductive circuits to each other are formed and a flex section 200b in which conductive circuits 225 are formed on both sides of the substrate 221.

The rigid sections 200a and 200c and the flex section 200b are configured with one common substrate 221, thereby being integrated.

This substrate 221 is composed of an optical waveguide film 250 and resin layers (insulating layers) 221a provided on both sides thereof.

Since the resin layers 221a constitute part of optical signal passing regions 242a and 242b to be described below, materials having some degree of transparency for transmission light are used for the resin layers 221a. Concrete materials for the resin layers will be described later.

In this specification, some degree of transparency for transmission light means that the transmission factor for transmission light is 60%/30 μm or more at 25° C. In addition, materials having some degree of transparency for transmission light are also said to be materials transparent with respect to the transmission light.

On the other hand, the optical waveguide film 250 is composed of a core 251 and clads 252. Furthermore, optical path changing mirrors 253 are formed on the optical waveguide 250.

Furthermore, conductive circuits 225 are formed on both sides of the substrate 221 in the flex section 200b, and cover lays 226 are formed on the conductive circuits 225 so as to protect them.

In addition, in the rigid sections 200a and 200c, optical signal passing regions 242a and 242b partially filled with resin composition 247 are provided which penetrate the insulating layers 223 and 222 on one side of the substrate 221 and a solder resist layer 234 on one side of the substrate 221. These optical signal passing regions 242a and 242b are optically coupled with the optical waveguide 250. Specifically, as shown in FIG. 3, the optical path changing mirrors 253 are provided directly below the optical signal passing regions 242a and 242b.

Furthermore, external connection terminals 237 for mounting optical elements and the like are formed on the outermost layer of one side of each of the rigid sections 200a and 200c.

In the optoelectronic wiring board 200 configured as mentioned above, one flex section 200b is formed, and in the flex section 200b, conductive circuits are formed together with optical wirings.

Thus, in such an optoelectronic wiring board 200, signal transmission between the rigid sections 200a and 200c constituting the optoelectronic wiring board 200 can be performed with optical signals, and electric signals can also be transmitted when the conductive circuit 225 formed in the flex section 200b is signal pattern.

Although each of the conductive circuits 225 formed in the flex section 200b may be any of a signal pattern, a power supply pattern, and a ground pattern, it is desirable that part or all of them be power supply patterns and/or ground pattern.

When no conductive circuit is formed and only optical wirings are formed in the flex section 200b, power supply is needed in each of the rigid sections. When the conductive circuit formed in the flex section is power supply pattern or ground pattern, power may be supplied in one of the rigid sections, which provides advantages in miniaturization and high density mounting of the optoelectronic wiring board.

Furthermore, in the optoelectronic wiring board 200, optical signal passing regions 242a and 242b are formed so as to penetrate only part of the substrate and insulating layers constituting the rigid sections, that is, part of the substrate 221 and the insulating layers 222 and 223 laminated on one side of the substrate 221.

Furthermore, part of the optical signal passing regions 242a and 242b is constituted by insulating layers (insulating layers 223 and the like) transparent to transmission light. Such transparent insulating layers may be formed using materials having excellent transparency for transmission light (for example, the transmission factor is 90%/mm or more) and may also be formed using materials having a transmission factor of 60%/30 μm or more. Such a material is cheaper and more advantageous economically.

Here, an optoelectronic wiring board having one flex section has been described. However, the optoelectronic wiring board according to the embodiment of the fundamental invention may have a plurality of flex sections.

Figure 4A:
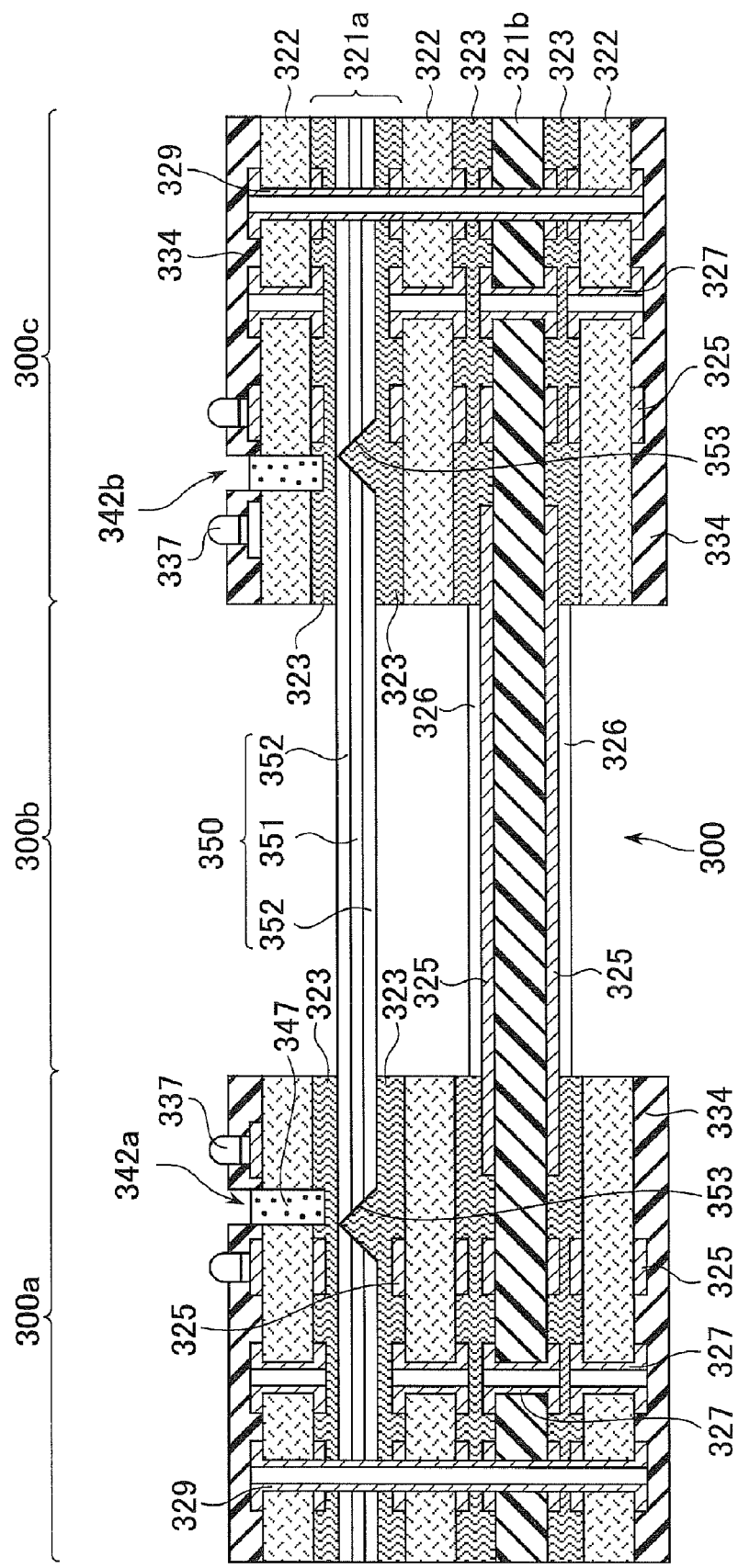
FIG. 4A is a cross-sectional view schematically showing another embodiment of the optoelectronic wiring board of the fundamental invention.

FIG. 4A is a cross-sectional view schematically showing another embodiment of the optoelectronic wiring board according to the embodiment of the fundamental invention.

As shown in FIG. 4A, this optoelectronic wiring board 300 includes a substrate 321a composed of an optical waveguide film 350 and insulating layers 323 formed so as to cover both ends of the optical waveguide film 350, a substrate 321b, on both sides of which conductive circuits 325 are formed, insulating layers 323 and 322, and conductive circuits 325.

Furthermore, non-penetrating via holes 327 for connecting conductive circuits to each other are formed. Portions in which insulating layers 322 and 323 are laminated on the substrates 321a and 321b constitute rigid sections 300a and 300c, and a portion in which insulating layers 322 and 323 are not laminated constitutes a flex section 300b. The substrates 321a and 321b are components of the rigid sections 300a and 300c and the flex section 300b, and the rigid sections 300a and 300c and the flex section 300b are thus integrated.

The substrate 321a has insulating layers 323 formed so as to cover both ends of the optical waveguide film 350 composed of a core 351 and clads 352. Optical path changing mirrors 353 are formed in the optical waveguide film 350.

Furthermore, cover lays 326 are formed on the conductive circuits 325 on both sides of the substrate 321b so as to protect the conductive circuits 325.

In addition, in the rigid sections 300a and 300c, optical signal passing regions 342a and 342b are formed which penetrate the insulating layers 323 on one side (upper side in the figure) of the substrate 321a and solder resist layers 334 on one side of the substrate 321a. The optical signal passing regions 342a and 342b are optically coupled with the optical waveguide 350. Specifically, as shown in the figure, the optical path changing mirrors 353 are provided directly below the optical signal passing regions 342a and 342b.

Furthermore, the optical signal passing regions 342a and 342b are partially filled with resin composition 347.

In the optoelectronic wiring board 300, the optical signal passing regions 342a and 342b are formed so as not to penetrate the substrate portion.

Furthermore, external connection terminals 337 for mounting optical elements and the like are formed on the outermost layer of one side of each of the rigid sections 300a and 300c.

In the optoelectronic wiring board 300 configured like this, two flex sections are formed. Only optical wirings are formed in one flex section, and only conductive circuits are formed in the other flex section.

Thus, in the optoelectronic wiring board 300, signal transmission between the rigid sections 300a and 300c constituting the optoelectronic wiring board 300 can be performed with optical signals, and electric signals can also be transmitted when the conductive circuits 325 formed in the flex section 300b are signal patterns.

Although each of the conductive circuits 325 formed in the flex section 300b may be any of a signal pattern, a power supply pattern, and a ground pattern, it is desirable that part or all of them be power supply patterns and/or ground patterns. The reason is as described above.

Furthermore, in the optoelectronic wiring board 300 shown in FIG. 4A, a plurality of flex sections is formed in each of which only either optical wirings or conductive circuits are formed, and the flex sections are formed so as to be integrated with different layers of the rigid sections. However, in the embodiment of the fundamental invention, when a plurality of flex sections is formed in each of which only either optical wirings or conductive circuits are formed, the flex sections may be configured so as to be integrated with the same layer level of the rigid sections.

Specifically, the embodiment of the fundamental invention may be an optoelectronic wiring board having, for example, a form as shown in FIGS. 4B to 4D. FIG. 4B is a perspective view schematically showing the outline of another embodiment of the optoelectronic wiring board of the fundamental invention. FIG. 4C is a cross-sectional view taken along the line A-A' of FIG. 4B, and FIG. 4D is a cross-sectional view taken along the line B-B' of FIG. 4B.

As shown in FIGS. 4B to 4D, in this optoelectronic wiring board 900, rigid sections 900a and 900c are integrated with a flex section 900b. In addition, this embodiment has a plurality of flex sections 900b (1900a, 1900b).

In one flex section 1900a shown in FIG. 4C, an optical waveguide 950 is formed on one side of a substrate 921a, and a cover lay 926 is formed on a side opposite to a side on which the optical waveguide 950 is formed. In the other flex section 1900b shown in FIG. 4D, a conductive circuit 925 is formed on one side of a substrate 921b, and a cover lay 926 for protecting the conductive circuit 925 and a cover lay 926 are formed on both sides of the substrate 921b. The optical waveguide 950 is composed of a core 951 and clads 952, and further optical path changing mirrors 953 are formed on the optical waveguide 950.

Conductive circuits 925 and insulating layers 922 are laminated on both sides of each of the substrates 921a and 921b, thereby constituting the rigid sections 900a and 900c. Furthermore, non-penetrating via holes 927 for connecting the conductive circuits having insulating layers in between are formed.

As mentioned above, the substrates 921a and 921b are components of the rigid sections 900a and 900c and the flex section 900b, and the rigid section 900a and 900c are integrated with the flex section 900b. Furthermore, both of the substrates 921a and 921b constitute the same layer of the rigid sections 900a and 900c, and each of the flex sections 1900a and 1900b are integrated with the rigid sections 900a and 900b at the same layer level thereof.

In addition, in the rigid sections 900a and 900c, optical signal passing regions 942a and 942b are formed which penetrate the insulating layers 922 on one side (upper side in the figure) of the substrate 921a and solder resist layers 934 on one side of the substrate 921a (see FIG. 4C). The optical signal passing regions 942a and 942b are optically coupled with the optical waveguide 950. Specifically, as shown in FIG. 4C, the optical path changing mirrors 953 are provided directly below the optical signal passing regions 942a and 942b. Furthermore, the optical signal passing regions 942a and 942b are partially filled with resin composition 947.

In this optoelectronic wiring board 900, the optical signal passing regions 942a and 942b are formed so as not to penetrate the substrate.

Furthermore, external connection terminals 937 for mounting optical elements and the like are formed on the outermost layer of one side of each of the rigid sections 900a and 900c.

In the optoelectronic wiring board 900 configured like this, two flex sections are formed. Only optical wirings are formed in one flex section, and only conductive circuits are formed in the other flex section. A flex section having optical wirings and a flex section having conductive circuits are formed in the same layer level.

Thus, in this optoelectronic wiring board 900, signal transmission between the rigid sections 900a and 900c constituting the optoelectronic wiring board 900 can be performed with optical signals, and electric signals can also be transmitted when the conductive circuits 925 formed in the flex section 900b are signal patterns.

Although each of the conductive circuits 925 formed in the flex section 900b may be any of a signal pattern, a power supply pattern, and a ground pattern, it is desirable that part or all of them be power supply patterns and/or ground patterns. The reason is as described above.

Furthermore, as is clear from the example shown in FIGS. 4B to 4D, in the embodiment of the fundamental invention, when a flex section having optical wirings and a flex section having conductive circuits are formed in the same layer level, the design flexibility increases.

The reason is that although a layer of rigid sections integrated with flex sections has a tendency that a conductive circuit is difficult to be formed therein and regions having no conductive circuit and having only insulating layers increase therein, if a flex section having optical wirings and a flex section having conductive circuits are formed in the same layer level, conductive circuits can be efficiently formed in an insulating layer of another layer.

As shown in FIGS. 4A to 4D, a plurality of flex sections is formed in the above-described optoelectronic wiring boards 300 and 900, and either optical wirings or conductive circuits are formed in each of the flex sections. However, the optoelectronic wiring board according to the embodiment of the fundamental invention is not always limited to the one in which only either optical wirings or conductive circuits are formed in each of the flex sections, and also in an optoelectronic wiring board having a plurality of flex sections, optical wirings and conductive circuits may be formed in one of the flex sections similar to the optoelectronic wiring board 100 shown in FIG. 1, for example.

When only either optical wirings or conductive circuits are formed in a flex section, the thickness of the flex section can be reduced as compared with a flex section in which both of optical wirings and conductive circuits are formed, and the flex section become easy to be bent so that the flexibility of deformation of the optoelectronic wiring board for use increases. Furthermore, when only optical wirings are formed in a flex section, no metallic layer which is hard to be bent is formed, and the flex section is made of only resin which is easy to be bent, so that stress concentration caused by a bend is decreased and stress is applied to the whole of the flex section. For this reason, increasing of the optical signal transmission loss caused by a bend can be prevented. Furthermore, when only conductive circuits are formed in a flex section, the thickness of the flex section can be decreased, so that the flex section has a tendency that stress concentration caused when the flex section is bent, is easy to be decreased.

Furthermore, when only either optical wirings or conductive circuits are formed, the number of processes becomes smaller so that the production of the flex section becomes easy.

Furthermore, when optical wirings and conductive circuits are formed in the same flex section, a crack may occur in the optical wirings due to the difference in thermal expansion coefficients between the optical wirings and the conductive circuits. However, when only either an optical wiring or a conductive circuit is formed, it is easy to match the thermal expansion coefficients so that no crack occurs and thus it becomes easy to improve the reliability.

Figure 5:
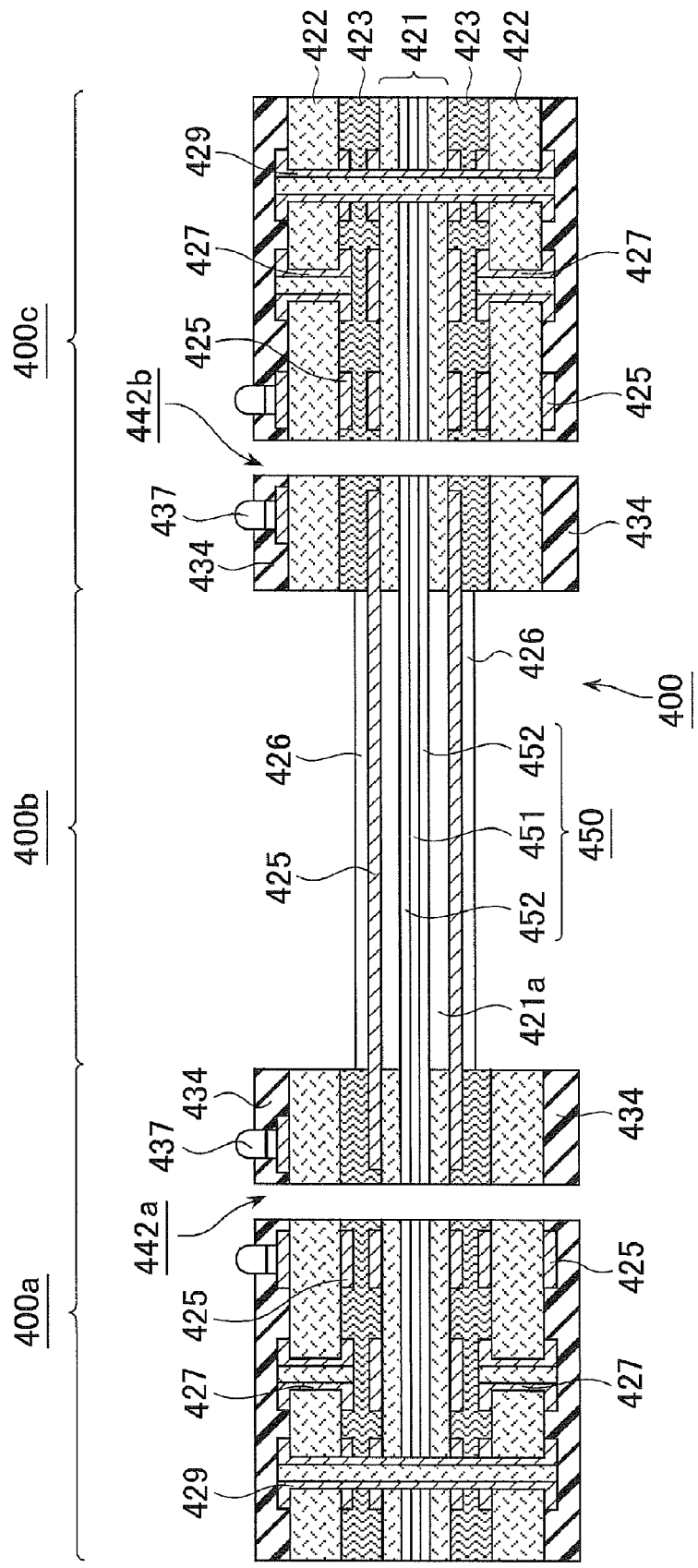
FIG. 5 is a cross sectional view schematically showing another embodiment of the optoelectronic wiring board of the fundamental invention.
Figure 6:
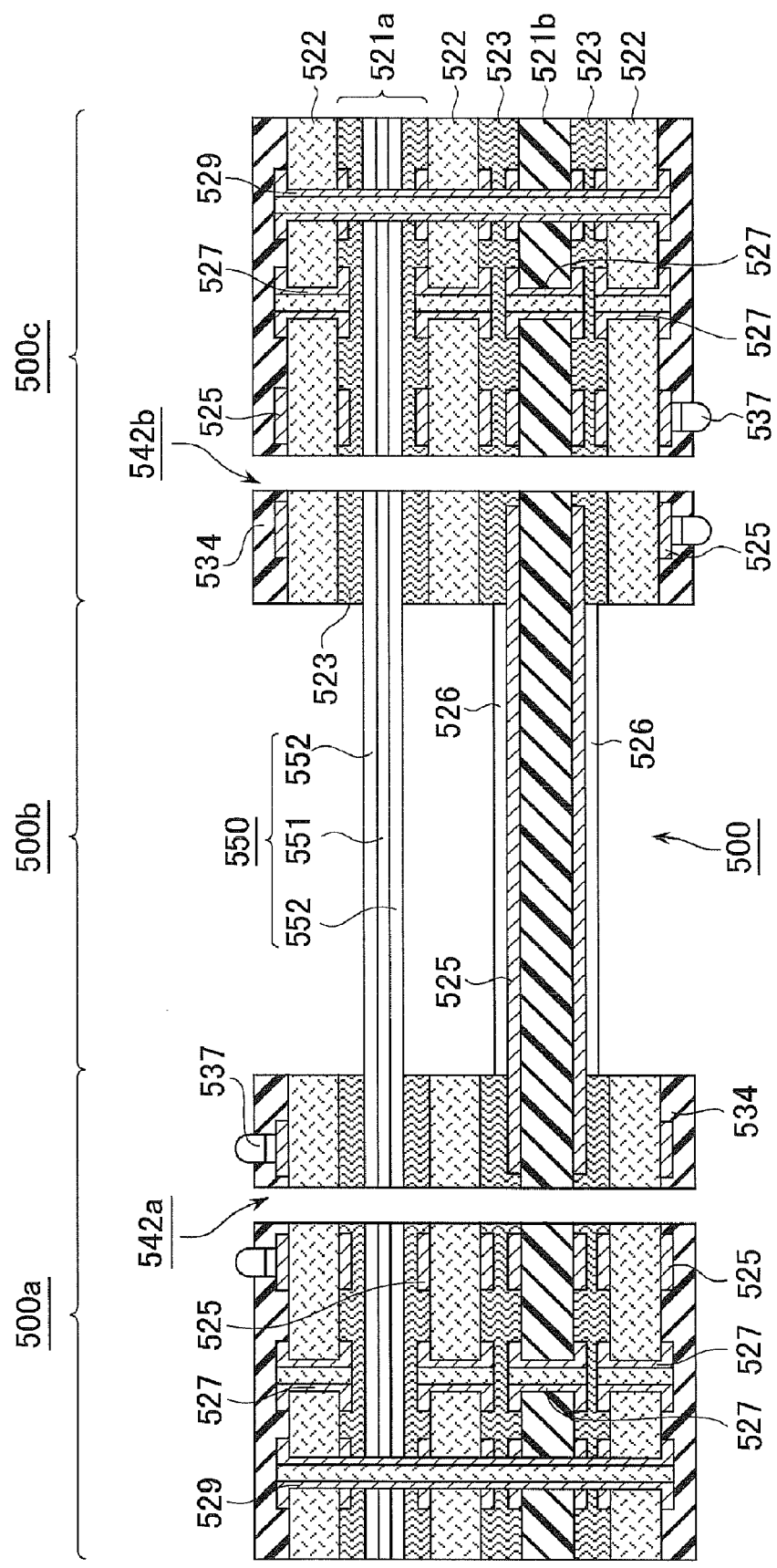
FIG. 6 is a cross sectional view schematically showing another embodiment of the optoelectronic wiring board of the fundamental invention.

Furthermore, the optoelectronic wiring board according to the embodiment of the fundamental invention may have an embodiment as shown in FIG. 5 or FIG. 6.

Each of FIGS. 5 and 6 is a cross sectional view schematically showing another embodiments of the optoelectronic wiring board according to the embodiment of the fundamental invention.

An optoelectronic wiring board 400 shown in FIG. 5 has substantially the same configuration as that of the optoelectronic wiring board 200 shown in FIG. 3, and is slightly different therefrom in the configuration of the substrate 421 and the configurations of the optical signal passing regions 442a and 442b. Because of this, only different points will be described in detail here.

The substrate 421 constituting the optoelectronic wiring board 400 is equivalent to the optoelectronic wiring board in FIG. 3 in that insulating layers 423 and conductive circuits 422 are laminated on both sides of the optical waveguide 450, and is different therefrom in that no optical path changing mirror is formed on the optical waveguide.

Furthermore, the optical signal passing regions 442a and 442b are formed so as to penetrate the whole of the rigid sections 400a and 400c, and the whole of the optical signal passing regions 442a and 442b are constituted by air space.

Furthermore, the optoelectronic wiring board 500 shown in FIG. 6 has substantially the same configuration as that of the optoelectronic wiring board 300 shown in FIG. 4A, and is slightly different therefrom in the configuration of the substrate 521a and the configurations of the optical signal passing regions 542a and 542b. Because of this, only different points will be described in detail here.

The substrate 521a constituting the optoelectronic wiring board 500 is equivalent to optoelectronic wiring board in FIG. 4A in that insulating layers 523 and conductive circuits 522 are laminated on both sides of the optical waveguide 550 in the vicinity of both ends of the substrate 521a, and is different therefrom in that no optical path changing mirror is formed on the optical waveguide.

Furthermore, the optical signal passing regions 542a and 542b are formed so as to penetrate the whole of the rigid sections 500a and 500c, and the whole of the optical signal passing regions 542a and 542b are constituted by air space.

The optoelectronic wiring boards 400 and 500 configured like this are also embodiments of an optoelectronic wiring board according to the embodiment of the fundamental invention. When optical elements and the like are mounted on such optoelectronic wiring boards, optical path changing members are provided so as to allow optical signals to be transmitted between the optical elements and the like and the optical wirings. This will be described in detail later.

In the optoelectronic wiring boards shown in FIGS. 5 and 6, optical signal passing regions are formed so as to penetrate all substrates and insulating layers constituting rigid sections.

In this case, the optical signal passing regions can be formed after all of the insulating layers have been laminated on both sides of the substrates (and after solder resist layers have been formed), so that the optical signal passing regions can be formed easily.

When such optical signal passing regions is formed, optical path changing member is provided as described above. The optical path changing member is provided by being fixed with adhesive while being aligned, and a high accuracy of positioning is not required for positions where the optical signal passing regions are formed, so that producing of the optical signal passing regions is easy.

Furthermore, since the insulating layers do not need to be transparent to transmission light, they can be formed using commercial items and the like used for conventional printed-wiring boards, so that the optoelectronic wiring boards can be manufactured at low cost.

In the optoelectronic wiring boards described with reference to the figures up to this point, optical waveguides are formed as optical wirings. However, in the optoelectronic wiring board according to the embodiment of the fundamental invention, optical fiber sheets may be formed instead of optical waveguides as optical wirings.

Furthermore, embodiments of the optoelectronic wiring board according to the embodiment of the present invention are not limited to those shown in the figures, and positions where optical wirings and conductive circuits are formed are not limited in particular.

Furthermore, in a flex section, optical wirings may be formed on both sides thereof, may be formed in a multilayer, and may be laminated with conductive circuits.

Furthermore, the number of layers of rigid sections is not limited, and the rigid sections may be integrated with flex sections at any layers.

Furthermore, in a rigid section according to the embodiment of the present invention, a flex substrate constituting a flex section may be formed to be disposed to an end face of the rigid section opposite to the flex section (see FIG. 10A), or may be formed to be disposed partially in part of the rigid section (see FIG. 10B).

Next, components of optoelectronic wiring boards according to the embodiment of the present invention and the like will be described.

As optical wirings according to the embodiment of the present invention and the like, optical waveguides (or optical waveguide films), optical fiber sheets, and the like can be suitably used.

The optical waveguides include organic optical waveguides made of polymer material and the like, because they are excellent in adhesiveness to the insulating layer and are thus easy to be processed.

The polymer material is not limited in particular if it little absorbs light in a communication waveband, and includes thermosetting resin, thermoplastic resin, photosensitive resin, thermosetting resin part of which is made photosensitive, resin complex of thermosetting resin and thermoplastic resin, complex of photosensitive resin and thermoplastic resin, and the like.

Specifically, the polymer material includes polymethyl methacrylate (PMMA), PMMA deuteride, acrylic resin such as deuterium fluorinated PMMA, polyimide resin such as fluorinated polyimide, epoxy resin, UV curable epoxy resin, polyolefin resin, silicone resin such as deuterium silicone resin, siloxane resin, polymer made of benzocyclobutene, and the like.

In the embodiment of the present invention and the like, although not limited particularly, the thickness of the core of an optical waveguide is preferably 1 to 100 μm, and the width thereof is preferably 1 to 100 μm. The reason thereof is as follows. If the width of the core of an optical waveguide is less than 1 μm, formation thereof may be not easy, while if the width thereof is more than 100 μm, it may become a cause of inhibiting the flexibility of design of conductive circuits and the like of which constitute the optoelectronic wiring board.

Furthermore, the ratio between the thickness and the width of the core of an optical waveguide is preferably near 1:1, because the plane shape of the above light-receiving element and the plane shape of the light-emitting portion of the above light-emitting element are a circle in general.

The ratio between the thickness and the width of the core of an optical waveguide is not limited in particular and only has usually to be between about 1:2 and about 2:1.

Furthermore, in the embodiment of the present invention and the like, an optical waveguide is preferably a multimode optical waveguide. In particular, when an optical waveguide is a multimode optical waveguide in the communication wavelength of 0.85 μm, the thickness and width of its core is more preferably between 20 μm and 80 μm, and is most preferably the order of 50 μm.

The reason why a multimode optical waveguide is preferable is that it is relatively easy to align the optical waveguide with an optical element and the allowance of the optical waveguide for miss-alignment is large, as compared with a single-mode optical waveguide.

Furthermore, in an optical waveguide according to the embodiment of the present invention and the like, particles may be mixed, because a crack is unlikely to occur in the optical waveguide in which particles are mixed. In other words, when any particles are not mixed in an optical waveguide, due to differences of the thermal expansion coefficient of the optical waveguide from those of other layers (for example, insulating layers and the like), a crack may occur in the optical waveguide. While particles are mixed in an optical waveguide to adjust the thermal expansion coefficient, and thereby differences of the thermal expansion coefficient of the optical waveguide from those of other layers described above are made small, a crack is unlikely to occur in the optical waveguide.

Such particles include ones similar to particles contained in resin composition constituting optical signal passing regions described later, or the like. These particles may be used singly, or two or more kinds of particles may be used in combination.

As the particles, inorganic particles are preferable. For example, particles made of silica, titania, or alumina can be suitably used. Furthermore, mixed particles formed by mixing and fusing at least two of silica, titania, and alumina can be used.

In addition, in the embodiment of the present invention and the like, shapes of particles are not limited in particular, and includes spheres, ellipsoids, crush shapes, polyhedrons, or the like.

Furthermore, it is desirable that particle diameters of the above particles be smaller (shorter) than the communication wavelength, because if the particle diameters are longer than the communication wavelength, transmission of an optical signal may be inhibited.

In this case, the particle diameter is length which is the largest sizes of the particles, and it is more desirable that the lower limit of the particle diameter is 0.01 μm and the upper limit thereof is 0.8 μm. If the particles include ones outside this range, the particle size distribution becomes too wide and when the particles are mixed in resin composition, variations in the viscosity of the resin composition become large, so that the reproducibility of a viscosity in the case of preparing the resin composition becomes low, and thereby it may become difficult to prepare resin composition having a predetermined viscosity. Furthermore, when the upper limit of the particle diameter is 0.8 μm, the diameters of particles can be smaller than the multimode wavelength of 0.85 μm and the transmission speed of an optical signal does not increase.

It is more desirable that the lower limit of the particle diameter is 0.1 μm and the upper limit thereof is 0.8 μm. The reason thereof is that resin composition in which particles in this range are mixed is suitable for being applied using spin coating, roll coating, or the like, and becomes easy to be prepared to a predetermined viscosity.

It is most desirable that the lower limit of the particle diameter is 0.2 μm and the upper limit thereof is 0.6 μm. Particles in this range are particularly suitable for application to esin composition and formation of a core of an optical waveguide. In addition, the variation of an optical waveguide formed, especially the variation of a core becomes smallest, and resulting in an excellent characteristic of an optoelectronic wiring board.

Furthermore, the particles may include particles having two or more kinds of different particle diameters provided they have particle diameters in this range.

A desirable lower limit of the amount of the mixed particles is 10 weight %, and a more desirable lower limit thereof is 20 weight %. On the other hand, a desirable upper limit of the amount of the mixed particles is 80 weight %, and a more desirable upper limit thereof is 70 weight %. The reason thereof is that if the amount of the mixed particles is less than 10 weight %, the effect of mixing particles may not be obtained, and if the amount of the mixed particles is more than 80 weight %, transmission of an optical signal may be inhibited.

The shape of an optical waveguide described above is not limited in particular, and it may be shaped as a film because of its easy formation.

When the optical waveguide is composed of a core and a clad, particles described above may be mixed in both of the core and the clad. However, it is desirable that no particle be mixed in the core and particles be mixed only in the clad with which the core is covered.

The reason thereof is as follows. When particles are mixed in an optical waveguide, air gap may be produced at the interfaces between the particles and the resin component depending on the adhesiveness between the particles and the resin component of the optical waveguide. In this case, the directions of refraction of light are changed by the air gap, so that the transmission loss of the optical waveguide may increase. In contrast to this, when particles are mixed only in the clad, a problem that the transmission loss of the optical waveguide increases does not arise by mixing particles as described above, and an effect described above that a crack is unlikely to occur in the optical waveguide can be obtained.

Furthermore, optical fiber sheets described above include a shape of a film in which a plurality of optical fibers is arranged in parallel and a periphery thereof is covered with a cover resin layer constituted by resin composition, and the like. In this case, optical fibers may be arranged only in parallel in one layer, or optical fibers arranged in parallel may be stacked in two or more layers.

Such optical fibers, although not limited in particular, include silica glass optical fibers (SOF), polymerclad optical fiber (POF), hard polymer clad optical fiber (HPCF), plastic optical fiber, and the like. Among these, silica glass optical fiber (SOF) is preferable because it can be made small in thickness. Furthermore, when the bending angle of a flex section is small, silica glass optical fiber (SOF) is preferable, and when the bending angle thereof is large, plastic optical fiber (POF) is preferable.

Furthermore, a fiber sheet shaped as a film in which only one optical fiber is totally covered with resin composition may also be used as the above fiber sheet.

Furthermore, it is desirable that optical path changing mirror is formed on the optical wiring substrate according to the embodiment of the fundamental invention described above. Because optical paths can be changed to desirable angles by forming the optical path changing mirrors, thereby being optically coupled with ends of optical signal passing regions. The optical path changing mirror may come in contact with air, resin having a different refractive index, or the like, or the optical path changing mirror may be formed of metal-evaporated layer. The metal-evaporated layer includes a layer made of, for example, gold, silver, platinum, copper, nickel, palladium, aluminum, chrome, alloy of some of them, or the like. These materials may be used singly or in combination.

Optical path changing mirror described above may be formed by cutting optical wiring and further forming metal-evaporated layer or the like as necessary. Instead of forming optical path changing mirror on optical wirings, member having optical path changing portions may be arranged via adhesive on tip of end of optical wiring.

When optical path changing mirror described above is formed, angle of formation thereof is not limited in particular and may be selected appropriately according to optical path. However, optical path changing mirror is generally formed in such a manner that the angle formed with plane which is in contact with insulating layer is 45 or 135 degree. In this case, it is preferable to form it at 45 degree from the view point of easy formation.

In the optoelectronic wiring board according to the embodiment of the fundamental invention, it is desirable that optical signal passing regions be formed. By forming such optical signal passing regions, the flexibility of design of optical wirings is further improved.

The optical signal passing region may be constituted by only air spaces, and part or the whole of it may be filled with resin composition. When the whole of the optical signal passing region is filled with resin composition, it can be said that the optical signal passing region is constituted by resin composition.

The resin component of the resin composition is not limited in particular provided it little absorbs light in a communication waveband, and includes, for example, thermosetting resin, thermoplastic resin, photosensitive resin, thermosetting resin part of which is made photosensitive, and the like.

Specifically, the resin component includes, for example, epoxy resin, UV curable epoxy resin, polyolefin resin, polymethyl methacrylate (PMMA), PMMA deuteride, acrylic resin such as deuterium fluorinated PMMA, polyimide resin such as fluorinated polyimide, silicone resin such as deuterium silicone resin, polymer made of benzocyclobutene, and the like.

Furthermore, the resin composition may contain particles such as resin particles, inorganic particles, or metal particles in addition to the resin component as described above. When the resin composition contains these particles, the optical signal passing regions can be matched in thermal expansion coefficient with the insulating layers and the like, and flame retardancy can be added to the resin composition depending on the kinds of the particles.

Such particles include, for example, inorganic particles, resin particles, metal particles, and the like. The inorganic particles are made of, for example, aluminum compound such as alumina and aluminum hydrooxide, calcium compound such as calcium carbonate and calcium hydroxide, potassium compound such as potassium carbonate, magnesium compound such as magnesia, dolomite, basic magnesium carbonate, and talc, silicon compound such as silica and zeolite, titanium compound such as titania, or the like. Furthermore, the inorganic particles may be formed by mixing and fusing at least two kinds of inorganic materials.

The resin particles include ones made of thermosetting resin, thermoplastic resin, or the like. Specifically, the resin particles include ones made of, for example, amino resin (melamine resin, urea resin, guanamine resin, or the like), epoxy resin, phenolic resin, phenoxy resin, polyimide resin, polyphenylene resin, polyolefin resin, fluoric resin, bismaleimide-triazine resin, or the like.

The metal particles include, for example, gold particles, silver particles, copper particles, tin particles, zinc particles, stainless steel particles, aluminum particles, nickel particles, iron particles, lead particles, and the like. In this case, it is desirable that the surface of the metal particles be covered with resin or the like in order to obtain the insulation performance.

These particles may be used singly or in combination of two or more kinds. Furthermore, it is desirable that the shape, maximum length, and amount of particles contained in the resin composition be similar to those of particles contained in the optical waveguide.

Furthermore, in the optoelectronic wiring board according to the embodiment of the fundamental invention, when the optical signal passing region is filled with resin composition, it is desirable that the transmission factor for transmission light of the resin composition be 70%/mm or more. Because if the transmission factor is less than 70%/mm, a sufficient ability of optical signal transmission may not be obtained. It is more desirable that the transmission factor be 90%/mm or more.

In this specification, the transmission factor of resin composition is a transmission factor for transmission light per the length of 1 mm. The transmission factor is the one measured at room temperature (25° C.).

Furthermore, optical signal passing regions described above may be shaped so as to be able to transmit optical signals through a single channel optical wiring, or may be shaped so as to be able to transmit optical signals through a multichannel optical wiring.

In this case, optical signal passing regions capable of transmitting optical signals through a multichannel optical wiring may have a collective through-hole structure capable of transmitting optical signals of all channels, or may have an individual through-hole structure capable of transmitting an optical signal of each channel. In either case, the number of channels is not limited.

Furthermore, in one optoelectronic wiring board, both of optical signal passing regions having a collective through-hole structure and optical signal passing regions having an individual through-hole structure may be provided.

Optical signal passing regions having the collective through-hole structure may be shaped like, for example, a circular cylinder, a square pillar, an elliptic cylinder, a shape in which a plurality of circular cylinders is arranged in parallel and sides of circular cylinders adjacent to each other are partially connected to each other, a column having a bottom face surrounded by straight lines and circular arcs, or the like.

When optical signal passing region is shaped in which a plurality of circular cylinders is arranged in parallel and sides of circular cylinders adjacent to each other are partially connected to each other, dummy circular cylinders which do not actually function as optical signal passing regions may be partially formed.

Furthermore, it is desirable that each of the vertical sizes and the horizontal sizes of optical signal passing regions having the collective through-hole structure be between 100 µm and 5 mm, respectively. When optical signal passing regions are shaped as a circular cylinder, it is desirable that the diameter thereof be in the above range.

When the diameter of the section thereof is less than 100 µm, transmission of an optical signal may be inhibited, while even if it is more than 5 mm, the transmission loss of an optical signal is not improved, and miniaturization of the optoelectronic wiring board thus becomes difficult.

Furthermore, optical signal passing regions having the individual through-hole structure may be shaped like, for example, a circular cylinder, a square pillar, an elliptic cylinder, a column having a bottom face surrounded by straight lines and circular arcs, or the like.

It is desirable that the lower limit of the diameter of the section of each of the optical signal passing regions having an individual through-hole structure be 100 µm and the upper limit thereof be 500 µm. When the diameter is less than 100 µm, an optical path may be blocked, and it may be difficult to fill the optical signal passing regions with uncured resin composition. On the other hand, even if the diameter is more than 500 µm, the optical signal transmittance is not so improved, which may become a cause of inhibiting the flexibility of design of conductive circuits and the like constituting the optoelectronic wiring board.

A more desirable lower limit of the diameter is 250 µm and a more desirable upper diameter thereof is 350 µm.

In the embodiment of the fundamental invention, the sectional diameter of a portion of an optical signal passing region penetrating substrates and insulating layers is, when the optical signal passing region is shaped as a circular cylinder, the diameter of the section thereof, when it is shaped as an elliptic cylinder, the longitudinal diameter of the section thereof, or when it is shaped as a square column or a polygonal column, the length of the longest portion of the section thereof. Furthermore, in the embodiment of the fundamental invention, the section face of an optical signal passing region is a section parallel to the principal plane of a rigid section of the optoelectronic wiring board.

It is desirable that the optical signal passing region be formed in a size that transmission light is not reflected by the wall surface thereof at optical signal transmission, because there is not a fear that optical signal transmission is affected by roughness of the wall surface of the optical signal passing region.

Furthermore, in order that an optical signal passing region is formed in a size that transmission light is not reflected by the wall surface, it is desirable to design so that collimated light transmit inside the optical signal passing region by disposing a microlens described later.

The wall surface of an optical signal passing region may be constituted by resin or metal. Since an insulating layer is usually exposed at the wall surface of an optical signal passing region, it can be said that the wall surface is constituted by material similar to that of the insulating layer. Thus, when the insulating layer is made of resin, it can be said that the wall surface of the optical signal passing region is constituted by resin even if it is not treated in particular.

However, a resin layer may be formed on the wall surface of the optical signal passing region separately. In this case, it is desirable that the resin layer be configured so as to function as a clad, and resin composition filled inside the optical signal passing region be configured so as to function as a core.

When the wall surface of an optical signal passing region is constituted by metal, as the material thereof, for example, copper, nickel, chrome, titanium, noble metal, or the like may be suitably used.

Furthermore, when a metallic layer is formed on the wall surface of an optical signal passing region, the metallic layer may be formed in one layer or in two or more layers.

Such a metallic layer is able to, in some cases, serve as a through-hole, that is, serve to electrically connect between conductive circuits of which a substrate is sandwiched, or between conductive circuits of which a substrate and an insulating layer are sandwiched.

When a resin layer or a metal layer is formed on the wall surface of the optical signal passing region, it is desirable that the surface (which is in contact with resin composition filled inside) be a rough surface having surface roughness between 0.1 µm and 5 µm, because the adhesiveness of the surface to the resin composition is improved.

The rough surface may be formed by etching or the like.

Furthermore, in the optoelectronic wiring board according to the embodiment of the fundamental invention, the shapes, forming positions, and the number of the optical signal passing regions are not limited in particular, and may be selected appropriately in consideration of the design of the optoelectronic wiring board, that is, in consideration of forming positions of external connection terminals and forming positions and the like of optical waveguides and conductive circuits.

However, it is desirable that the above-described optical signal passing region is formed so as to penetrate the insulating layer of one outermost layer, and conductive circuit and/or pad is formed on an outer layer side of the insulating layer of the other outermost layer and in position on extension line of the side of the optical signal passing region optically coupled with optical wiring.

With such a configuration, high density wiring of optical wirings and conductive circuits can be performed and high density mounting of optical elements and various kinds of electronic components can be performed.

Here, such pads are provided to mount optical elements and various kinds of electronic components.

In the optoelectronic wiring board according to the embodiment of the fundamental invention, when an optical signal passing region is formed, a microlens may be provided on the end and the like of a side opposite to a side optically coupled with an optical wiring of the optical signal passing region. In this case, the microlens may be arranged directly or via optical adhesive.

By arranging a microlens, an optical signal is focused by the microlens, thus being transmitted more reliably.

A microlens used in the embodiment of the fundamental invention is not limited in particular and includes one used in an optical lens, and concrete material thereof includes optical glass, resin for optical lens, or the like. Resin for optical lens includes material similar to polymer material described as resin composition, such as acrylic resin or epoxy resin, filled in the optical signal passing regions.

Furthermore, a shape of the microlens is, for example, a convex lens having a convex surface on one side thereof, or the like. The radius of curvature of the convex surface of the lens may be selected appropriately in consideration of the design of the optical signal passing region and the like. Specifically, for example, when the focal distance needs to be increased, it is desirable to increase the radius of curvature, and when the focal distance needs to be shortened, it is desirable to reduce the radius of curvature.

The shape of the microlens is not limited to a convex lens, and may have a shape that has only to be able to focus an optical signal in a desired direction.

It is desirable that a microlens used in the embodiment of the present invention and the like have a transmission factor of 70%/mm or more for communication wavelength light, because if the microlens has a transmission factor less than 70%/mm for communication wavelength light, the loss of an optical signal is large and the optical signal transmittance may be thus reduced. In addition, it is more desirable that the transmission factor be 90%/mm or more.

Such a microlens is usually applied and formed using an inkjet device, a dispenser, or the like.

A desirable lower limit of the mixed amount of particles in the microlens is 5 weight %, and a more desirable lower limit thereof is 10 weight %. On the other hand, a desirable upper limit of the mixed amount of the particles is 60 weight %, and a more desirable upper limit thereof is 50 weight %. The reason thereof is that if the mixed amount of particles is less than 5 weight %, the effect of mixing particles may not be obtained, and if the mixed amount of particles is more than 60 weight %, transmission of an optical signal may be inhibited.

Furthermore, when the optoelectronic wiring board according to the embodiment of the present invention and the like has multichannel optical wirings and microlenses are arranged on the optoelectronic wiring board, the microlenses may be independent of one another, or may be a microlens array in which a plurality of lenses is arranged in parallel.

Furthermore, when the microlenses are arranged, it is desirable that a microlense arranged on a side facing a light-emitting element be designed so as to be focused to a core of an optical waveguide on a side opposite to a side facing the light-emitting element, and a microlens arranged on a side facing a light-receiving element be designed so as to change light transmitted from the optical waveguide to be collimated light.

As mentioned above, the microlenses may be arranged directly or via optical adhesive, and it is more preferable that they be arranged directly.

The optical adhesive used is not limited in particular, and may be epoxy resin system, acrylic resin system, silicone resin system, and the like.

Furthermore, it is desirable that the optical adhesive have a viscosity between 0.2 Pa·s and 1.0 Pa·s, a refractive index between 1.4 and 1.6, an optical transmission factor of 80%/mm or more, and a coefficient of thermal expansion (CTE) between $4.0 \times 10^{-5}/°C$ and $9.0 \times 10^{-5}/°C$.

Concrete optical adhesive includes, for example, Optodyne UV-4000 of Daikin Industries, Ltd, adhesive for optical path coupling (having a refractive index between 1.46 and 1.57) of NTT Advanced Technology Corporation, or the like.

Furthermore, it is desirable that the thickness of the optical adhesive is 50 µm or less.

Furthermore, when the microlens is arranged, surface treatment may have been made on regions where it is arranged.

The reason thereof is as follows. When resin for forming a microlens is applied by an inkjet device or the like, variations in the shape, especially the sag height, of the microlens are easy to occur due to the dispersion in process conditions before forming a solder resist layer and/or wettability of a portion where the microlens is arranged caused by the time of standing. In contrast to this, variations in the sag height of the microlens can be reduced by performing surface treatment and the like by water-repellent coating agent.

Such surface treatment includes, for example, treatment by water-repellent coating agent such as fluorinated polymer coating agent (having a surface tension between 10 mN/m and 12 mN/m), water-repellent treatment by DF4 plasma, hydrophillic treatment by O2 plasma, and the like.

Furthermore, a microlens described above may be arranged via a lens marker.

As such a lens marker, for example, the one disclosed in Japanese Patent Application Laid-open No. 2002-331532 or the like may be suitably used.

When a lens marker has been formed, it is desirable that the microlens be arranged on the lens marker subjected to water-repellent treatment or hydrophilic treatment.

When the surface of the lens marker is stained, there is a case that resin composition used for forming a microlens (resin composition for lens) is not spread uniformly and may thus become a cause of being incapable of forming a microlens having a desired shape. However, by performing the water-repellent treatment or the hydrophilic treatment, dirt of the surface of the lens marker can be removed, and the resin composition for lens can be spread uniformly on the lens marker.

In addition, it is more desirable that the lens marker be subjected to hydrophilic treatment than to water-repellent treatment.

When the lens marker is subjected to hydrophilic treatment, resin composition for lens dropped for arranging the microlens on the lens marker is likely to spread on the whole of the lens marker, and spread of the resin is sure to be stopped at the outer periphery of the lens marker, so that hydrophilic treatment is suitable to form a microlens having a predetermined shape by surface tension.

A microlens having a configuration similar to that of a microlens described above may also be used in the present invention described later.

Next, the optical communication device according to the embodiment of the fundamental invention will be described.

The optical communication device according to the embodiment of the fundamental invention is characterized in that the above-described optoelectronic wiring board according to the embodiment of the fundamental invention having optical element and/or a package substrate on which optical element is mounted on a motherboard.

In the optical communication device according to the embodiment of the fundamental invention, optical wirings are formed in the flex sections and conductive circuits are formed in the rigid sections, so that conductive circuits can be formed in portions where so high-speed transmission is not required and electric wirings are sufficient, while only lines which need high-speed transmission can be optical wirings. As a result, considerable increase in amount of information to be processed and increase in speed of information processing can be achieved without increasing the size of the wiring board.

Specifically, for example, when the optical communication device is used in a mobile phone, in image transmission, RGB signals can be transmitted with optical wirings because high-speed processing is desired, while signals for adjusting the contrast, brightness, of the screen and the like can be transmitted with electric wirings (conductive circuits) because high-speed processing is not particularly required.

In other words, in the optical communication device according to the embodiment of the fundamental invention, signals which need high-speed processing can be transmitted at high speed with optical wirings, and signals, power supplies, and grounds which do not need high-speed processing can be transmitted at low speed with electric wirings (conductive circuits).

Such an optical communication device may be used in not only a mobile phone but also various devices such as a personal computer, a digital video camera, digital camera, a CCD module, a liquid crystal panel, and a light-transforming module, and its application is not limited.

The optoelectronic wiring board and the optical communication device according to the embodiment of the present invention can be used effectively for signal transmission between a control section and a screen section of a mobile phone, a personal computer, a digital camera, or the like, signal transmission in a substrate between a CPU and a memory or the like, and signal transmission for substrates between a motherboard and a backplane board or the like, and therefore considerable increase in amount of information to be processed and increase in speed of information processing can be achieved using optical transmission.

Embodiments of the optical communication device according to the embodiment of the fundamental invention will be described with reference to the figures.

Figure 7:
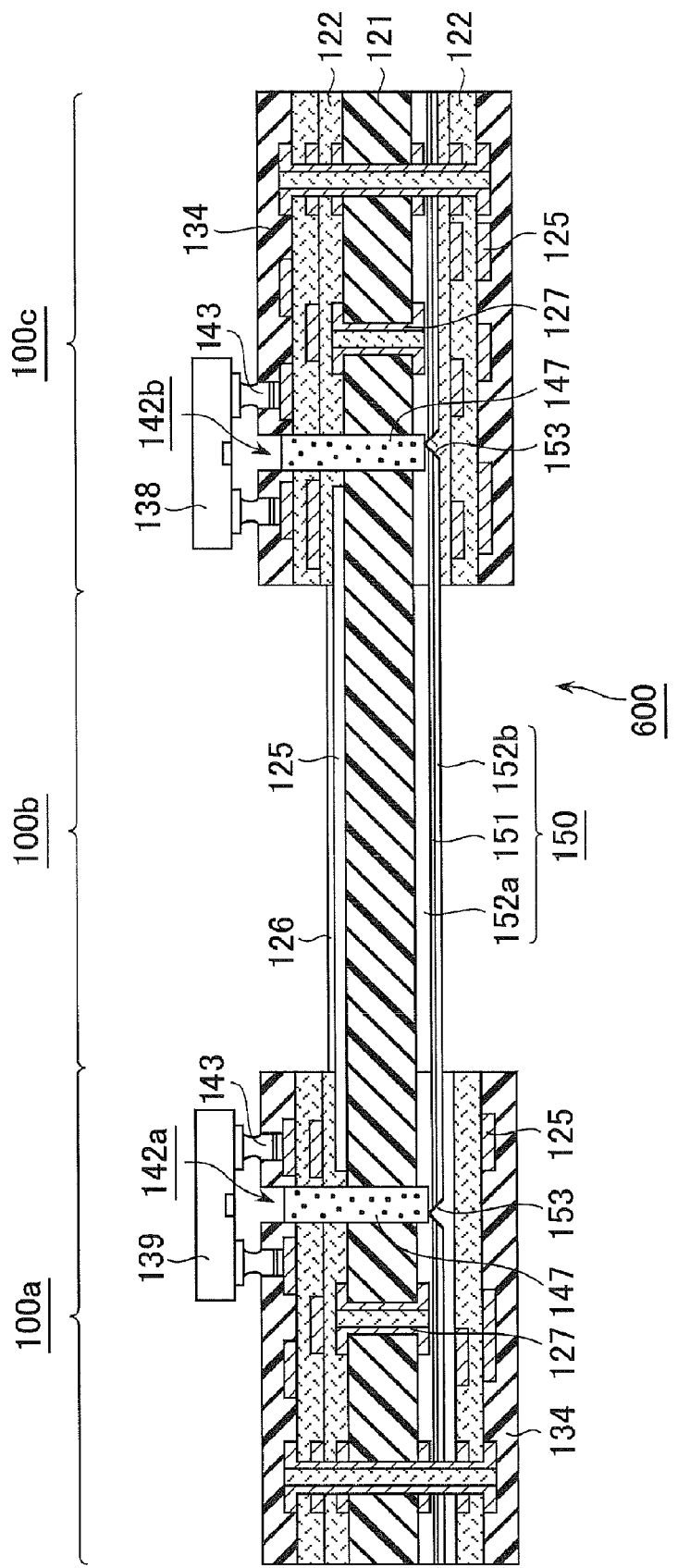
FIG. 7 is a cross-sectional view schematically showing an embodiment of an optical communication device of the fundamental invention.

FIG. 7 is a cross-sectional view schematically showing an embodiment of the optical communication device according to the embodiment of the fundamental invention.

In the optical communication device 600 shown in FIG. 7, a light-receiving element 139 and a light-emitting element 138 are mounted on the optoelectronic wiring board 100 shown in FIG. 1 via solder connecting portions. The optical communication device 600 is configured such that an optical signal output from the light-emitting element 138 is transmitted to the light-receiving element 139 through an optical signal passing region 142b, an optical waveguide 150, and an optical signal passing region 142a.

Furthermore, when an optical wiring and a conductive circuit are formed in a flex section 100b of the optical communication device 600 as shown in FIG. 7, the whole of the optical communication device can be driven even if the optical communication device 600 is not connected with a motherboard substrate or the like.

On the optical communication device according to the embodiment of the fundamental invention or the optical communication device according to the embodiment of the present invention described later, optical elements such as a light-receiving element, a light-emitting element, and the like are mounted. These may be used properly as appropriate in consideration of the configuration, the required characteristic, and the like of a package substrate described above. The light-receiving element includes, for example, a photodiode (PD), an avalanche photodiode (APD), or the like.

The material of the light-receiving element includes Si, Ge, InGaAs, or the like. InGaAs is most desirable in these materials because of the excellent light-receiving sensitivity.

On the other hand, the light-emitting element includes, for example, an LD (semiconductor laser), a DFB-LD (distributed feedback semiconductor laser), an LED (light-emitting diode), an Infrastructure or oxide-confined VCSEL (vertical cavity surface-emitting semiconductor laser), or the like.

These may be used properly as appropriate in consideration of the configuration, required characteristic, and the like of the optical communication device.

The material of the light-emitting element includes a compound of gallium, arsenic and phosphorus (GaAsP), a compound of gallium, aluminum, and arsenic (GaAlAs), a compound of gallium and arsenic (GaAs), a compound of indium, gallium, and arsenic (InGaAs), a compound of indium, gallium, arsenic, and phosphorus (InGaAsP), or the like.

Furthermore, an optical element such as a light-receiving element, a light-emitting element, or the like may be a multichannel optical element, and the number of channels thereof is but not limited to 4ch, 8ch, 12ch, or the like, and the pitch is but not limited to 125 μm, 250 μm, 500 μm, or the like.

When an optical element is an array element having a multichannel, the light-receiving portion or the light-emitting portion thereof may be arranged on a straight line, or may be arranged in two dimensions.

The optical element may be mounted by flip chip bonding or wire bonding.

Furthermore, a micro lens described above may be provided on the light-receiving face of the light-receiving element or the light-emitting face of the light-emitting element.

The optical elements may be mounted in a state being mounted on a package substrate.

When the optical element or the package substrate on which the optical element is mounted, is mounted, an underfill may be filled therein after the mounting.

In this case, an underfill material is not limited in particular, and for example, may use thermosetting resin, luminescent resin, resin in which a photosensitive group is added to part of thermosetting resin, resin complex including these resins and thermo plastic resin, or the like. Furthermore, commercial underfill resin may also be used.

It is desirable that the underfill have a transmission factor of 70%/mm or more for communication wavelength light. Because if the underfill has a transmission factor less than 70%/mm for communication wavelength light, the loss of an optical signal is large and the optical signal transmittance may be thus reduced. In addition, it is more desirable that the transmission factor be 90%/mm or more. Incidentally, the underfill may be filled only in portions other than the portions constituting the optical path. In this case, the transmission factor of the underfill is not limited in particular.

The above-described thermosetting resin includes, for example, epoxy resin, phenol resin, polyimide resin, polyester resin, bismaleimide resin, polyolefin resin, polyphenylene ether resin, polyphenylene resin, fluororesin, or the like.

The photosensitive resin includes, for example, acrylic resin, or the like.

Furthermore, the resin in which a photosensitive group is added to part of thermosetting resin, includes, for example, resin obtained by acrylic reaction between the thermoset group of the thermosetting resin and methacrylic acid or acrylic acid, or the like.

Furthermore, the thermoplastic resin includes, for example, phenoxy resin, polyeter sulfone (PES), polysulfone (PSF), polyphenylene sulfone (PPS), polyphenylene sulfide (PPES), polyphenylene ether (PPE), polyeter-imide (PI), or the like.

Furthermore, the underfill may contain particles when the underfill contains particles, the coefficient of thermal expansion can be adjusted by the mixed amount thereof, the coefficient of thermal expansion can be matched between the underfill and the package substrate or the optical element.

A concrete example of such particles includes particles similar to those contained in the optical signal passing regions described above.

Furthermore, when such particles are contained in the underfill, it is desirable that the lower limit of the mixed amount of the particles be 20 weight % and the upper limit thereof be 70 weight %. Because if the mixed amount is generally in this range, it is suitable for matching the coefficient of thermal expansion of the underfill to that of the package substrate or the optical elements, and the underfill has fluidity required at filling.

A more desirable lower limit is 30 weight %, and a more desirable upper limit is 60 weight %.

In the optical communication device according to the embodiment of the fundamental invention, optical path changing members may be provided on the optoelectronic wiring board. In this case, it is desirable that the optical path changing member is provided being fixed to the optical element, or provided via a submount substrate.

Concrete examples of an optical communication device on which the optical path changing members are provided will be described with reference to FIGS. 8A, 8B, 8C, and 9.

Figure 8A:
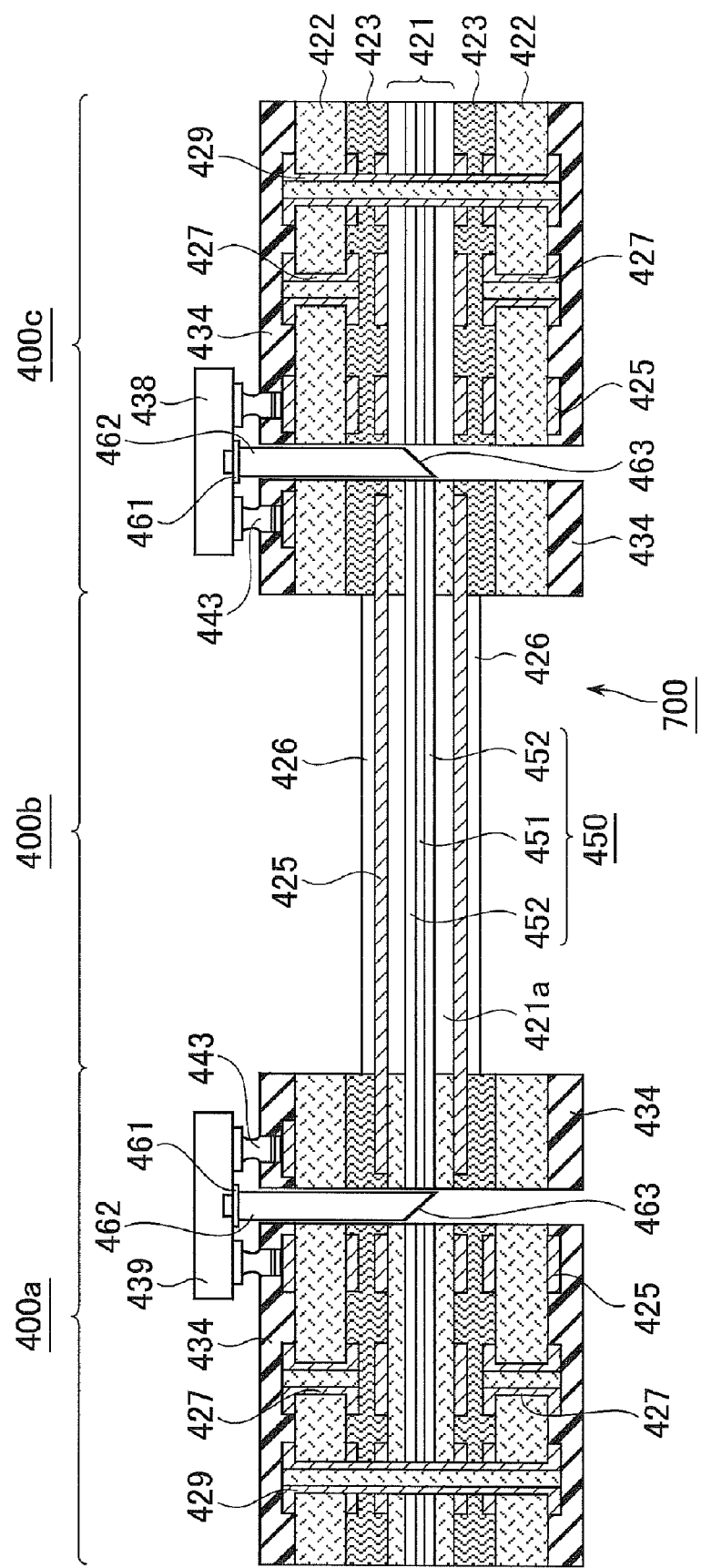
FIG. 8A is a cross-sectional view schematically showing another embodiment of the optical communication device of the fundamental invention.
Figure 8C:
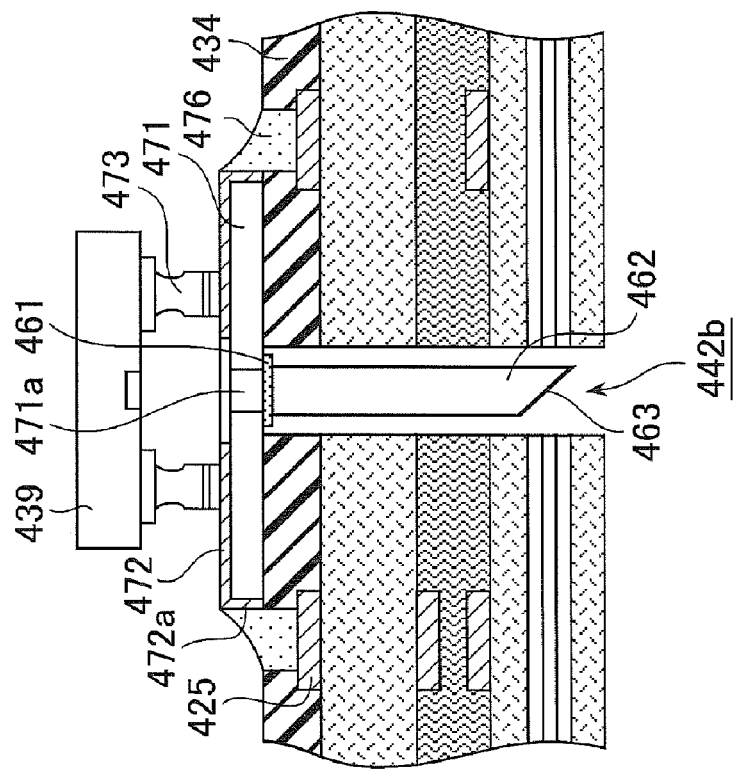
FIG. 8C is a partial cross-sectional view schematically showing another embodiment of the optical communication device of the fundamental invention.
Figure 8B:
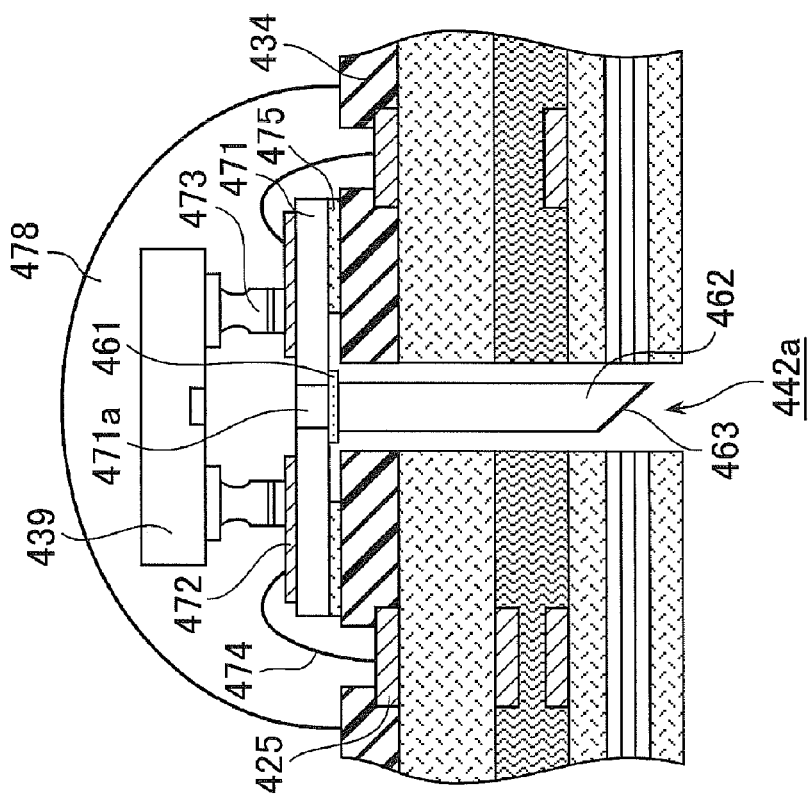
FIG. 8B is a partial cross-sectional view schematically showing another embodiment of the optical communication device of the fundamental invention.

FIG. 8A is a cross-sectional view schematically showing an embodiment of the optical communication device according to the embodiment of the fundamental invention, and FIGS. 8B and 8C are partial cross-sectional views schematically showing an embodiment of the optical communication device according to the embodiment of the fundamental invention.

In the optical communication device 700 shown in FIG. 8A, a light-receiving element 439 and a light-emitting element 438 are mounted on the optical communication device 400 shown in FIG. 5 via solder connecting portions, and optical path changing members 462 are provided.

The optical path changing members 462 are fixed to the optical elements (light-receiving element 439 and light-emitting element 438) via optical adhesive 461 transparent to transmission light. In addition, optical path changing minors 463 are formed on sides opposite to sides fixed to the optical elements of the optical path changing members 462.

The optical communication device 700 is configured such that an optical signal output from the light-emitting element 438 is transmitted to the light-receiving element 439 through an optical signal passing region 442b (optical path changing member 462), an optical waveguide 450, and an optical signal passing region 442a (optical path changing member 462).

Portions of the optical path changing members 462 inserted in the optoelectronic wiring board may be fixed to the wall surfaces of the optical signal passing regions via adhesive.

The materials of the optical path changing members include, for example, those similar to the material of the optical waveguide, or the like as mentioned above. Furthermore, an optical waveguide film or an optical fiber sheet having an optical path changing mirror formed on an end thereof may be used as an optical path changing member.

Furthermore, when the mounted optical elements are multichannel optical elements, the optical path changing members may be sized to be able to change optical paths of optical signals of all channels, or an optical path changing member may be provided for each of the channels.

Furthermore, the optical adhesive includes adhesive similar to the optical adhesive used when a microlens described above is provided, or the like.

Furthermore, when optical path changing member is provided in the optical communication device according to the embodiment of the fundamental invention, it may be provided via submount substrate as shown in FIGS. 8B and 8C.

For example, in an example shown in FIG. 8B, a submount substrate 471 is fixed on a solder resist layer 434 via adhesive 475, and a light-receiving element 439 is mounted on the submount substrate 471 by solder 473 via pads 472 formed on the submount substrate 471. The pads 472 are connected with conductive circuits 425 of the optoelectronic wiring board by bonding wires 474. Furthermore, an optical path throughhole 471a is formed in the submount substrate 471. On the side of the submount substrate 471 opposite to the side on which a light-receiving element 439 is mounted, an optical path changing member 462 on which an optical path changing mirror 463 is formed is fixed via optical adhesive 461.

Furthermore, the submount substrate 471, the light-receiving element 439, and the bonding wires 474 are covered and sealed with resin material 478 transparent to transmission light. As described above, in the optical communication device according to the embodiment of the fundamental invention, an optical path changing member may be provided via a submount substrate.

A portion inserted in the optoelectronic wiring board of the optical path changing member 462 may be fixed to the wall surface of the optical signal passing region via adhesive.

In an example shown in FIG. 8C, a submount substrate 471 is placed on a solder resist layer 434, and a light-receiving element 439 is mounted by solder 473 via pads 472 formed on the submount substrate 471. The pads 472 are extended to sides of the submount substrate 471, and the pads on the sides are connected to conductive circuits 425 of the optoelectronic wiring board by solder 476. The submount substrate itself is also fixed by the solder 476.

Furthermore, an optical path through-hole 471a is formed in the submount substrates 471. On the side of the submount substrate 471 opposite to the side on which a light-receiving element 439 is mounted, an optical path changing member 462 on which an optical path changing mirror 463 is formed, is fixed via optical adhesive 461.

In the embodiment of the fundamental invention, the submount substrate is not limited in particular, and includes, for example, a glass substrate, a ceramic substrate, a resin substrate, or the like.

Although an optical path through-hole is formed in the submount substrate shown in the figure, if the submount substrate itself is transparent to transmission light, this optical path through-hole is not necessary to be formed. Furthermore, the optical path through-hole may be filled with resin composition.

Furthermore, conductivity between the optical element and the optoelectronic wiring board is provided by wire bonding in FIG. 8B or by soldering made on the sides of the submount substrate in FIG. 8C, but may be provided in such a way that a pad which is connected to a pad for mounting the optical element via the through-hole is previously formed on a side of the submount substrate opposite to a side on which the optical element is mounted before the submount substrate is mounted on the optoelectronic wiring board, and then the submount substrate is connected to the optoelectronic wiring board by solder using a soldering technology such as a BGA or a CSP.

Figure 9:
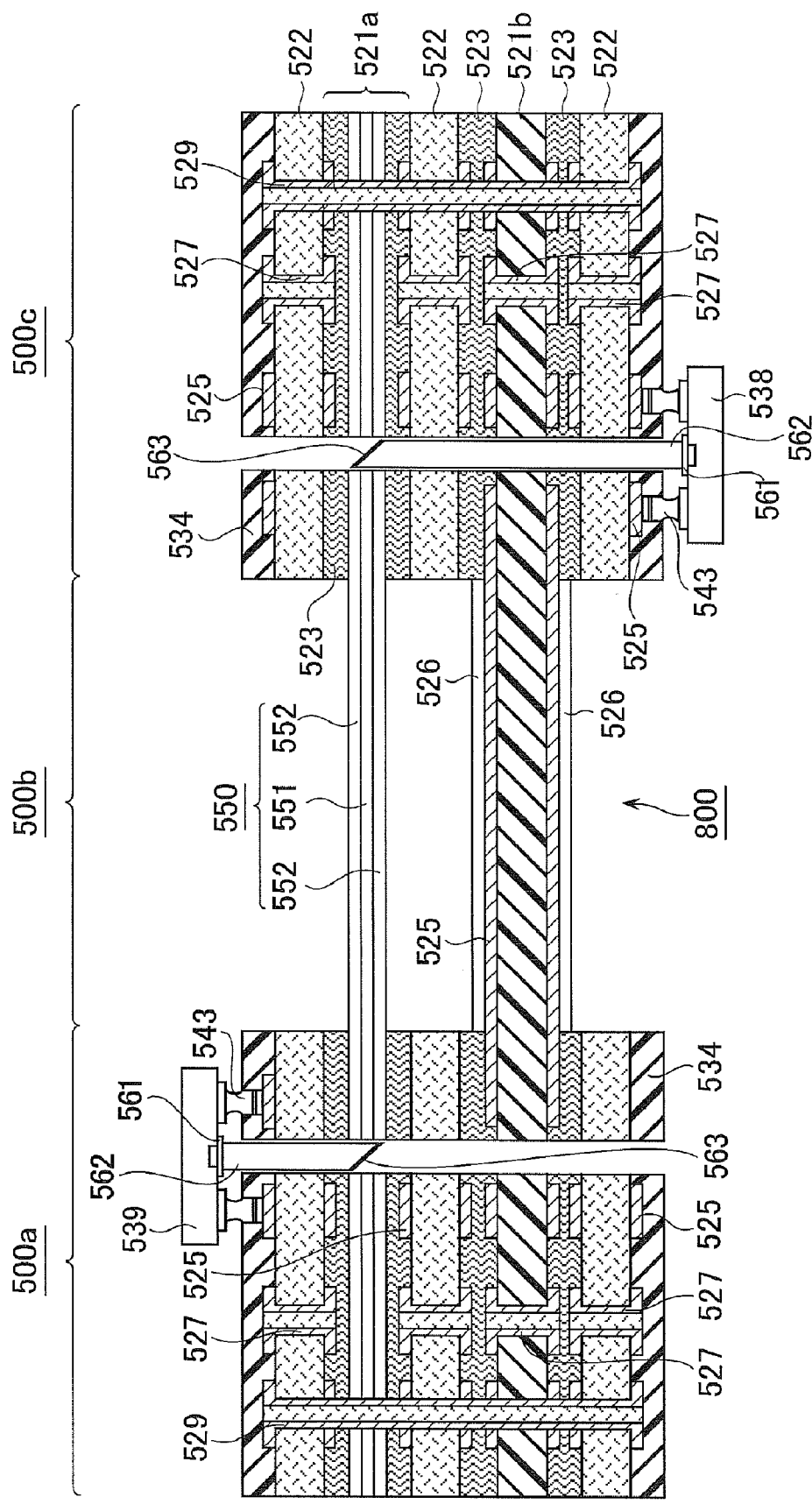
FIG. 9 is a cross-sectional view schematically showing another embodiment of the optical communication device of the fundamental invention.

The optical communication device according to the embodiment of the fundamental invention may be an embodiment as shown in FIG. 9.

FIG. 9 is a cross-sectional view schematically showing an embodiment of the optical communication device according to the embodiment of the fundamental invention.

In the optical communication device 800 shown in FIG. 9, a light-receiving element 539 and a light-emitting element 538 are mounted on the optical communication device 500 shown in FIG. 6 via solder connecting portions, and optical path changing members 562 are provided.

The optical path changing members 562 are fixed to the optical elements (light-receiving element 539 and light-emitting element 538) via optical adhesive 561 transparent to transmission light. In addition, optical path changing minors 563 are formed on sides of the optical path changing members 562 opposite to the sides fixed to the optical elements.

In the optical communication device 800, an optical signal emitted from the light-emitting element 538 is transmitted to the light-receiving element 539 through an optical signal passing region 542b (optical path changing member 562), an optical waveguide 550, and an optical signal passing region 542a (optical path changing member 562).

Portions of the optical path changing members 562 inserted in the optoelectronic wiring board may be fixed to the wall surfaces of the optical signal passing regions via adhesive, or may be fixed by adhesive filling the whole of the optical signal passing regions in which the optical path changing members have been inserted.

An optical communication device having optical path changing members has been depicted in FIGS. 8A to 8C or FIG. 9. An optical path changing member of the optical communication device according to the embodiment of the fundamental invention may be provided, for example, in such a manner that the wall surface of a portion in which the optical path changing member is inserted in the optoelectronic wiring board is also fixed to the wall surface of an optical signal passing region via adhesive, except a manner already described.

However, rather than being provided in such a manner, an optical path changing member is preferably provided so as to be fixed to an optical element or provided via a submount substrate as described above, because when an optical path changing member is provided in such a manner that it is inserted in an optoelectronic wiring board and the wall surface thereof is fixed with adhesive, the optical path changing member needs to be fixed while being aligned by active alignment, but when an optical path changing member is provided being fixed to an optical element or via a submount substrate, it can be aligned by passive alignment, so that it is relatively easy to align the optical axis thereof.

Furthermore, a convex lens or a diffraction grating lens may be formed on the reflecting surface of the optical path changing member, and a convex lens may be provided on a side (a side in optical contact with an optical wiring) of the optical path changing member.

Furthermore, when an optical path changing member is provided in the optical communication device according to the embodiment of the fundamental invention, the optical path changing member may be fixed to an optical signal passing region of the package substrate described above.

Next, the features according to the embodiment of the present invention will be described in detail.

In the embodiment of the fundamental invention described above, an optical wiring substrate and optical communication devices are manufactured by an existing printed substrate process. However, such a printed substrate process is almost a plane process, and it is very difficult to make an optical path changing mirror having a 45-degree surface (see FIG. 7, for example) which satisfies the positional accuracy, the mirror evenness, the mirror angle accuracy, and the possibility of forming a selective reflecting metal surface by an existing printed substrate process.

Furthermore, also in a method of making a component having a 45-degree surface mirror (for example, an optical path changing portion 462) and inserting the component in a hole of a substrate as shown in FIG. 8B or 8C, it is very difficult at the present time to insert the component in the hole and fixing it to the hole while keeping a positional accuracy of several tens of μm or less. Even if such a technique becomes available, it is a piece-by-piece technique but does not allow a batch technique, which provides no mass productivity causing increase in cost.

For this reason, the optoelectronic wiring board according to the embodiment of the present invention is configured as follows.

The optoelectronic wiring board according to the embodiment of the present invention includes: a rigid section in which a laminate of a conductive circuit and an insulating layer is formed on both sides of a substrate; a flexible flex section; a flex rigid substrate section provided with an electric wiring; and an optical waveguide having an end face substantially perpendicular to an optical path, the end face being arranged facing an optical element mounting region provided on the rigid section, and the optical waveguide which bends together with the flex section is fixed on the rigid section.

Furthermore, the optoelectronic wiring board according to the embodiment of the present invention is characterized in that a condenser lens is provided on an end face of the optical waveguide, in the above discussed embodiment of the invention.

According to the optoelectronic wiring board according to the embodiment of the present invention having such a configuration, the optical wiring bending together with the flex section is fixed on the rigid section and the conductive circuit is formed in the rigid section, so that, like the above-mentioned embodiment of the fundamental invention, a conductive circuit can be formed in a portion where so high-speed transmission is not required and an electric wiring is sufficient, while only a line which needs high-speed transmission can be an optical wiring. As a result, considerable increase in amount of information to be processed and increase in speed of information processing can be achieved without increasing the size of the wiring board.

In addition, according to the optoelectronic wiring board according to the embodiment of the present invention, the optical wiring having an end face substantially perpendicular to an optical path is fixed on the rigid section and the end face thereof is arranged facing the optical element mounting region on the rigid section so that the end face of the optical wiring can be optically coupled with the optical element directly without using an optical path changer.

As a result, the configuration of the flex rigid substrate section which is a main portion can be simplified, so that the optoelectronic wiring board can be manufactured at low cost by forming the flex rigid substrate section using an existing plane process and combining it with the optical wiring. If the optical wiring is an optical waveguide, the process becomes easier.

Furthermore, in the embodiment of the present invention, when a condenser lens is provided on the end face of the optical wiring, an optical signal can be transmitted to a desired region with more reliability, and the requirement for accuracies of mounting positions of optical elements such as a light-emitting element and a light-receiving element can be thus mitigated, and thus, the cost of mounting components can be reduced.

Preferred embodiments of the optoelectronic wiring board according to the embodiment of the present invention will be described below with reference to the figures. However, the present invention is not limited to the embodiments shown in the figures. In this connection, concrete examples using an optical waveguide as an optical wiring will be described below.

FIG. 10A is a cross-sectional view schematically showing an embodiment of the optoelectronic wiring board of the present invention.

As shown in FIG. 10A, similar to the above-mentioned embodiment of the fundamental invention, an optoelectronic wiring board 1 of this embodiment is composed of a pair of rigid sections 50a and 50c and a flex section 50b integrated with each other, having a flex rigid substrate section 2 and an optical waveguide 34.

The flex rigid substrate section 2 has a common flexible substrate 10 in which a conductive circuit 4 and a cover lay 5 are formed in this order on a base film 10a.

Furthermore, a pair of rigid substrate sections 1a and 1c is laminated in regions at both ends of the flexible substrate 10, and thereby the rigid substrate sections 1a and 1c and the flexible substrate 10 are integrated with each other.

The rigid substrate sections 1a and 1c are constituted by multilayer wiring substrates in which insulating layers and conductive circuits (for example, insulating layers 6 and 11 and conductive circuits 9) are laminated on both sides of the flexible substrate 10. In the outmost layers of the multilayer wiring substrates, conductive circuits 17 and 18 are formed.

These conductive circuits 17 and 18 are connected with each other via through-hole sections 22. Each of the through-hole sections 22 is filled with resin composition 23 made of resin similar to that of the embodiment of the fundamental invention described above.

Solder resist layers 19 and 20 are formed in predetermined regions of the outermost layers of the rigid substrate sections 1a and 1c.

In the case of this embodiment, a connection terminal portion 17a on the outermost layer at one side of each of the rigid substrate sections 1a and 1c are exposed. In this region optical element mounting regions 2a and 2c are formed.

In addition, according to the embodiment of the present invention, the optical waveguide 34 is fixed on each of the rigid substrate sections 1a and 1c.

In the case of this embodiment, the optical waveguide 34 is glued and fixed on solder resist 19 on at least one side, particularly a side on which an optical element mounting region 2a, 2c is provided, of each of the rigid substrate sections 1a and 1c by pressing the optical waveguide 34 with adhesive prepreg 21 between the solder resist 19 and the optical waveguide 34.

FIG. 10B is a cross-sectional view schematically showing another embodiment of the optoelectronic wiring board according to the embodiment of the present invention. This embodiment has the same structure as that in FIG. 10A except that the flexible substrate 10 is disposed with partially interposed prepreg 6a at the flexible substrate side of the rigid substrate section 1a, 1c.

The optical waveguide 34 used in the embodiment of the present invention has a basic configuration similar to that of the embodiment of the fundamental invention described above, and includes film-like upper and lower clad layers 31 and 33, and a core layer 32, and these layers are flexible. Because of this, the optical waveguide 34 bends together with the flexible substrate 10 in the flex section 50b.

On the other hand, in the embodiment of the present invention, the optical waveguide 34 is not provided with any optical path changer such as a mirror for changing an optical path, and is configured such that optical signals are input and output from both end faces (for example, light-emitting side end face 35a, light-receiving side end face 35c) thereof.

Specifically, both end faces 35a and 35c of the optical waveguide 34 are formed so as to be substantially perpendicular to the optical path of transmitting light.

Both end portions of the optical waveguide 34 are disposed and fixed on the rigid substrate sections 1a and 1c, respectively, so that both end faces 35a and 35c of the optical waveguide 34 face the optical element mounting regions 2a and 2c on the rigid sections 50a and 50c, respectively.

In the embodiment of the present invention, it is desirable but not limited in particular that the optical waveguide 34 is fixed in such a manner that the end faces 35 of the optical waveguide 34 are substantially perpendicular to the substrate surface direction of the rigid substrate sections 1a and 1c, that is, in such a manner that light is input and output in parallel with the substrate surface direction of the rigid substrate sections 1a and 1c, in view of accuracy of input and output of light from and to optical elements, and easiness of manufacture.

Figure 11:
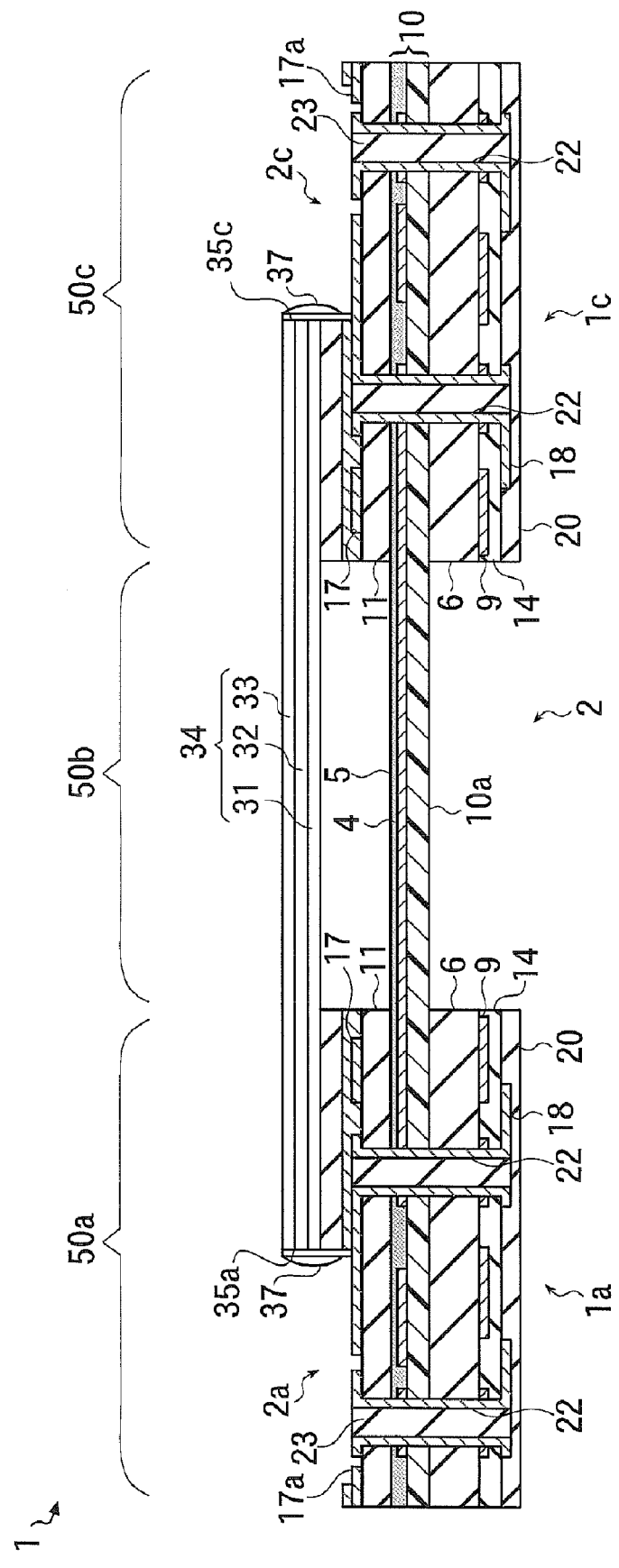
FIG. 11 is a cross-sectional view schematically showing another embodiment of the optoelectronic wiring board of the present invention.

FIG. 11 is a cross-sectional view schematically showing another embodiment of the optoelectronic wiring board according to the embodiment of the present invention.

In the embodiment of the present invention, as shown in FIG. 11, a condenser lens 37 may be provided on each of the end faces 35 of the optical waveguide 34. The condenser lens 37 may be provided on each of the end faces 35a and 35c of the optical waveguide 34, or only on either of them.

As such a condenser lens 37, a microlens described above may be used. In this case, the microlens can be provided directly on the end face 35 of the optical waveguide 34 or via optical adhesive.

Next, the optical communication device and the method of manufacturing the same according to the embodiment of the present invention will be described.

In this specification, the optical communication device is assumed that an optoelectronic wiring board on which optical elements are mounted is mounted on another board such as a mother board, a daughter board, a backplane board, or the like. The optoelectronic wiring board may be mounted on another board by any method such as solder ball mounting, soldering, wire bonding, lead frame mounting, TAB mounting, socket mounting, or the like.

In this connection, concrete figure and description of mounting the optoelectronic wiring board on another board will be omitted.

The optical communication device according to the embodiment of the present invention includes: a rigid section in which a laminate of a conductive circuit and an insulating layer is formed on both sides of a substrate; a flexible flex section; an optical element; a flex rigid substrate section provided with an electric wiring; and an optical waveguide having an end face substantially perpendicular to an optical path, the end face being arranged facing an optical element mounting region provided on the rigid section, and the optical waveguide that bends together with the flex section, being fixed on the rigid section.

Furthermore, the optical communication device according to the embodiment of the present invention is characterized in that a condenser lens is provided on the end face of the optical wiring, in the above embodiment of the invention.

Furthermore, the optical communication device according to the embodiment of the present invention is characterized in that the optical element is mounted on a submount substrate which is mounted on the rigid section in a standing state, and the optical functional portion of the optical element is optically coupled with the end face of the optical waveguide, in the above embodiment of the invention.

According to the optical communication device according to the embodiment of the present invention having such a configuration, the optical wiring bending together with the flex section is fixed on the rigid section and the conductive circuit is formed in the rigid section, so that, like the embodiment of the fundamental invention, a conductive circuit can be formed in a portion where so high-speed transmission is not required and an electric wiring is sufficient, while only a line which needs high-speed transmission can be an optical wiring. As a result, considerable increase in amount of information to be processed and increase in speed of information processing can be achieved without increasing the size of the wiring board.

In addition, according to the optical communication device according to the embodiment of the present invention, the optical wiring having an end face substantially perpendicular to an optical path is fixed on the rigid section and the end face thereof is arranged facing the optical element mounting region on the rigid section, so that the end face of the optical wiring can be optically coupled with the optical element directly without using an optical path changer.

As a result, the configuration of the flex rigid substrate section which is a main portion can be simplified, so that the optoelectronic wiring board can be manufactured at low cost by forming the flex rigid substrate section using an existing plane process and combining it with the optical wiring. When the optical wiring is an optical waveguide, the optical communication device can be manufactured easily at lower cost.

In addition, in the embodiment of the present invention, if a condenser lens is provided on the end face of the optical wiring, an optical signal can be transmitted to a desired region with more reliability, and the requirement for accuracies of mounting positions of optical elements such as a light-emitting element and a light-receiving element can be thus mitigated, so that the cost of mounting components can be reduced.

In addition, in the embodiment of the present invention, when the optical element is mounted on a submount substrate which is mounted on the rigid section in a standing state, and the optical functional portion of the optical element is optically coupled with the end face of the optical wiring, the requirement for accuracies of mounting positions of optical elements such as a light-emitting element and a light-receiving element can be mitigated, so that the cost of mounting components can be reduced. When the optical wiring is an optical waveguide, the accuracies of mounting positions can be matched more easily.

FIGS. 12A and 12B show the configuration of an embodiment of the optical communication device of the present invention.

An optical communication device 1A shown in FIG. 12A is configured using the optoelectronic wiring board 1 described above. Hereinafter, corresponding portions will be attached with common reference numerals, and detail description thereof will be omitted.

In the optical communication device 1A of this embodiment, optical elements are respectively mounted on the optical element mounting regions 2a and 2c on the rigid sections 50a and 50c of the optoelectronic wiring board 1 described above.

In the embodiment of the present invention, the optical elements include optical elements such as a light-receiving element and a light-emitting element described above.

In particular, in the embodiment shown in FIG. 12A, a light-emitting element (for example, a VCSEL, a PD, or the like) 41a mounted on a submount substrate 40 is provided in the optical element mounting region 2a of one rigid section 50a.

Here, the submount substrate 40 is mounted on a rigid section 50a in a standing state, and the optical functional portion (not shown) of the light-emitting element 41a is arranged facing the end face 35a of the optical waveguide 34. Because of this, the optical functional portion of the light-emitting element 41a and the end face 35a of the optical waveguide 34 will be optically coupled with each other.

Furthermore, on the optical element mounting region 2a, a first electronic component (for example, a driving IC chip) 43a mounted on the substrate by wire bonding 49 is connected with the light-emitting element 41a through bonding wires 44 and 42.

A portion including the light-emitting element 41a, the first electronic component 43a, and the end face 35a of the optical waveguide 34 is sealed by a sealing portion 45 made of sealing resin transparent to transmission light.

In addition, in this embodiment, a light-receiving element 41c mounted on a submount substrate 40 is provided in the optical element mounting region 2c of the other rigid section 50c.

The light-receiving element 41c is mounted on the rigid section 50c in a state that the submount substrate 40 stands up, and the optical functional portion (not shown) of the light-receiving element 41c is arranged facing the end face 35c of the optical waveguide 34. Because of this, the optical functional portion of the light-receiving element 41c and the end face 35c of the optical waveguide 34 will be optically coupled with each other.

Furthermore, on the optical element mounting region 2c, a second electronic component (for example, an amplifying IC chip) 43c mounted on the substrate by wire bonding 49 is connected with the light-receiving element 41c through bonding wires 44 and 42.

A portion including the light-receiving element 41c, the second electronic component 43c, and the end face 35c of the optical waveguide 34 is sealed by a sealing portion 45 transparent to transmission light.

FIG. 12B is a cross-sectional view schematically showing another embodiment of the optical communication device according to the embodiment of the present invention.

Also in the optical communication device according to the embodiment of the present invention, as shown in FIG. 12B, a condenser lens 37 may be provided on each of the end faces 35 of the optical waveguide 34. In this case, the condenser lens 37 may be provided on each of the end faces 35a and 35c of the optical waveguide 34, or only on either of them.

As such a condenser lens 37, the microlens described above may be used. In this case, the microlens may be provided on an end face 35 of the optical waveguide 34 directly or via optical adhesive.

Figure 13:
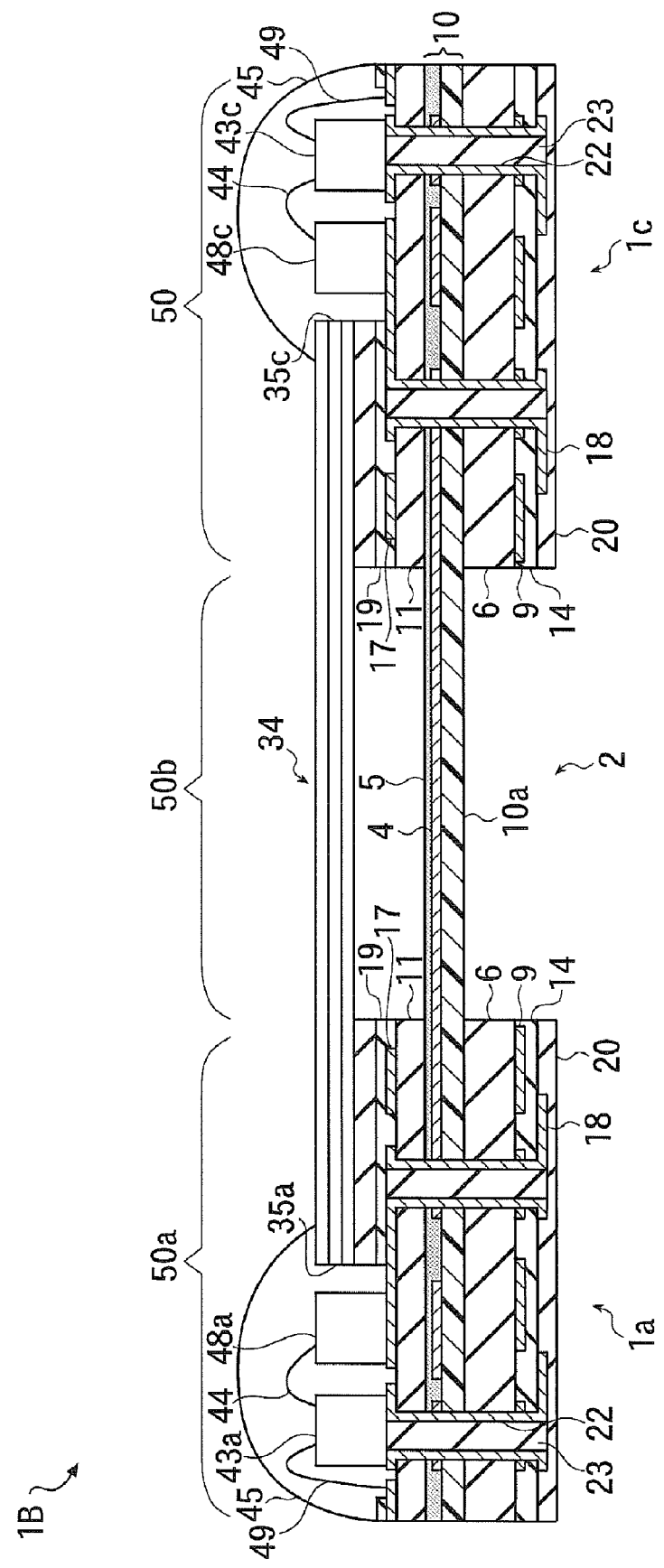
FIG. 13 is a cross-sectional view schematically showing another embodiment of the optical communication device of the present invention.

FIG. 13 is a cross-sectional view schematically showing another embodiment of the optical communication device according to the embodiment of the present invention.

In an optical communication device 1B of this embodiment shown in FIG. 13, a light-emitting element (for example, an end face light-emitting element, a waveguide type PD, or the like) 48a is directly mounted on the optical element mounting region 2a of one rigid section 50a, and the optical functional portion (not shown) thereof is arranged facing the end face 35c of the optical waveguide 34. Because of this, the optical functional portion of the light-emitting element 48a and the end face 35a of the optical waveguide 34 are optically coupled with each other.

Furthermore, on the optical element mounting region 2a, a first electronic component (for example, a driving IC chip) 43a mounted on the substrate by wire bonding 49 is connected with the light-emitting element 48a through a bonding wire 44.

A light-receiving element 48c is directly mounted on the optical element mounting region 2c of the other of the rigid sections 50c, and the optical functional portion (not shown) of the light-receiving element 48c faces the end face 35c of the optical waveguide 34. Because of this, the optical functional portion of the light-receiving element 48c and the end face 35a of the optical waveguide 34 is optically coupled.

Furthermore, on the optical element mounting region 2c, a second electronic component (for example, an amplifying IC chip) 43c mounted on the substrate by wire bonding 49 is connected with the light-receiving element 48c through a bonding wire 44.

Next, examples of a method of manufacturing the optoelectronic wiring board and optical communication device according to the embodiment of the present invention will be described.

FIGS. 14 to 19 are process diagrams showing an example of a method of manufacturing the optoelectronic wiring board according to the embodiment of the present invention.

Figure 14A:
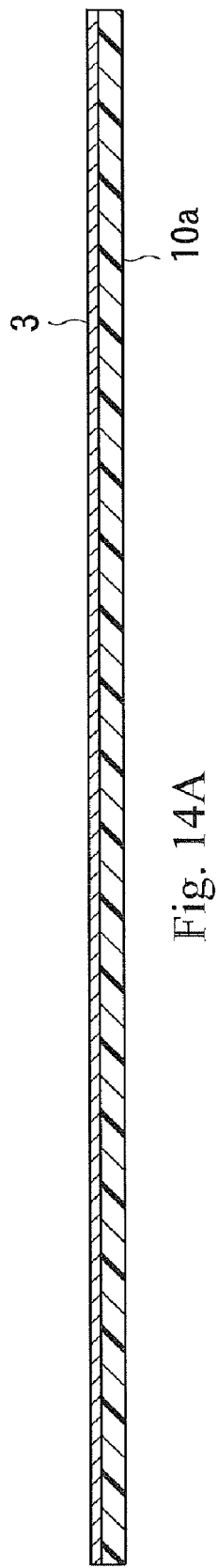
FIGS. 14A to 14C are process diagrams (1) showing an example of a method for manufacturing the optoelectronic wiring board according to an embodiment of the present invention.

In this example, as shown in FIG. 14A, a flexible substrate in which a copper foil 3 is laminated on one side of a flexible base film 10a is prepared.

As the base film 10a, a base film similar to that of the embodiment of the fundamental invention described above may be used. For example, an epoxy resin substrate or a substrate made of bismaleimide-triazine (BT) resin may be used.

Furthermore, as the base film 10a, a base film made of liquid crystal polymer may also be used. The film made of liquid crystal polymer has a high strength and a low expansion coefficient, and is thus suitable for high-speed electric transmission.

Figure 14B:
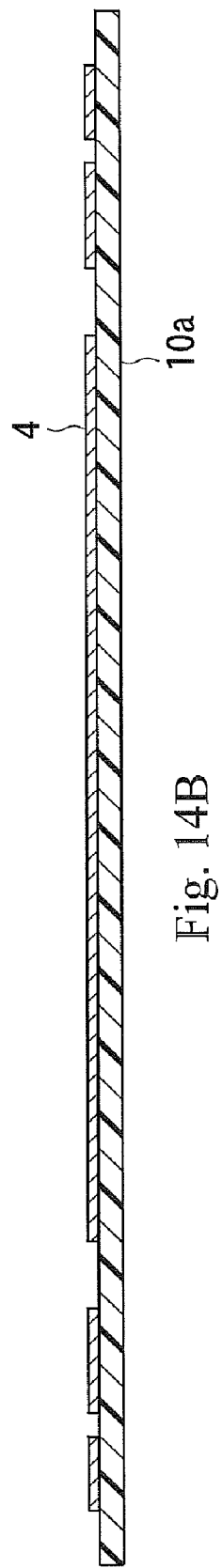

Next, as shown in FIG. 14B, conductive circuits 4 are formed on one side of the base film 10a by forming a resist which is not shown in the figure and etching it using a publicly known photolithography method.

Figure 14C:
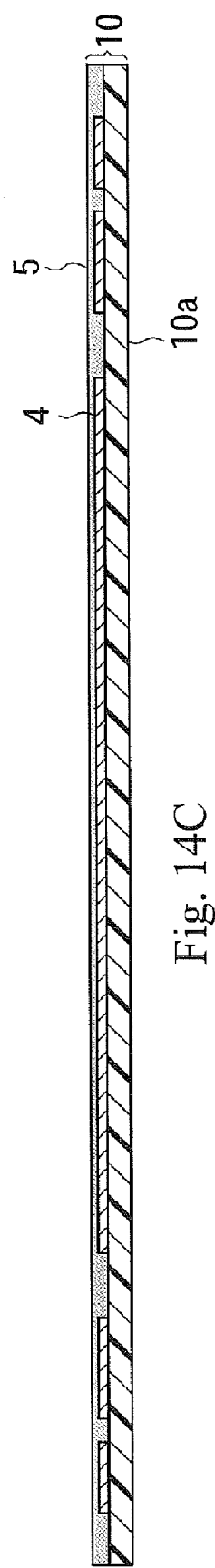

Next, as shown in FIG. 14C, a cover lay 5 for protection is adhered on the whole of the conductive circuit 4 side surface of the substrate to obtain an intended flexible substrate 10.

Figure 15A:
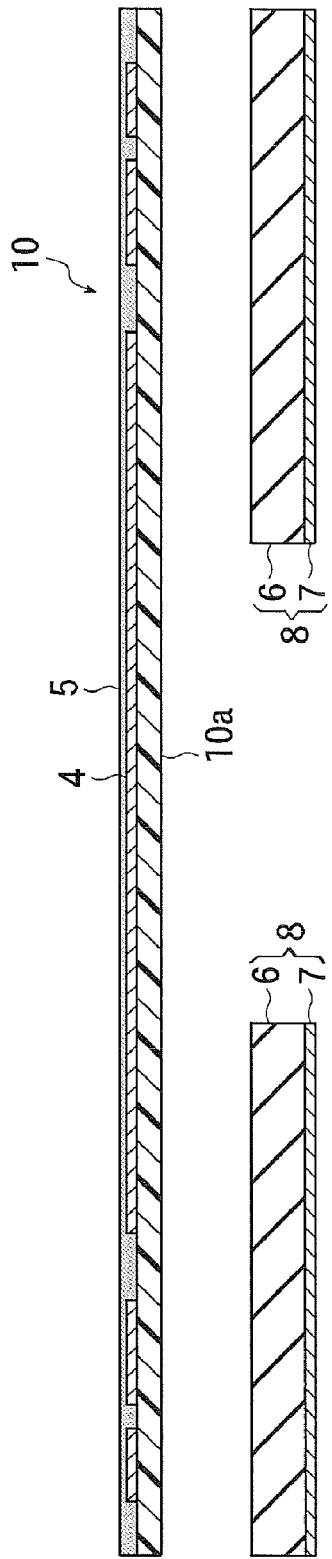
FIGS. 15A to 15C are process diagrams (2) showing an example of a method for manufacturing the optoelectronic wiring board according to an embodiment of the present invention.

Next, as shown in FIG. 15A, rigid substrates 8 corresponding to the sizes of the rigid sections 50a and 50c, respectively, are prepared by performing router processing for an adhesive film with a copper foil in which the copper foil 7 is laminated on one side of prepreg 6.

Figure 15B:
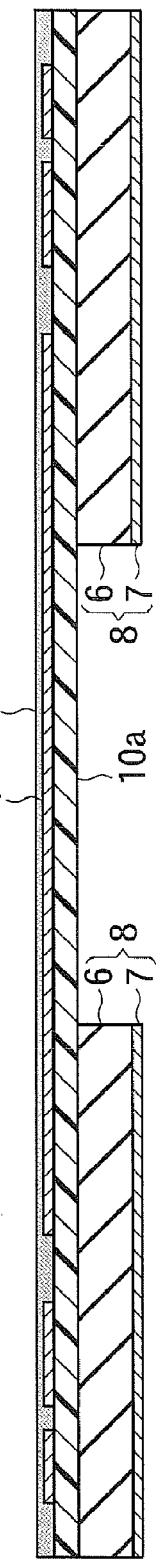

Next, as shown in FIG. 15B, each rigid substrate 8 is opposed to the base film 10a of the flexible substrate 10 and are aligned with the flexible substrate 10 using, for example, alignment marks. After that, they are pressed by applying heat and pressure in order to integrate them.

At that time, they are laminated while being aligned in predetermined positions by a pin lamination method or a mass lamination method and are integrated by being pressed. When they are laminated by a pin lamination method, guide holes are previously provided in each of the members.

Figure 15C:
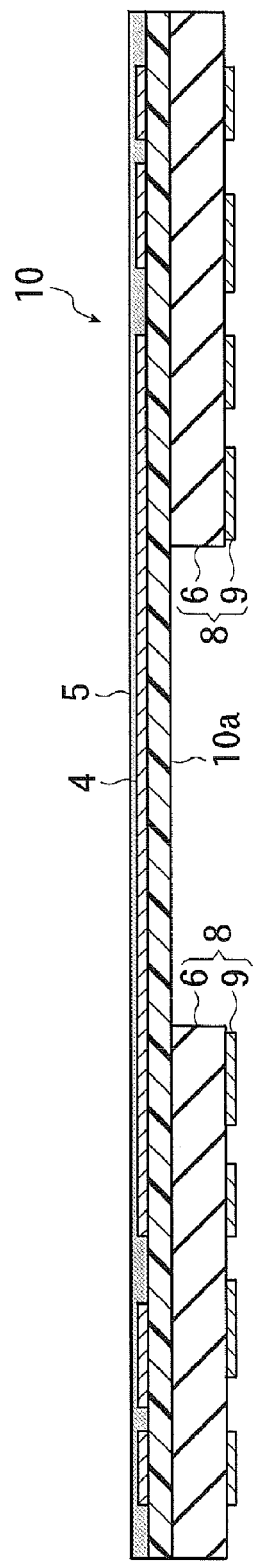

Then, conductive circuits 9 are formed on the rigid substrates 8 as shown in FIG. 15C by forming resist which is not shown in the figure on the copper foils 7 of the rigid substrates 8 and etching them.

On the other hand, as shown in FIG. 16A, a adhesive film having a copper foil in which a copper foil 12 is laminated to one side of a prepreg 11, and an adhesive film with a copper foil in which a copper foil 15 is laminated to one side of a prepreg 14 are prepared. Then, router processing is performed for these films to prepare rigid substrates 13 and 16 corresponding to the sizes of the rigid sections 50a and 50c.

Then, as shown in FIG. 16B, the rigid substrates 13 and the rigid substrates 16 are opposed to the cover lay 5 of the flexible substrate 10 and the rigid substrates 8, respectively, from both sides of the flexible substrate 10, and are aligned with the flexible substrate 10. After that, they are pressed to be integrated.

Next, as shown in FIG. 16C, through-hole sections 22 penetrating the whole of the rigid substrate sections 1a and 1c are formed.

In this case, through-holes (not shown) penetrating the whole of the rigid substrate sections 1a and 1c are formed by, for example, drill processing, and to the wall surfaces of the through-holes, treatment by permanganic acid solution and desmear treatment such as plasma treatment, corona treatment, or the like, for example, are given.

After that, electroless copper plating and electrolytic copper plating are given to the inner walls of the through-holes to form conductive layers.

Next, blackening treatment of the inner walls of the through-holes is performed using predetermined blackening treatment liquid. After that, resin composition 23 described above is filled inside the through-holes, and the copper foils 12 and 15 of the outermost layers of the rigid substrate sections 1a and 1c are polished.

After that, resist not shown in the figure is formed on the copper foils 12 and 15 of the outermost layers of the rigid substrate sections 1a and 1c, and then, etching is performed to form conductive circuits 17 and 18 on the outermost layers of each of the rigid substrate sections 1a and 1c as shown in FIG. 17A.

In addition, as shown in FIG. 17B, solder resist layers 19 and 20 are formed in predetermined regions of the outermost layers of the rigid substrate sections 1a and 1c.

The solder resist layers 19 and 20 can be formed in such a way that uncured solder resist composition is applied and then curing treatment is given, or films made of the same uncured solder resist composition are adhered by pressure and then curing treatment is given as necessary.

By such treatment, a connection terminal portion 17a on the outermost layer on one side of each of the rigid substrate sections 1a and 1c is exposed. As a result, flex rigid substrate sections 2 in which optical element mounting regions 2a and 2c are formed in these regions are obtained.

On the other hand, in the embodiment the present invention, an optical waveguide can be formed by an ordinary method.

That is, an optical waveguide is formed on a base substrate such as a glass substrate by below-mentioned methods, and then an optical waveguide film can be formed by peeling the optical waveguide by immersion in 3% hydrofluoric acid solution or the like.

Specifically, a method using reactive ion etching, an exposure and development method, a metal mold forming method, a resist forming method, a combination thereof, or the like may be used.

The method using reactive ion etching is able to form an optical waveguide having excellent size reliability, and is also excellent for reproducibility.

The exposure and development method can be suitably used when mass-producing an optical waveguide because of a small number of processes, and does not easily generate a stress on an optical waveguide because of a small number of heating processes.

The metal mold forming method can be suitably used when mass-producing an optical waveguide, is able to form an optical waveguide excellent in size reliability, and is also excellent in reproducibility.

The resist forming method can be suitably used when mass-producing an optical waveguide and is able to form an optical waveguide excellent in size reliability. This method is also excellent in reproducibility.

An optical waveguide may be formed by a photobleaching method, for example, which prepares, only clad purpose resin composition and forms a core by changing the refractive index of the clad purpose resin composition by a single-pulse laser such as a femtosecond laser or exposure.

FIGS. 18A to 18D show an example of the manufacturing process of an optical waveguide according to the embodiment of the present invention.

Figure 18A:
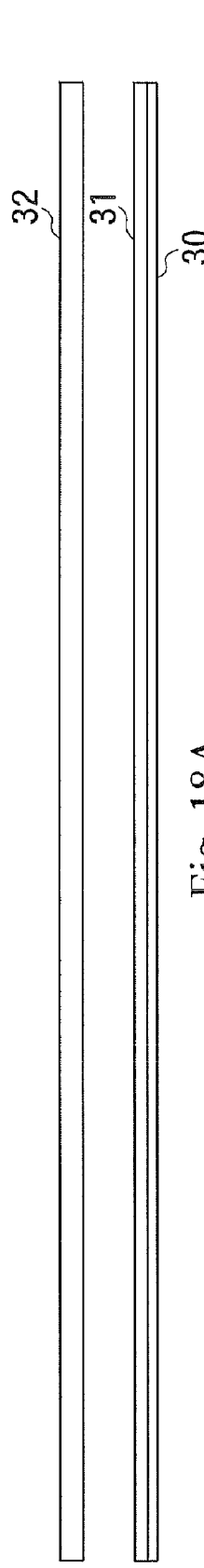
FIGS. 18A to 18D are process diagrams (5) showing an example of a method for manufacturing the optoelectronic wiring board according to an embodiment of the present invention.
Figure 18B:
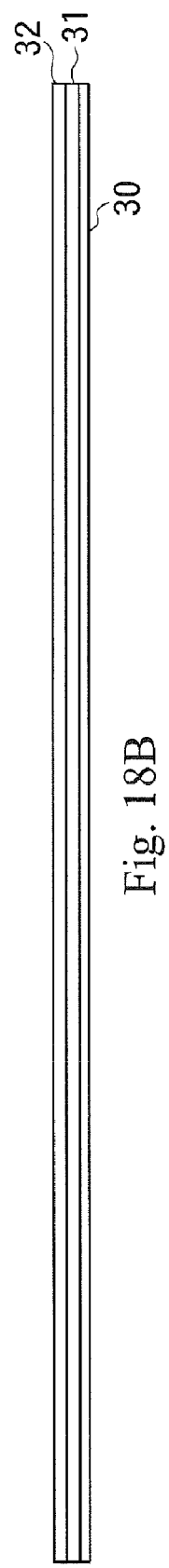

In this process, at first, a dry film for a lower clad layer 31 is provided on a substrate 30 capable of being peeled as shown in FIG. 18A, and a dry film for a core layer 32 is laminated on the dry film as shown in FIG. 18B.

Figure 18C:
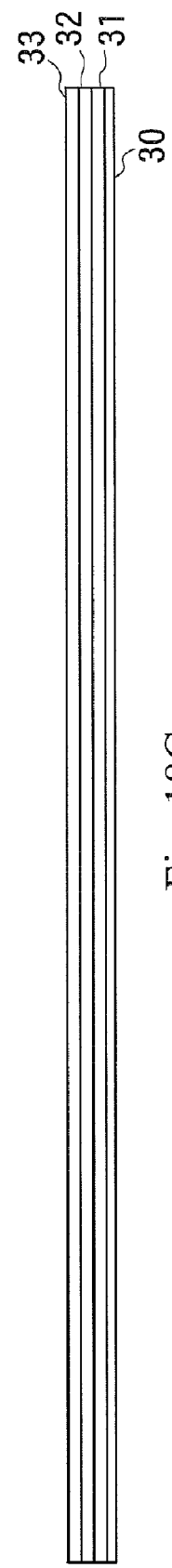

Furthermore, a dry film for an upper clad layer 33 is laminated on the film as shown in FIG. 18C.

Figure 18D:
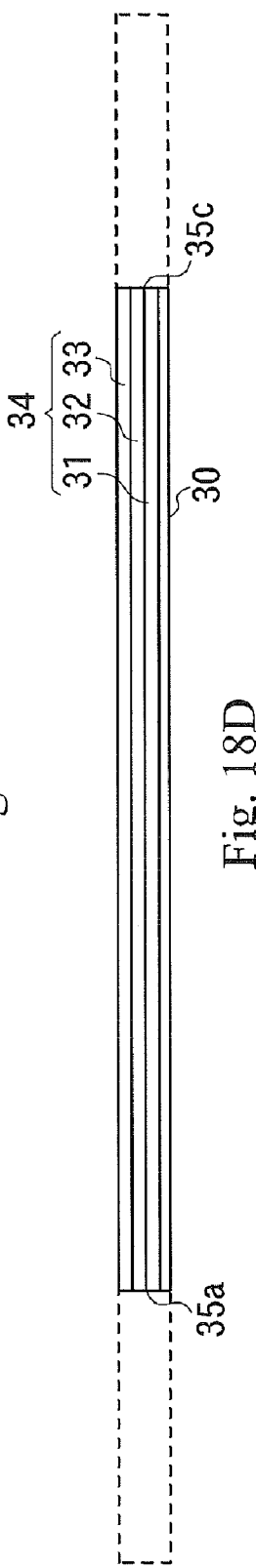

Router processing is performed for an optical waveguide formed like this to obtain an optical waveguide 34 having predetermined length as shown in FIG. 18D. On both ends thereof, end faces 35 (35a, 35c) which are substantially perpendicular to an optical path are formed.

After that, prepregs 21 formed in a predetermined size by router processing are prepared as shown in FIG. 19A, and the optical waveguide 34 is aligned together with the prepregs 21 onto the solder resist layers 19 of the rigid substrate sections 1a and 1c, and these are pressed to be integrated.

Thereby, an intended optoelectronic wiring board 1 is obtained.

FIGS. 20A and 20B are process diagrams showing an example of a manufacturing process of the optical communication device according to the embodiment of the present invention.

The optical communication device according to the embodiment of the present invention is obtained by mounting optical elements on the optical element mounting regions 2a and 2c on the rigid sections 50a and 50c of the above-described optoelectronic wiring board 1, respectively.

For example, when an embodiment shown in FIG. 20A is taken as an example, in the optical element mounting region 2a of one rigid substrate section 1a, a submount substrate 40 on which a light-emitting element 41a is provided is mounted on the rigid section 50a in a standing state so that the optical functional portion of the light-emitting element 41a is arranged facing the end face 35a of the optical waveguide 34.

Furthermore, a first electronic component 43a is mounted on the optical element mounting region 2a. The first electronic component 43a is connected to the connection terminal portion 17a by wire bonding 49, and is connected to the light-emitting element 41a through bonding wires 44 and 42.

In the optical element mounting region 2c of the other rigid section 50c, a submount substrate 40 on which a light-receiving element 41c is provided is mounted on the rigid substrate section 1c in a standing state so that the optical functional portion of the light-receiving element 41c is arranged facing the end face 35c of the optical waveguide 34.

Furthermore, a second electronic component 43c is mounted on the optical element mounting region 2c. The second electronic component 43c is connected to the connection terminal portion 17c by wire bonding 49, and is connected to the light-receiving element 41c through wire bondings 44 and 42.

After that, as shown in FIG. 20B, a portion including the light-emitting element 41a, the first electronic component 43a, and the end face 35a of the optical waveguide 34 is sealed by sealing resin (sealing portion 45) transparent to transmission light, and a portion including the light-receiving element 41c, the second electronic component 43c, and the end face 35c of the optical waveguide 34 is similarly sealed by sealing resin (sealing portion 45) transparent to transmission light.

As a result, an intended optical communication device 1A is obtained.

Figure 21:
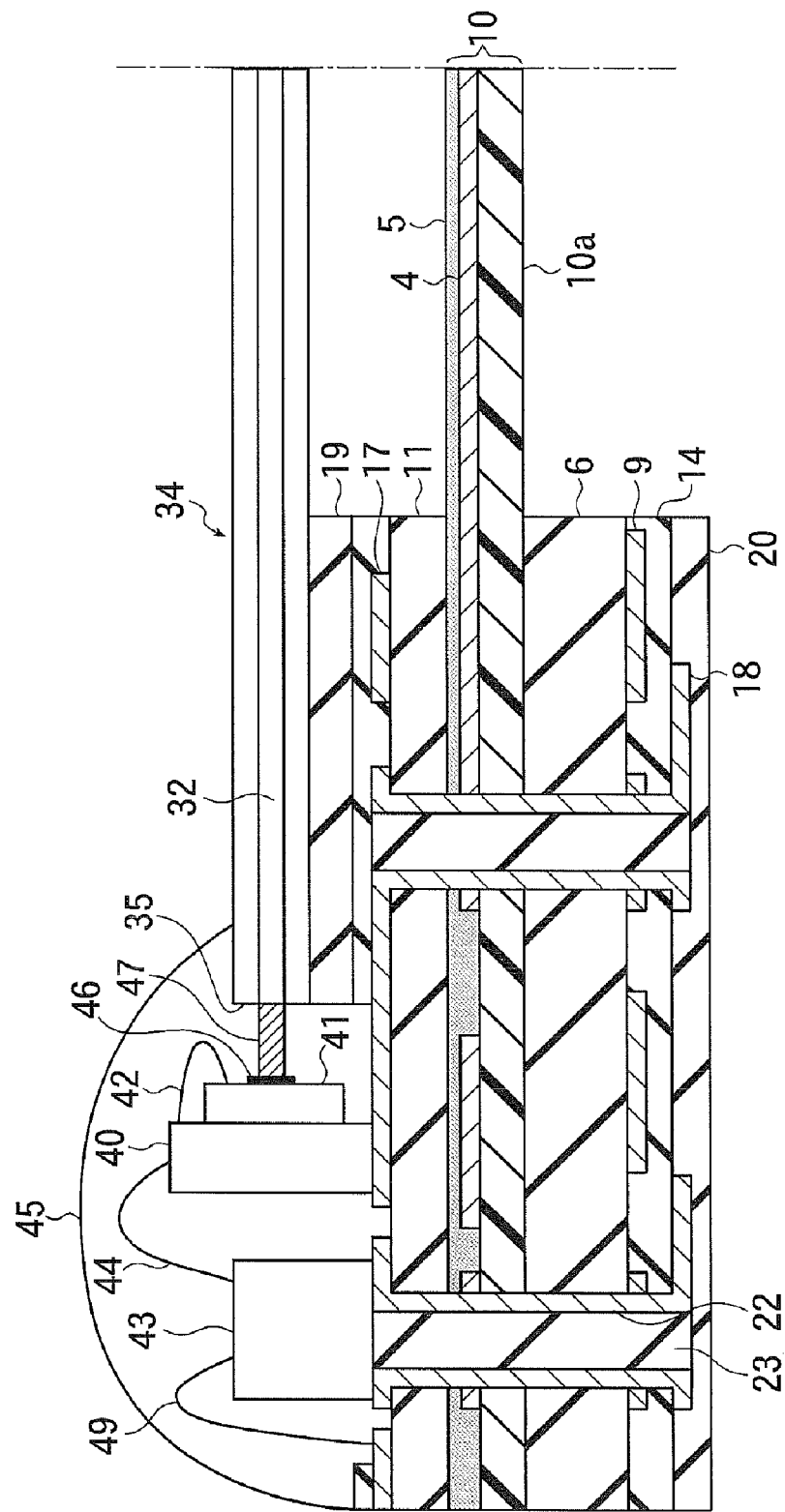
FIG. 21 is an enlarged cross-sectional view showing the main part of still another embodiment of the present invention.

FIG. 21 is an enlarged cross-sectional view showing the main part of still another embodiment of the optical communication device according to the embodiment of the present invention.

As shown in FIG. 21, in this embodiment, a coupling optical waveguide 47 is provided between the end face 35 of the optical waveguide 34 and the optical functional portion 46 of the optical element 41, and the optical waveguide 34 is optically coupled with the optical element 41 through the coupling optical waveguide 47.

The coupling optical waveguide 47 serves as a core layer, and the sealing portion 45 serves as a clad layer. For this reason, it is preferable that the refractive index of the coupling optical waveguide 47 be larger than that of the sealing portion 45. According to such a configuration, at optical transmission, light can be trapped in the core layer so as not to leak to the sealing resin side, so that the light propagation loss can be reduced.

The coupling optical waveguide 47 is an optical waveguide provided in close contact with the end face 35 of the core layer 32 of the optical waveguide 34 and the optical functional portion 46 of the optical element 41, and can use a self-formed optical waveguide obtained by, for example, a method described in Japanese Patent Application Laid-open No. 2003-14972.

A formation principle of this self-formed optical waveguide is to arrange photosensitive resin so as to wrap the tip of the light-outgoing portion of an optical wiring (or light-emitting element), and a core layer corresponding to an optical path is formed by irradiating light to the photosensitive resin through the optical wiring (or light-emitting element), thereby obtaining an optical waveguide.

In the embodiment of the present invention, the coupling optical waveguide can be formed by this self-formation method when the optical elements and the like and the optical waveguide are sealed with resin.

Specifically, the coupling optical waveguide is formed by, for example, mixing photosensitive resin for self core formation in the sealing resin and irradiating light to resin between the core end face of an optical wave guide and the optical functional portion of an optical element when resin sealing is performed.

Such a resin for self core formation can use photosensitive resin, for example, of which a refractive index is larger after curing than that before curing and is become larger than that of sealing resin, and also, can be polymerized with intensity light lower than that for the sealing resin.

As described above, when an optical waveguide is formed, as described above, using photosensitive composition including two kinds of photosensitive resins which are different in the intensity of light for polymerization reaction proceeds, resins in which polymerization reaction proceeding through polymerization reaction mechanisms different from each other can be selected as the resin for self core formation and the sealing resin.

In other words, radical polymerization photosensitive resin in which polymerization proceeds with sequential polymerization reactions by radicals, typified by acrylic resin, and cationic polymerization photosensitive resin in which polymerization proceeds via ion pairs, typified by epoxy resin, can be selected. When these resins are selected, polymerization reaction in radical polymerization photosensitive resin proceeds more rapidly than that in cationic polymerization photosensitive resin, so that only acrylic resin is selectively polymerized by low intensity light.

FIGS. 22A and 22B are cross-sectional views showing examples of places where coupling optical waveguides are formed in the embodiment of the present invention.

A coupling optical waveguide described above may be provided on both or either one of the light-emitting side and the light-receiving side. From the viewpoint of minimizing the transmission loss of an optical signal, it is preferable to provide a coupling optical waveguide on both of the light-emitting side and the light-receiving side. When providing a coupling optical waveguide on only one of the light-emitting side and the light-receiving side, it is preferable to provide the coupling optical waveguide on the light-receiving side from the viewpoint of reducing the transmission loss of an optical signal.

In the example shown in FIG. 22A, coupling optical waveguides 47a and 47c are provided between the light-emitting side end face 35a of the optical waveguide 34 and the light-emitting element 41a, and between the light-receiving side end face 35c of the optical waveguide 34 and the light-receiving element 41c, respectively, at the optical element mounting regions.

In the example shown in FIG. 22B, a coupling optical waveguide 47c is provided only between the light-receiving side end face 35c of the optical waveguide 34 and the light-receiving portion 46c of the light-receiving element 41c.

Figure 23A:
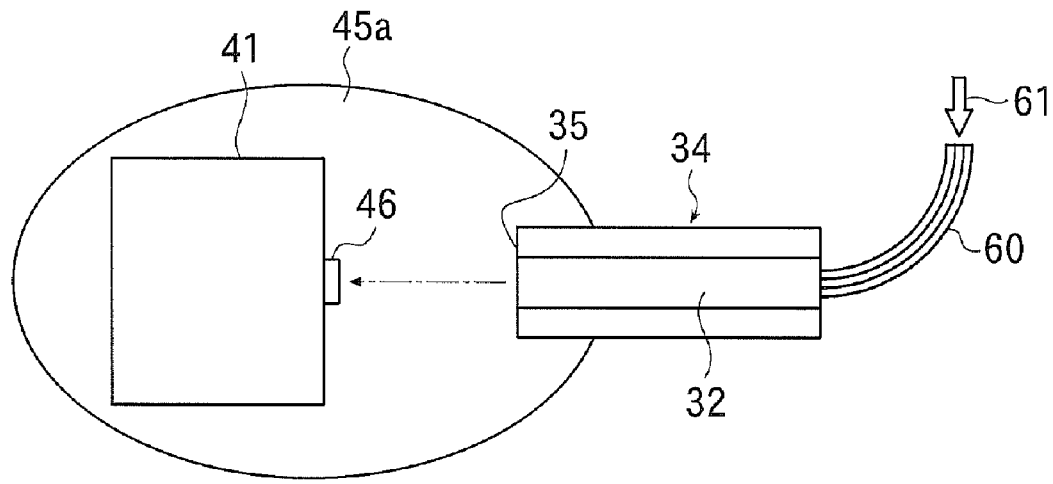
FIGS. 23A to 23C schematically illustrate an example of a method for forming a coupling optical waveguide according to an embodiment of the present invention.
Figure 23B:
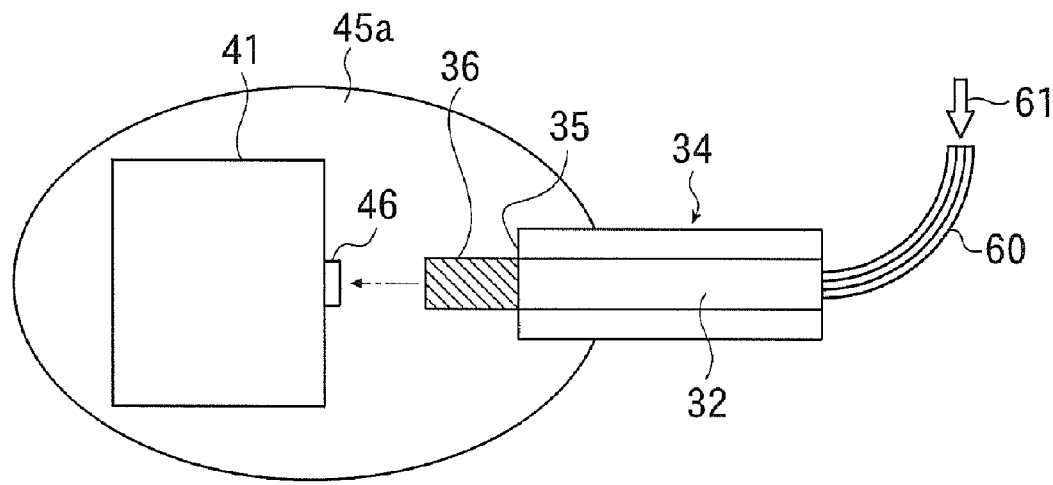
Figure 23C:
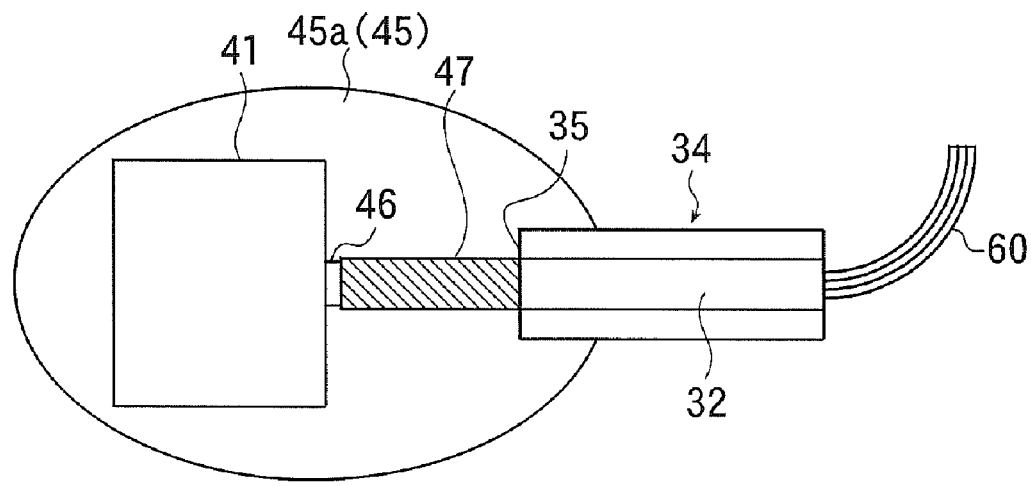

FIGS. 23A to 23C show schematically illustrations of an example of a method of forming a coupling optical waveguide in the embodiment of the present invention.

In the example shown in FIG. 23A, in the state that sealing resin 45a in which resin for self core formation is mixed is provided, light is irradiated to resin between the end face 35 of the optical waveguide 34 and the optical functional portion 46 of the optical element 41.

For example, light from an UV light source 61 is irradiated to the optical functional portion 46 of the optical element 41 through an optical fiber 60 and the optical waveguide 34.

As the light to be irradiated, low intensity light, that is, light having a intensity which is able to polymerize the resin for self core formation but is not substantially able to polymerize the sealing resin is used.

As a result, only the higher-photosensitive resin for self core formation among the photosensitive composition selectively starts to polymerize. When only the resin for self core formation of the photosensitive composition including the resin for self core formation and the sealing resin starts to polymerize, the uncured sealing resin is removed from the curing resin for self core formation because the uncured sealing resin keeps liquidity.

Furthermore, the refractive index of the self-formed core layer is larger than that of the uncured sealing resin, so that light which is irradiated through the optical waveguide 34 is intensively irradiated to a tip end of the formed core layer while being trapped in the formed core layer.

As a result, the resin for self core formation is cured on a priority by light irradiated from the end face 35 of the optical waveguide 34 according to the path of the light as shown in FIG. 23B, a self core layer 36 corresponding to the path of the light is formed, and the self core layer 36 is surrounded by the uncured photosensitive composition (sealing resin and the uncured resin for self core formation).

By growth of the self core layer 36, a coupling optical waveguide 47 is formed between the end face 35 of the optical waveguide 34 and the optical functional portion 46 of the optical element 41 as shown in FIG. 23 C.

After that, for example, light from a light source not shown in the figure is irradiated to the whole of the uncured sealing resin 45a, and then the output of the light source is increased to irradiate light having intensity capable of polymerizing the sealing resin. As a result, the sealing resin and the uncured resin for self core formation is cured to form a sealing portion 45 surrounding the optical element 41, the coupling optical waveguide 47, and the tip end portion of the optical waveguide 34.

On the other hand, in the embodiment of the present invention, as the resin for self formation, photosensitive resin may be used which has a refractive index after curing larger than that before curing and larger than that of sealing resin, while it can be polymerized by irradiating light having a wavelength different from that for the sealing resin.

In this case, for example, light from the UV light source 61 is irradiated to the optical functional portion 46 of the optical element 41 through the optical fiber 60 and the optical waveguide 34 (optical wiring) to form a coupling optical waveguide 47 between the end face 35 of the core layer 32 of the optical waveguide 34 and the optical functional portion 46 of the optical element 41. After that, the wavelength of the light to be irradiated is changed and the changed light is irradiated to the whole of the uncured sealing resin 45a in order to cure the uncured sealing resin surrounding the optical element 41, the coupling optical waveguide 47, and the tip end portion of the optical waveguide 34, thereby, the sealing portion 45 is formed.

In the embodiment of the present invention, an optical waveguide which is excellent in connectivity with the optical element and is excellent in stability because the whole of the system is solidified can be formed by using such a formation method.

In the embodiment of the present invention, the mixing ratio of the resin for self core formation mixed in the sealing resin is not limited in particular.

On the other hand, in the embodiment of the case of the present invention, the sealing portion can be formed also in such a manner that after self-forming a coupling optical waveguide as described above, uncured photosensitive composition and the like around the coupling optical waveguide are removed, and then the optical element, the coupling optical waveguide, and the tip end portion of the optical waveguide are covered with sealing resin having a refractive index after curing smaller than that of the self core layer, and the uncured resin is cured by irradiating light to or heating the whole of the sealing resin to form the sealing portion.

However, from the viewpoint of easiness of handling after self-formation of a coupling optical waveguide, it is preferable to adopt a method of mixing resin for self core formation having a different refractive index in the sealing resin.

In the resin for self core formation, particles such as resin particles, inorganic particles, metal particles, or the like may also be included. By forming an optical waveguide using photosensitive composition or the like including such particles, the coefficient of thermal expansion of the optical wiring can be matched with that of the optical waveguide.

Detail description about the operation and effect in the case that particles are contained in the resin for self core formation is omitted here because description about the operation and effect in the case that particles are contained in the optical waveguide according to the embodiment of the present invention or the like has already been provided.

Such resin particles include ones made of, for example, thermosetting resin, thermoplastic resin, photosensitive resin, thermosetting resin part of which is made photosensitive, resin complexes of thermosetting resin and thermoplastic resin, complexes of photosensitive resin and thermoplastic resin, or the like.

Specifically, such resin particles include ones made of, for example, thermosetting resin such as epoxy resin, phenolic resin, polyimide resin, bismaleimide resin, polyphenylene resin, polyolefin resin, fluororesin or the like; resin made by causing methacrylic acid, acrylic acid, or the like to react with the heat curing group (for example, an epoxy group in epoxy resin) of the thermosetting resin and adding an acrylic group to the heat curing group; thermoplastic resin such as phenoxy resin, polyeter sulfone (PES), poly sulfone (PSF), polyphenylene sulfone (PPS), polyphenylene sulfide (PPES), poly phenyl ether (PPE), polyeter imide (PI), or the like; photosensitive resin such as acrylic acid resin; or the like.

Furthermore, the resin particles may use ones made of resin complex of such thermosetting resin and thermoplastic resin, or resin complex of the acrylic group added resin or the photosensitive resin and the thermoplastic resin. Furthermore, the resin particles may be made of rubber.

Furthermore, the inorganic particles include ones made of, for example, aluminum compound such as alumina or aluminium hydroxide, calcium compound such as calcium carbonate or calcium hydroxide, potassium compound such as potassium carbonate, magnesium compound such as magnesia, dolomite, or magnesium carbonate basic, silicon compound such as silica or zeolite, or the like. Furthermore, the inorganic particles may use ones made of phosphorus or phosphorus compound.

The metal particles include ones made of, for example, gold, silver, copper, palladium, nickel, platinum, iron, zinc, lead, aluminum, magnesium, calcium, or the like. These resin particles, inorganic particles, and metal particles may be used singly or in combination of two or more kinds of them.

Furthermore, shapes of the particles are not limited in particular, and include, for example, spheres, ellipsoids, crush shapes, polyhedrons, and the like. In these shapes, spheres or ellipsoids are preferable because particles of spheres or ellipsoids have no edge so that a crack or the like is hard to occur to the optical waveguide.

Furthermore, it is desirable that the particle diameters of the particles be shorter than the communication wavelength, because if the particle diameters are longer than the communication wavelength, transmittance of an optical signal may be interfered. In this specification, the particle diameter of a particle is the length of the longest portion of the particle.

When the photosensitive composition or the like contains particles, a desirable mixed amount thereof after curing is between 10 weight % and 80 weight %, and a more desirable one is between 20 weight % and 70 weight %. Because if the mixed amount of particles is less than 10 weight %, the effect of mixing particles is not almost obtained, while if the mixed amount of particles is more than 80 weight %, transmission of an optical signal may be inhibited.

Furthermore, the photosensitive composition or the like is cured by irradiating light to become a core layer having a refractive index of a specific range. Thus, in the formation method according to the embodiment of the present invention, photosensitive composition or the like which becomes a core layer having a refractive index in the above range may be selected and used. However, photosensitive composition or the like which becomes a core layer having a refractive index outside the above range may also be used by adjusting the refractive index. Furthermore, when the refractive index of photosensitive composition or the like is adjusted, it is desirable that the refractive index be adjusted in such a manner that the refractive index of a core layer before or after curing falls within the above range.

In the above example, light is irradiated to the resin for self core formation from the optical waveguide. However, when a UV VCSEL or a UV LED (output light wavelength $\lambda$=365 nm), for example, is used as the light-emitting element, the coupling optical waveguide may be self-formed by irradiating light to the resin for self core formation from the light-emitting element, or from both of the light-emitting element and the optical waveguide.

Figure 24A:
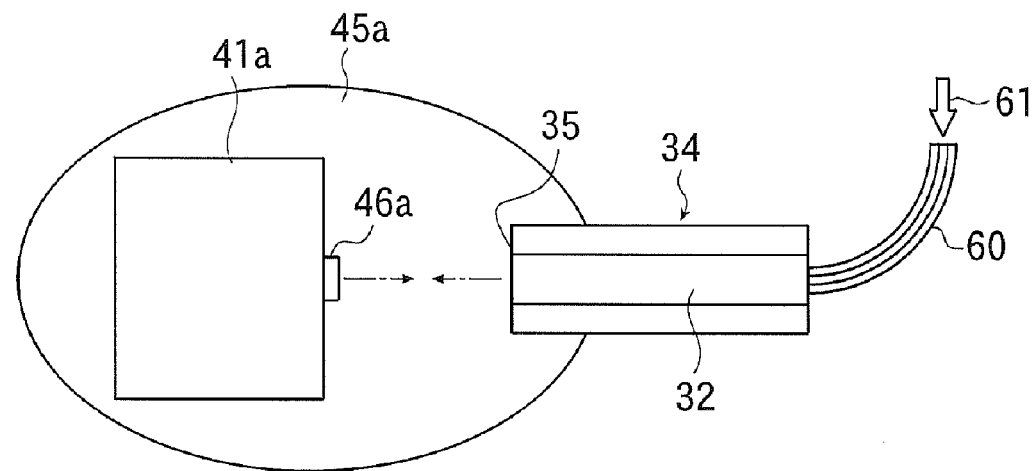
FIGS. 24A to 24C schematically illustrate another example of a method for forming a coupling optical waveguide according to an embodiment of the present invention.
Figure 24B:
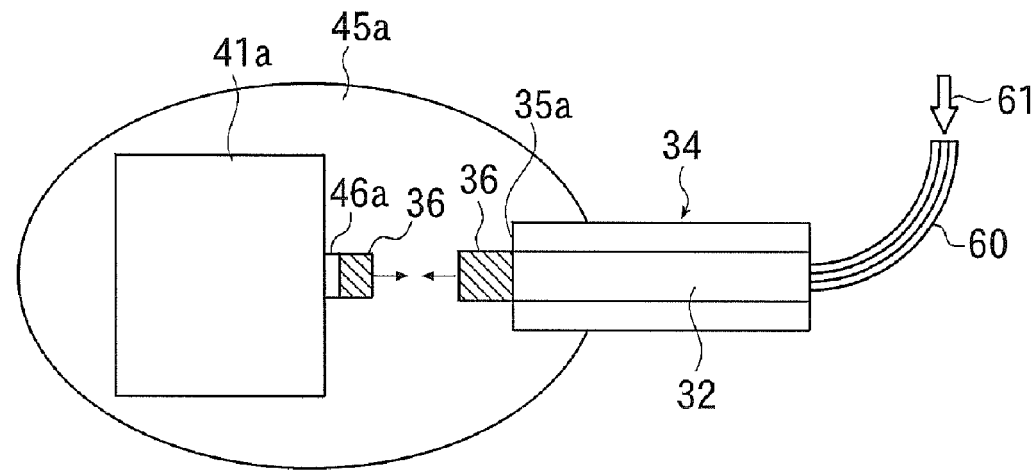
Figure 24C:
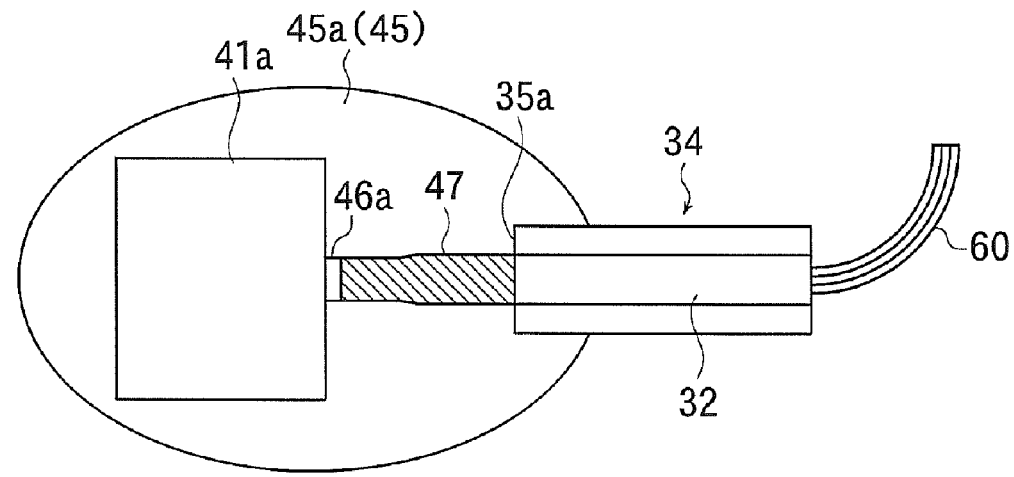

FIGS. 24A to 24C schematically illustrate another example of a method of forming a coupling optical waveguide in the embodiment of the present invention, showing a case that light is irradiated from both of the light-emitting element and the optical waveguide.

As shown in FIGS. 24A to 24C, in this case, light is irradiated from the light-emitting element 41a to the optical waveguide 34 and light from the UV light source 61 is irradiated toward the light-emitting portion 46a of the light-emitting element 41a through the optical fiber 60 and the optical waveguide 34, in order to grow a self core layer 36 between the light-emitting side end face 35a of the optical waveguide 34 and the light-emitting portion 46a of the light-emitting element 41a to form a coupling optical waveguide 47.

After that, predetermined light is irradiated to the whole of uncured sealing resin 45a in order to cure the uncured resin surrounding the optical element, the core layer, and the tip end portion of the optical waveguide 34 to form a sealing portion 45.

As described above, when light is irradiated to the resin for self core formation from both side of the light-emitting element and the optical waveguide, a self core layer can be formed with reliability even if the optical axis of the light-emitting element is misaligned a little with that of the optical waveguide, so that there is an advantage that the requirement for accuracies of positions of the light-emitting element and the optical waveguide can be mitigated.

FIGS. 25A to 25C schematically illustrate another example of a method of forming a coupling optical waveguide in the embodiment of the present invention, showing a case that light is irradiated from both side of the light-emitting element and the optical waveguide to form a coupling optical waveguide on each of the light-emitting side and the light-receiving side.

In this case, first, light is irradiated from the light-emitting element 41*a* to the optical waveguide 34 and light from the UV light source 61 is irradiated to the light-emitting portion 46*a* of the light-emitting element 41*a* through the optical fiber 60 and the optical waveguide 34 in order to form a coupling optical waveguide 47 between the light-emitting side end face 35*a* of the optical waveguide 34 and the light-emitting portion 46*a* of the light-emitting element 41*a*, and then uncured resin is cured to form a sealing portion 45.

Next, a light-receiving element 41*c* is mounted, and light from the light-emitting element 41*a* is irradiated to the light-receiving portion 46*c* of the light-receiving element 41*c* through the optical waveguide 34 in order to form a coupling optical waveguide 47 between the light-receiving side end face 35*c* of the optical waveguide 34 and the light-receiving portion 46*c* of the light-receiving element 41*c*, and then uncured resin is cured to form a light-receiving side sealing portion 45.

FIGS. 26A to 26C schematically illustrate another example of a method of forming a coupling optical waveguide in the embodiment of the present invention, showing a case that light is irradiated only from the light-emitting element to form a coupling optical waveguide on each of the light-emitting side and the light-receiving side.

In this case, first, light is irradiated from the light-emitting element 41*a* to the optical waveguide 34 in order to form a coupling optical waveguide 47 between the light-emitting side end face 35*a* of the optical waveguide 34 and the light-emitting portion 46*a* of the light-emitting element 41*a*, and then uncured resin is cured to form a sealing portion 45.

Next, a light-receiving element 41*c* is mounted, and light from the light-emitting element 41*a* is irradiated to the light-receiving portion 46*c* of the light-receiving element 41*c* through the optical waveguide 34 in order to form a coupling optical waveguide 47 between the light-receiving side end face 35*c* of the optical waveguide 34 and the light-receiving portion 46*c* of the light-receiving element 41*c*, and then uncured resin is cured to form a light-receiving side sealing portion 45.

Figure 27A:
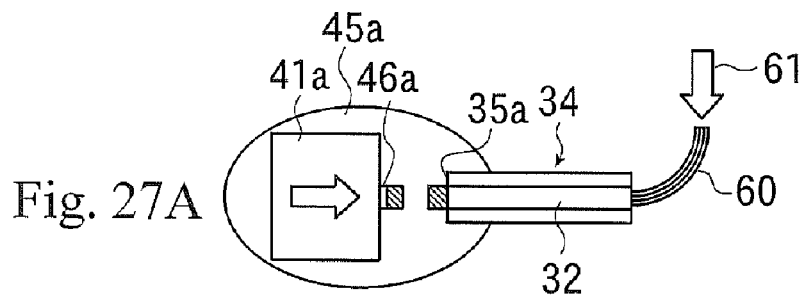
FIGS. 27A and 27B schematically illustrate another example of a method for forming a coupling optical waveguide according to an embodiment of the present invention.
Figure 27B:
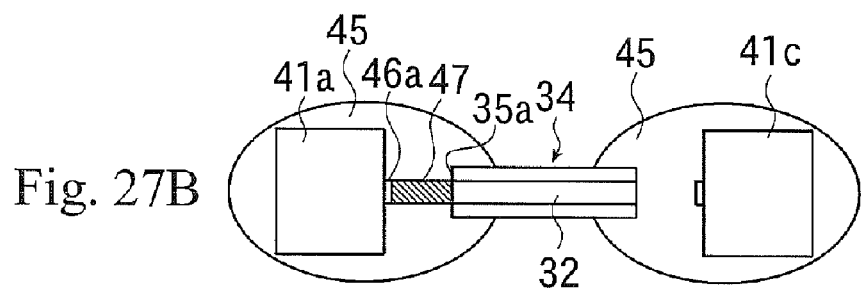

FIGS. 27A to 27C schematically illustrate another example of a method of forming a coupling optical waveguide in the embodiment of the present invention, showing a case that light is irradiated from both side of the light-emitting element and the optical waveguide to form a coupling optical waveguide only on the light-emitting side.

In this case, light is irradiated from the light-emitting element 41*a* to the optical waveguide 34 and light from the UV light source 61 is irradiated to the light-emitting portion 46*a* of the light-emitting element 41*a* through the optical fiber 60 and the optical waveguide 34 in order to form a coupling optical waveguide 47 between the light-emitting side end face 35*a* of the optical waveguide 34 and the light-emitting portion 46*a* of the light-emitting element 41*a*, and then uncured resin is cured to form a sealing portion 45.

Next, a light-receiving element 41*c* is mounted and sealed with resin to form a light-receiving side sealing portion 45.

Figure 28A:
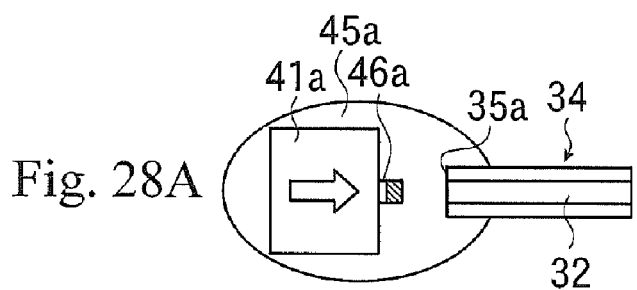
FIGS. 28A and 28B schematically illustrate another example of a method for forming a coupling optical waveguide according to an embodiment of the present invention.
Figure 28B:
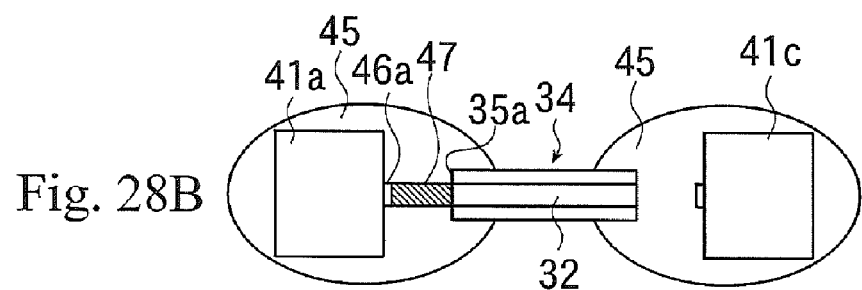

FIGS. 28A to 28B schematically illustrate another example of a method of forming a coupling optical waveguide in the embodiment of the present invention, showing a case that light is irradiated only from the light-emitting element to form a coupling optical waveguide only on the light-emitting side.

In this case, light is irradiated from the light-emitting element 41*a* to the optical waveguide 34 in order to form a coupling optical waveguide 47 between the light-emitting side end face 35*a* of the optical waveguide 34 and the light-emitting portion 46*a* of the light-emitting element 41*a*, and then, uncured resin is cured to form a sealing portion 45.

Next, a light-receiving element 41*c* is mounted and sealed with resin to form a light-receiving side sealing portion 45.

FIGS. 29A and 29B and FIGS. 30A and 30B each schematically illustrate another example of a method of forming a coupling optical waveguide in the embodiment of the present invention, the method being applied to a case that a coupling optical waveguide is formed using a given light-emitting element other than a UV VCSEL or UV LED described above.

Figure 29A:
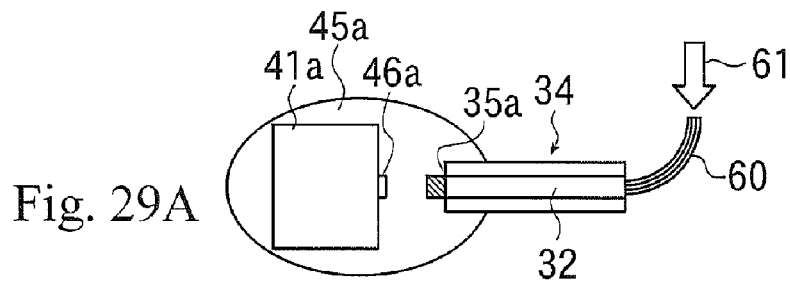
FIGS. 29A and 29B schematically illustrate another example of a method for forming a coupling optical waveguide according to an embodiment of the present invention.
Figure 29B:
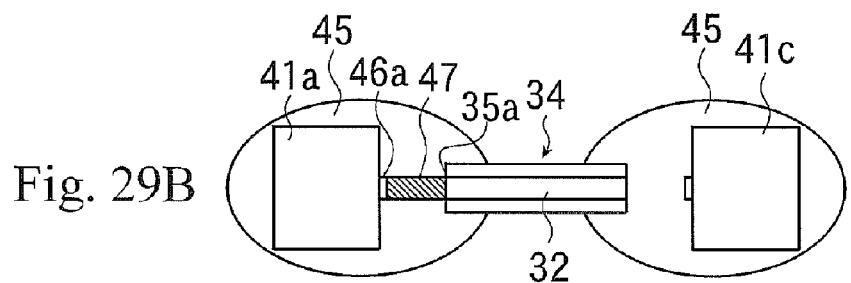

In the example shown in FIGS. 29A and 29B, first, light from the UV light source 61 is irradiated to the light-emitting portion 46*a* of the light-emitting element 41*a* through the optical fiber 60 and the optical waveguide 34 in order to form a coupling optical waveguide 47 between the light-emitting side end face 35*a* of the optical waveguide 34 and the light-emitting portion 46*a* of the light-emitting element 41*a*, and then, uncured resin is cured to form a sealing portion 45.

Next, a light-receiving element 41*c* is mounted and sealed with resin to form a light-receiving side sealing portion 45.

Figure 30A:
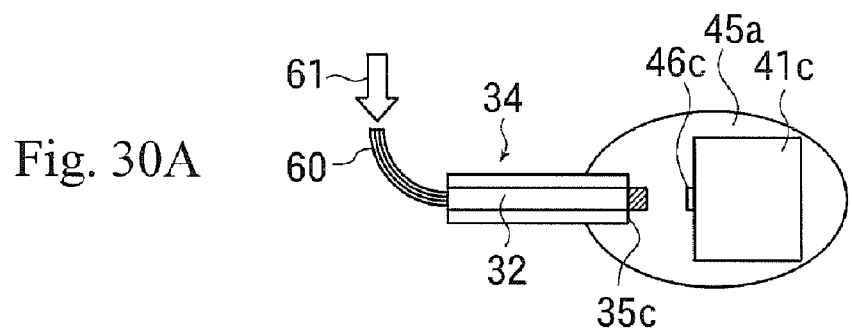
FIGS. 30A and 30B schematically illustrate another example of a method for forming a coupling optical waveguide according to an embodiment of the present invention.
Figure 30B:
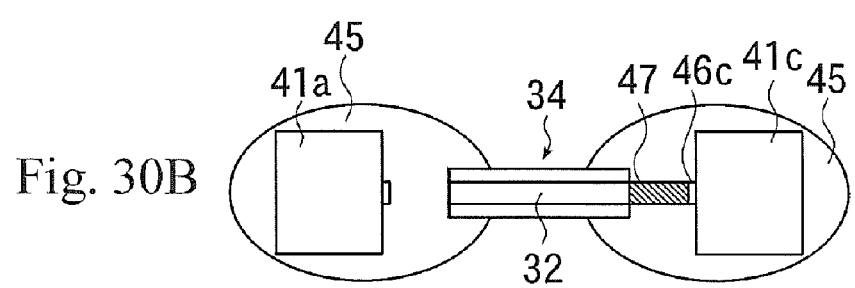

On the other hand, in the example shown in FIGS. 30A and 30B, first, light from the UV light source 61 is irradiated to the light-receiving portion 46*c* of the light-receiving element 41*c* through the optical fiber 60 and the optical waveguide 34 in order to form a coupling optical waveguide 47 between the light-receiving side end face 35*c* of the optical waveguide 34 and the light-receiving portion 46*c* of the light-receiving element 41*c*, and then, uncured resin is cured to form a sealing portion 45.

Next, a light-emitting element 41*a* is mounted and sealed with resin to form a light-emitting side sealing portion 45.

In the above embodiments, the present invention is described taking an optical waveguide as an example. However, the present invention is not limited to this, and an optical fiber sheet may be used instead of an optical waveguide.

Furthermore, the number of layers of rigid sections is not limited, and the rigid sections may be integrated with flex sections at any layers.

What is claimed is:

1. An optoelectronic wiring board comprising:
   a flex-rigid substrate including: a flexible substrate provided with an electric wiring; and a pair of rigid sections provided on both sides of the flexible substrate, the pair of rigid sections each comprising a lamination formed of a conductive circuit and an insulating layer; and
   optical communication means made of a flexible material and having both end faces substantially perpendicular to its optical path of transmitting light,
   wherein both end portions of the optical communication means are disposed and fixed on the rigid sections so that both end faces of the optical communication means face an optical element mounting region provided on the rigid sections of the flex-rigid substrate.

2. The optoelectronic wiring board according to claim 1, the optical communication means being an optical waveguide or an optical fiber sheet.

3. The optoelectronic wiring board according to claim 2, the optical waveguide being an organic optical waveguide made of polymer material.

4. The optoelectronic wiring board according to claim 1, further comprising a condenser lens provided on at least one of the end faces of the optical communication means.

5. The optoelectronic wiring board according to claim 1, further comprising submount substrates mounted on the rigid sections in a standing state so as to be arranged facing the optical communication means.

6. An optical communication device comprising:
a flex-rigid substrate including: a flexible substrate provided with an electric wiring; and a pair of rigid sections provided on both sides of the flexible substrate, the pair of rigid sections each comprising a lamination formed of a conductive circuit and an insulating layer;
optical communication means made of a flexible material and having both end faces substantially perpendicular to its optical path of transmitting light; and
a pair of optical elements having their respective optical functional portions that are mounted on the rigid sections of the flex-rigid substrate, wherein both end portions of the optical communication means are disposed and fixed on the rigid sections so as to face the optical elements, and a condenser lens is provided on at least one of the end faces of the optical communication means.

\* \* \* \* \*